(12) United States Patent
Fonseca et al.

(10) Patent No.: US 8,129,080 B2
(45) Date of Patent: Mar. 6, 2012

(54) VARIABLE RESIST PROTECTING GROUPS

(75) Inventors: Carlos A. Fonseca, Fishkill, NY (US);
Mark Somervell, Austin, TX (US);
Steven Scheer, Austin, TX (US)

(73) Assignee: Tokyo Electron Limited (JP)

( * ) Notice: Subject to any disclaimer, the term of this patent is extended or adjusted under 35 U.S.C. 154(b) by 367 days.

(21) Appl. No.: 12/561,001

(22) Filed: Sep. 16, 2009

(65) Prior Publication Data

US 2010/0075238 A1    Mar. 25, 2010

Related U.S. Application Data

(60) Provisional application No. 61/098,723, filed on Sep. 19, 2008.

(51) Int. Cl.
*G03F 7/00* (2006.01)

(52) U.S. Cl. .......... 430/30; 430/311; 430/312; 430/325; 430/326; 430/328; 430/330; 430/394

(58) Field of Classification Search .................... 430/30, 430/311, 312, 325, 326, 328, 330, 394
See application file for complete search history.

(56) References Cited

U.S. PATENT DOCUMENTS

| | | | |
|---|---|---|---|
| 5,776,660 A | 7/1998 | Hakey et al. |
| 5,861,330 A | 1/1999 | Baker et al. |
| 5,882,967 A | 3/1999 | Brown et al. |
| 5,955,222 A | 9/1999 | Hibbs et al. |
| 5,972,570 A | 10/1999 | Bruce et al. |
| 5,976,768 A | 11/1999 | Brown et al. |
| 5,981,148 A | 11/1999 | Brown et al. |
| 6,007,968 A | 12/1999 | Furukawa et al. |
| 6,100,013 A | 8/2000 | Brown et al. |
| 6,184,041 B1 | 2/2001 | Furukawa et al. |
| 6,190,829 B1 | 2/2001 | Holmes et al. |
| 6,207,540 B1 | 3/2001 | Furukawa et al. |
| 6,210,866 B1 | 4/2001 | Furukawa et al. |
| 6,218,704 B1 | 4/2001 | Brown et al. |
| 6,221,562 B1 | 4/2001 | Boyd et al. |
| 6,294,419 B1 | 9/2001 | Brown et al. |
| 6,316,309 B1 | 11/2001 | Holmes et al. |
| 6,338,934 B1 | 1/2002 | Chen et al. |
| 6,387,783 B1 | 5/2002 | Furukawa et al. |
| 6,627,361 B2 | 9/2003 | Bula et al. |
| 7,829,269 B1 * | 11/2010 | Fonseca et al. ............... 430/394 |
| 2006/0160028 A1 | 7/2006 | Lee et al. |
| 2007/0269749 A1 | 11/2007 | Schenker |
| 2008/0009138 A1 | 1/2008 | Lee |
| 2008/0113157 A1 | 5/2008 | Lee et al. |
| 2010/0119960 A1 * | 5/2010 | Fonseca et al. ................ 430/30 |
| 2010/0273099 A1 * | 10/2010 | Fonseca et al. ................ 430/30 |
| 2010/0273107 A1 * | 10/2010 | Fonseca et al. ............... 430/296 |
| 2010/0273111 A1 * | 10/2010 | Fonseca et al. ............... 430/325 |

FOREIGN PATENT DOCUMENTS

| | | |
|---|---|---|
| EP | 1 939 691 A2 | 7/2008 |
| JP | 2000199953 A | 7/2000 |

OTHER PUBLICATIONS

Machine English language translation of JP2000-199953, published Jul. 2000.

* cited by examiner

*Primary Examiner* — Christopher Young

(57) ABSTRACT

A method and system for patterning a substrate using a dual-tone development process is described. The method and system comprise using a resist material having a polymer backbone with a plurality of protecting groups attached thereto to improve process latitude and critical dimension uniformity for the dual-tone development process.

19 Claims, 35 Drawing Sheets

VARIABLE RESIST PROTECTING GROUPS

CROSS-REFERENCE TO RELATED APPLICATIONS

This application is related to and claims priority to U.S. provisional application Ser. No. 61/098,723 filed on Sep. 19, 2008, and is related to U.S. non-provisional application Ser. No. 12/334,852 filed on Dec. 15, 2008; the entire contents of which are herein incorporated by reference.

BACKGROUND OF THE INVENTION

1. Field of the Invention

The invention relates to a method for patterning a substrate. In particular, the invention relates to a method for patterning a substrate using dual-tone development procedures.

2. Description of Related Art

In material processing methodologies, such as those used in the fabrication of micro-electronic devices, pattern etching is often utilized to define the intricate patterns associated with various integrated circuit elements. Pattern etching comprises applying a patterned layer of radiation-sensitive material, such as photo-resist, to a thin film on an upper surface of a substrate, and transferring the pattern formed in the layer of radiation-sensitive material to the underlying thin film by etching.

The patterning of the radiation-sensitive material generally involves coating an upper surface of the substrate with a thin film of radiation-sensitive material and then exposing the thin film of radiation-sensitive material to a pattern of radiation by projecting radiation from a radiation source through a mask using, for example, a photolithography system. Thereafter, a developing process is performed, during which the removal of the irradiated regions of the radiation-sensitive material occurs (as in the case of positive-tone photo-resist), or the removal of non-irradiated regions occurs (as in the case of negative-tone photo-resist). The remaining radiation-sensitive material exposes the underlying substrate surface in a pattern that is ready to be etched into the surface.

As an example, for positive-tone pattern development, a typical lithographic patterning technique is shown in FIGS. 1A and 1B. As shown in FIG. 1A, a layer of positive-tone photo-resist 102 is formed on a substrate 101. The layer of photo-resist 102 is exposed to electromagnetic (EM) radiation 107 through a mask 103. Mask 103 includes transparent portions 104 and opaque features 108 that form a pattern, as shown in FIG. 1A. A distance (or pitch) 109 between opaque features 108 is shown in FIG. 1A. The transparent portions 104 transmit EM radiation 107 to the layer of positive-tone photo-resist 102, and the opaque features 108 prevent EM radiation 107 from being transmitted to the layer positive-tone photo-resist 102. FIG. 1A shows the layer of positive-tone photo-resist 102 having exposed portions 105 that are exposed to EM radiation 107 and unexposed portions 106 that are not exposed to EM radiation 107. As shown in FIG. 1A, mask features 108 are imaged onto the layer of positive-tone photo-resist 102 to produce corresponding photo-resist features aligned with unexposed portions 106.

As shown in FIG. 1B, after removing exposed portions 105 of the layer of positive-tone photo-resist 102, unexposed portions 106 remain on substrate 101 and form the pattern transferred from mask 103 to substrate 101. As shown in FIGS. 1A and 1B, mask features 108 are imaged onto the layer of positive-tone photo-resist 102 to produce corresponding photo-resist features (i.e., unexposed portions 106). As shown in FIGS. 1A and 1B, pitch 110 between unexposed portions 106 is determined by pitch 109 between features 108 of mask 103.

As another example, for negative-tone pattern development, a typical lithographic patterning technique is shown in FIGS. 2A and 2B. As shown in FIG. 2A, a layer of negative-tone photo-resist 202 is formed on a substrate 201. The layer of negative-tone photo-resist 202 is exposed to the EM radiation 207 through a mask 203. The mask 203 includes transparent features 204 that form a pattern and opaque portions 208, as shown in FIG. 2A. A distance (pitch) 209 between transparent features 204 is shown in FIG. 2A. Transparent features 204 transmit EM radiation 207 to the layer of negative-tone photo-resist 202, and opaque portions 208 prevent EM radiation 207 from being transmitted to the layer of negative-tone photo-resist 202. FIG. 2A shows the layer of negative-tone photo-resist 202 having exposed portions 205 that are exposed to EM radiation 207 and unexposed portions 206 that are not exposed to EM radiation 207. As shown in FIG. 1A, mask features 204 are imaged onto the layer of negative-tone photo-resist 202 to produce corresponding photo-resist features aligned with exposed portions 205.

As shown in FIG. 2B, after removing unexposed portions 206 of the layer of negative-tone photo-resist 202, exposed portions 205 remain on substrate 201 and form a pattern transferred from mask 203 to substrate 201. As shown in FIGS. 2A and 2B, mask features 204 are imaged onto the layer of negative-tone photo-resist 202 to produce corresponding photo-resist features (i.e., exposed portions 205). Pitch 210 between exposed portions 205 is determined by pitch 209 between features 204 of mask 203, as shown in FIGS. 2A and 2B.

Photolithographic systems for performing the above-described material processing methodologies have become a mainstay of semiconductor device patterning for the last three decades, and are expected to continue in that role down to 32 nm resolution, and less. Typically, in both positive-tone and negative-tone pattern development, the minimum distance (i.e., pitch) between the center of features of patterns transferred from the mask to the substrate by a lithography system defines the patterning resolution.

As indicated above, the patterning resolution ($r_o$) of a photolithographic system determines the minimum size of devices that can be made using the system. Having a given lithographic constant $k_1$, the resolution is given by the equation $$r_o = k_1 \lambda / NA, \qquad (1)$$

where $\lambda$ is the operational wavelength of the EM radiation, and NA is the numerical aperture given by the equation $$NA = n \cdot \sin \theta_o. \qquad (2)$$

Angle $\theta_o$ is the angular semi-aperture of the photo-lithography system, and n is the index of refraction of the material filling the space between the system and the substrate to be patterned.

Following equation (1), conventional methods of resolution improvement have lead to three trends in photolithographic technology: (1) reduction in wavelength $\lambda$ from mercury g-line (436 nm) to the 193 nm excimer laser, and further to 157 nm and the still developing extreme-ultraviolet (EUV) wavelengths; (2) implementation of resolution enhancement techniques (RETS) such as phase-shifting masks, and off-axis illumination that have lead to a reduction in the lithographic constant $k_1$ from approximately a value of 0.6 to values approaching 0.25; and (3) increases in the numerical aperture (NA) via improvements in optical designs, manufacturing techniques, and metrology. These latter improvements have created increases in NA from approximately 0.35 to values greater than 1.35.

Immersion lithography provides another possibility for increasing the NA of an optical system, such as a lithographic system. In immersion lithography, a substrate is immersed in a high-index of refraction fluid (also referred to as an immersion medium), such that the space between a final optical element and the substrate is filled with a high-index fluid (i.e., n>1). Accordingly, immersion provides the possibility of increasing resolution by increasing the NA (see equations (1), and (2)).

However, many of these approaches, including EUV lithography, RET lithography, and immersion lithography, have added considerable cost and complexity to lithography equipment. Furthermore, many of these approaches continue to face challenges in integration and challenges in extending their resolution limits to finer design nodes.

Therefore, another trend in photolithographic technology is to utilize a double patterning approach, which has been introduced to allow the patterning of smaller features at a smaller pitch than what is currently possible with standard lithographic techniques. One approach to reduce the feature size is to use standard lithographic pattern and etch techniques on the same substrate twice, thereby forming larger patterns spaced closely together to achieve a smaller feature size than would be possible by single exposure. During double patterning, a layer of radiation-sensitive material on the substrate is exposed to a first pattern, the first pattern is developed in the radiation-sensitive material, the first pattern formed in the radiation-sensitive material is transferred to an underlying layer using an etching process, and then this series of steps is repeated for a second pattern, while shifting the second pattern relative to the first pattern. Herein, the double patterning approach may require an excessive number of steps, including exiting the coating/developing tool and re-application of a second layer of radiation-sensitive material.

Another approach to double the resolution of a lithographic pattern is to utilize a dual-tone development approach, wherein a layer of radiation-sensitive material on the substrate is exposed to a pattern of radiation, and then a double pattern is developed into the layer of radiation-sensitive material by performing a positive-tone development and a negative-tone development. However, current dual-tone development approaches lack the ability to adjust, control and/or optimize the double pattern formed on the substrate.

SUMMARY OF THE INVENTION

The invention relates to methods for patterning a substrate. In particular, the invention relates to a method for patterning a substrate using dual-tone development. Further, the invention relates to the implementation of resolution enhancement techniques, electronic design automation, novel hardware, novel control strategies, and novel materials in a dual-tone development process.

DETAILED DESCRIPTION OF EXEMPLARY EMBODIMENTS

Figure 1A:
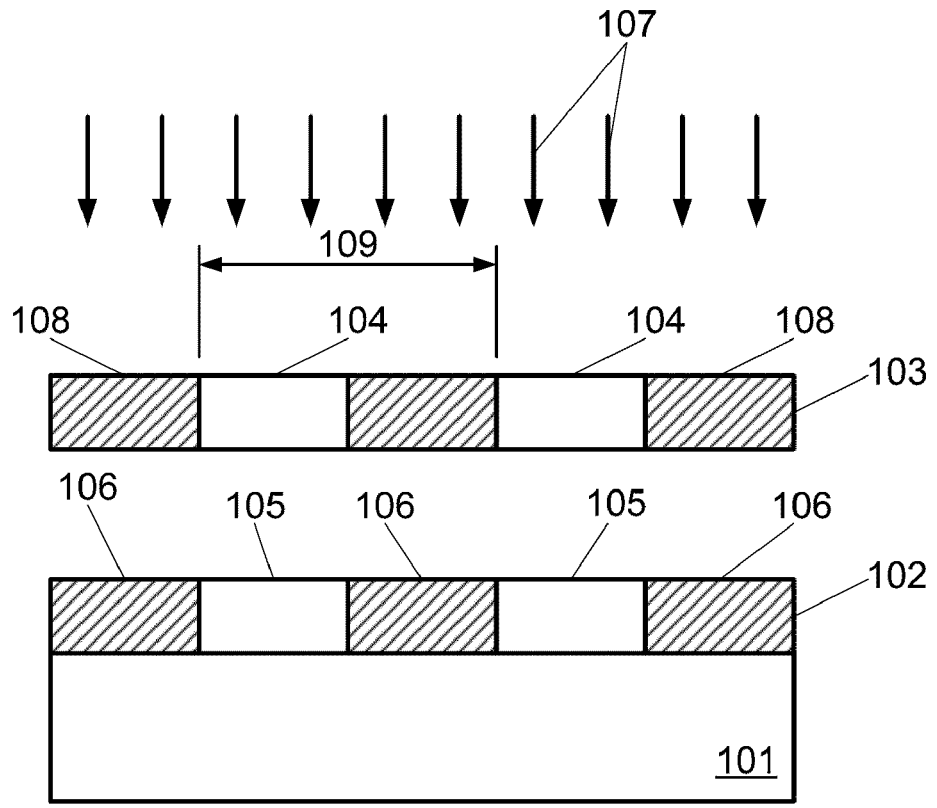
FIGS. 1A and 1B illustrate a lithographic patterning technique utilizing a positive-tone photo-resist according to the prior art.
Figure 1B:
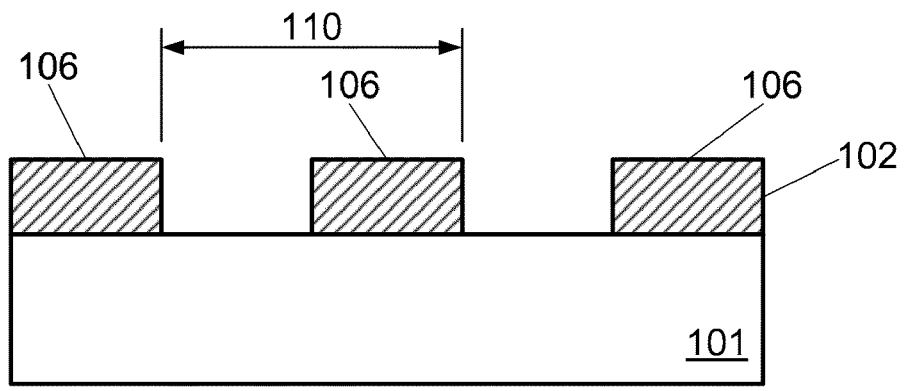
Figure 2A:
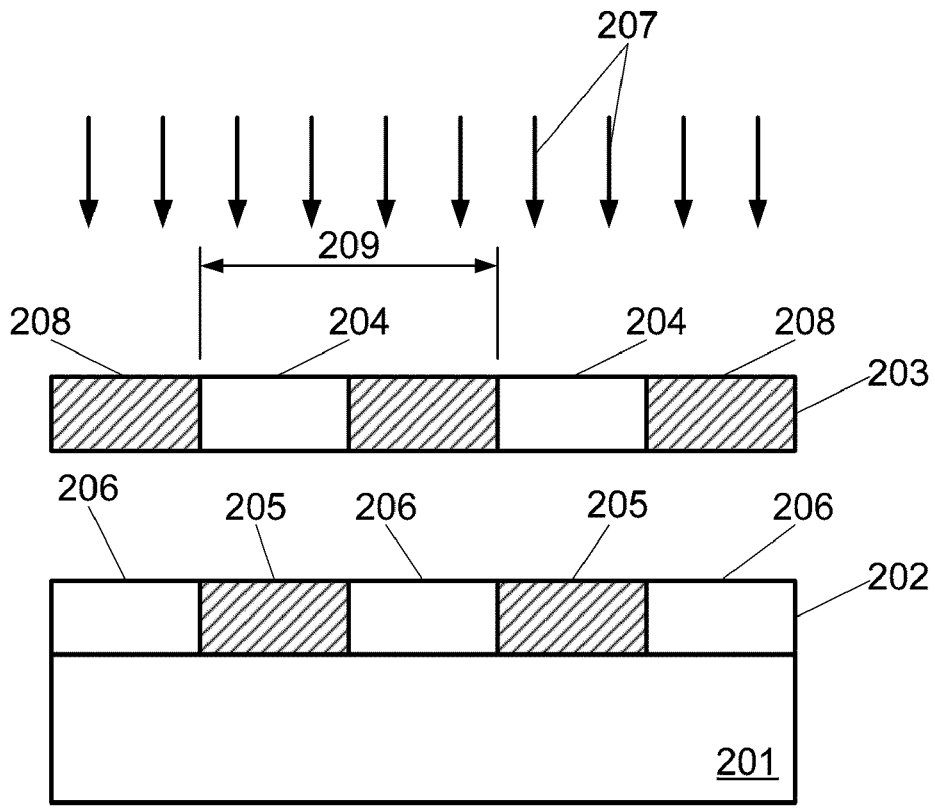
FIGS. 2A and 2B illustrate a lithographic patterning technique utilizing a negative-tone photo-resist according to the prior art.
Figure 2B:
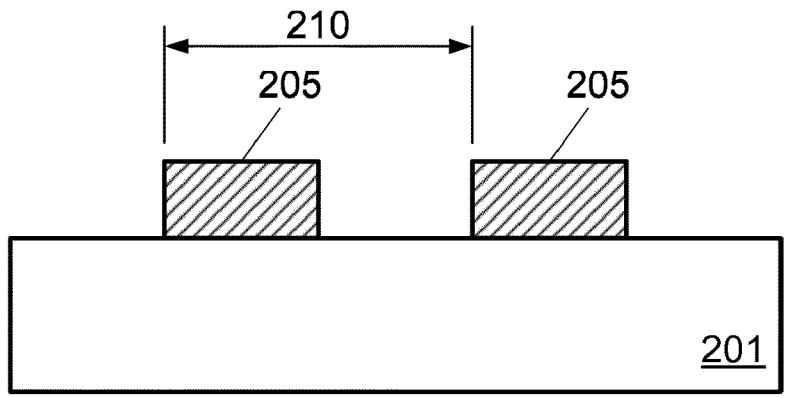

A method for patterning a substrate is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" or variation thereof means that a particular feature, structure, material, or characteristic described in connection with the embodiment is included in at least one embodiment of the invention, but do not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Methods for patterning a substrate, including methods to reduce the minimum pitch of a pattern that can be transferred onto a substrate for a given lithographic tool and mask, are described herein. Multiple chemical treatments on exposed radiation-sensitive materials, such as photo-resist, are used to achieve a reduction in a lithographic pitch of about a factor of two.

According to an embodiment, a method of patterning a substrate to double the resolution of a lithographic pattern is described. The patterning process utilizes a dual-tone development approach, wherein a layer of radiation-sensitive material applied to the substrate is exposed to a pattern of radiation, and then a double pattern is developed into the layer of radiation-sensitive material by performing a positive-tone development followed by a negative-tone development. Furthermore, a critical dimension of the features formed in the double pattern is adjusted, controlled and/or optimized to meet pre-specified pattern requirements that may include a pre-specified critical dimension. This adjusting, controlling and/or optimizing include altering any process step, or altering a combination of steps in the double patterning process. For example, the altering of any step or a combination of steps may include adding, subtracting, and/or re-ordering the combination of steps.

Figure 3:
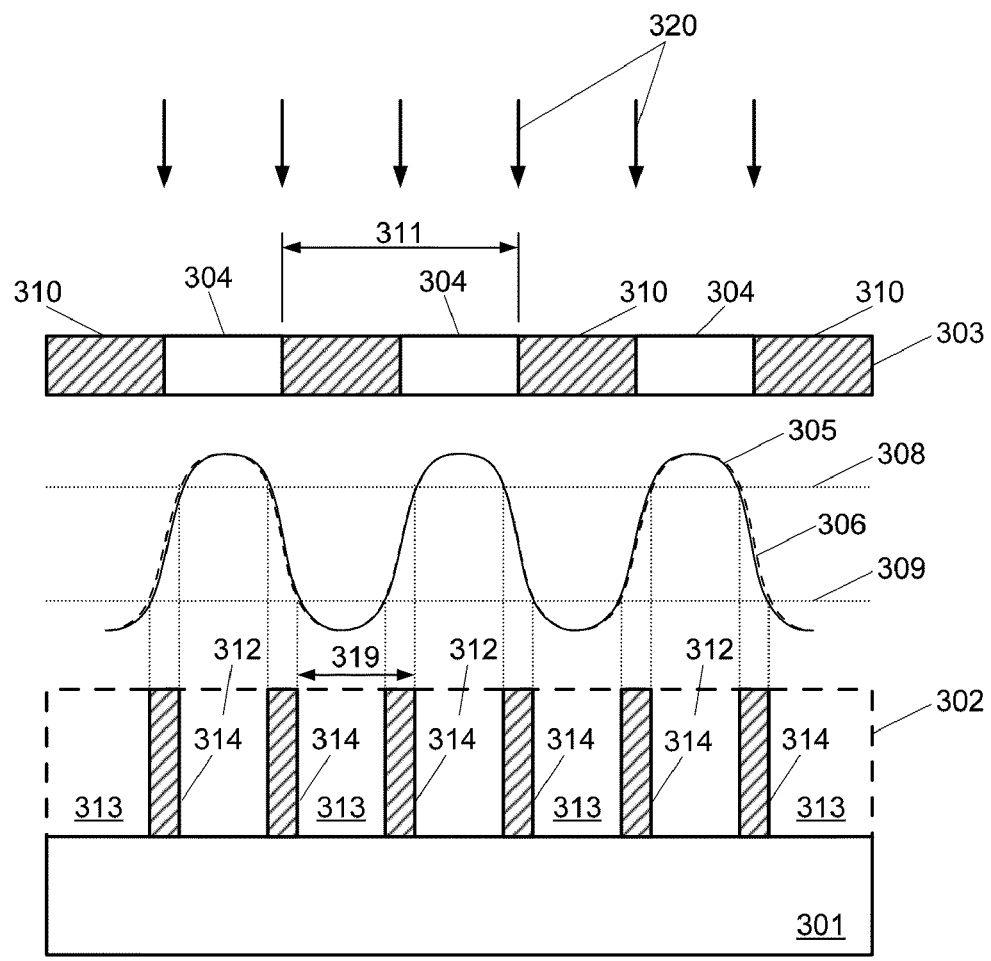
FIG. 3 illustrates a method of patterning a substrate.

FIG. 3 illustrates a method of transferring a pattern from a mask onto a substrate according to one embodiment. A layer of radiation-sensitive material 302, such as photo-resist, is formed on a substrate 301, and then it is exposed to radiation 320 from a radiation source of a lithography system (not shown) using a mask 303. Mask 303 has opaque features 310 that are periodically spaced at a mask pitch 311 and transparent portions 304, as shown in FIG. 3.

In various embodiments, the radiation-sensitive material 302 can include photo-resist that can have photo-acid components and/or photo-base components. For example, the radiation-sensitive material 302 can include a 248 nm photo-resist, a 193 nm photo-resist, a 157 nm photo-resist, or an extreme ultraviolet photo-resist, or a combination of two or more thereof. In other embodiments, the radiation-sensitive material 302 can include a positive-tone photo-resist, or a negative-tone photo-resist. In still other embodiments, the radiation-sensitive material 302 can include a dual-tone photo-resist. A dual-tone photo-resist can be characterized as a photo-resist that behaves as a positive-tone photo-resist or a negative-tone photo-resist depending upon the activation groups, the activation energies (sources), the developing chemistry, the activation chemistry, and/or the rinsing chemistry that are utilized. According to another embodiment, the radiation-sensitive material 302 can include a photo-resist that switches solubility due to a change in polarity upon exposure to the pattern of radiation and an optionally elevation of the temperature of the substrate following the exposure. For example, different activation energies can be used to change polarities. According to another embodiment, the radiation-sensitive material 302 can include a photo-resist that provides acid-catalyzed deprotection and/or base-catalyzed deprotection upon exposure to the pattern of radiation and an optional elevation of the temperature of the substrate following the exposure to activate at least one side group coupled to a polymer backbone.

FIG. 3 shows a radiation exposure profile 305 and a resist response profile 306 of a response produced in the layer of radiation-sensitive material 302 by a pattern of radiation resulting from the projection of radiation 320 through reticle/mask 303 using an exposure system. As shown in FIG. 3, first radiation-sensitive material portions 312 that correspond to transparent portions 304 receive a high radiation exposure from radiation 320, second radiation-sensitive material portions 313 that correspond to opaque features 310 receive a low radiation exposure from radiation 320, and third radiation-sensitive material portions 314 that approximately correspond to edges of opaque features 310 receive an intermediate radiation exposure from radiation 320. As shown in FIG. 3, the resist response profile 306 corresponding to the first radiation-sensitive material portions 312 of radiation-sensitive material 302 is higher than an upper threshold 308, while the resist response profile 306 corresponding to the second radiation-sensitive material portions 313 is lower than a lower threshold 309. Further, the resist response profile 306 corresponding to the third radiation-sensitive material portions 314 lies between the lower threshold 309 and the upper threshold 308.

In one embodiment, when the layer of radiation-sensitive material 302 includes a positive-tone photo-resist, resist response profile 306 may represent a chemical concentration of deprotected polymers in the layer of radiation-sensitive material 302 that is approximately proportional to radiation exposure profile 305, as shown in FIG. 3. For example, the chemical concentration can be changed by using different activation energies. In another embodiment, when the layer of radiation-sensitive material 302 includes a positive-tone photo-resist, resist response profile 306 may be an acid concentration or a base concentration in the layer of radiation-sensitive material 302 that is proportional to radiation exposure profile 305 and the activation energy used. In another embodiment, when the layer of radiation-sensitive material 302 includes a negative-tone photo-resist, resist response profile 306 can be an average polymer molecular weight in the layer of radiation-sensitive material 302 that is proportional to radiation exposure profile 305 and the activation energy used.

In one embodiment, upper threshold 308 corresponds to a first threshold of solubility of the layer of radiation-sensitive material 302 when a first chemistry is applied. For example, first activation energy can be used to establish the first threshold of solubility, and second activation energy can be used to establish the second threshold of solubility. In one embodiment, lower threshold 309 corresponds to a second threshold of solubility of the layer of radiation-sensitive material 302 when a second chemistry is applied. In one embodiment, first radiation-sensitive material portions 312 of the layer of radiation-sensitive material 302 that correspond to transparent portions 304 that have high radiation exposure in radiation exposure profile 305 are selectively removed from substrate 301 using a first chemistry. Second radiation-sensitive material portions 313 of the layer of radiation-sensitive material 302 that have low radiation exposure in the radiation exposure profile 305 are selectively removed from substrate 301 using a second chemistry. The third radiation-sensitive material portions 314 that correspond to approximately the edges of opaque features 310 that have intermediate exposure in the radiation exposure profile 305 (i.e., radiation exposure between the upper threshold 308 and the lower threshold 309) remain on substrate 301 intact, as shown in FIG. 3. For example, the first critical dimensions (CDs) of the first radiation-sensitive material portions 312 can be controlled using first chemistries and first activation energies, and the second CDs of the second radiation-sensitive material portions 313 can be controlled using first chemistries and first activation energies. For example, third CDs of the third radiation-sensitive material portions 314 on substrate 301 can be used as control variables.

When some first radiation-sensitive material portions 312 are analyzed, the resist response profile 306 can include a concentration of acid in the layer of radiation-sensitive material 302 that is higher than an upper threshold 308 of acid concentration. For example, upper threshold 308 can represent an acid level solubility threshold of the layer of radiation-sensitive material 302. In addition, if an acid concentration in the layer of radiation-sensitive material 302 is higher than the upper threshold 308 of acid concentration, the layer of radiation-sensitive material 302 becomes soluble when a first chemistry is applied.

When some second radiation-sensitive material portions 313 are analyzed, the resist response profile 306 can include a concentration of acid in the layer of radiation-sensitive material that is lower than lower threshold 309 of acid concentration. For example, lower threshold 309 can represent another acid level solubility threshold of the layer of radiation-sensitive material 302. In addition, if acid concentration in the layer of radiation-sensitive material 302 is lower than lower threshold 309 of acid concentration, the layer of radiation-sensitive material 302 becomes soluble when a second chemistry is applied.

When photo-acid resists are used, the layer of radiation-sensitive material 302 includes an upper acid concentration threshold that can range from about 30% to about 60% of the clear field acid level, and a lower acid concentration threshold can range from about 10% to about 25% of the clear field acid concentration. For example, the clear field acid concentration can be defined as the acid level of the photo-resist completely exposed to radiation. Alternatively, the clear field acid concentration may be defined as the acid concentration when all the PAG (Photo Acid Generation) material has reacted with radiation to produce acid species.

When photo-base resists are used, the layer of radiation-sensitive material 302 includes an upper base concentration threshold that can range from about 30% to about 60% of the clear field base level, and a lower base concentration threshold ranging from about 10% to about 25% of the clear field base concentration. For example, the clear field base concentration can be defined as the base level of the photo-resist completely exposed to radiation. Alternatively, the clear field base concentration may be defined as the base concentration when all the PBG (Photo Base Generation) material has reacted with radiation to produce base species.

Due to diffraction of radiation 320, the third radiation-sensitive material portions 314 corresponding to intermediate radiation exposure are created. In one embodiment, third radiation-sensitive material portions 314 comprise an acid concentration between the upper acid concentration threshold and the lower acid concentration threshold. The first radiation-sensitive material portions 312 corresponding to high radiation exposure and the first activation energy can be selectively removed from the substrate using a first chemistry. The second radiation-sensitive material portions 313 corresponding to low radiation exposure and the second activation energy are selectively removed from the substrate using a second chemistry. The third radiation-sensitive material portions 314 corresponding to intermediate radiation exposure remain on substrate 301 to form a pattern transferred by mask 303 and the lithography system.

As shown in FIG. 3, two photo-resist features (i.e., third radiation-sensitive material portions 314) are produced for every one mask feature 310, thereby doubling the amount of the pattern features on substrate 301. As a result, feature pitch 319 between the centers of photo-resist features (i.e., third radiation-sensitive material portions 314) becomes twice as small as the mask pitch 311 of the mask 303, as shown in FIG. 3.

Figure 4A:
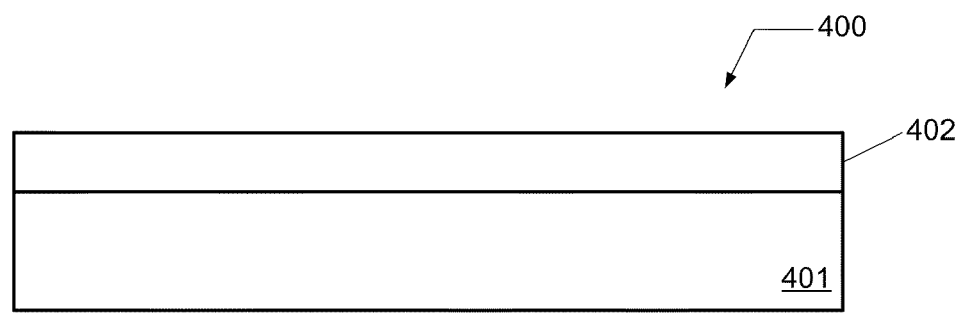
FIGS. 4A through 4D illustrate a method of patterning a substrate.

Referring now to FIGS. 4A through 4D, a method of patterning a substrate is illustrated according to another embodiment. As illustrated in FIG. 4A, a lithographic structure 400 is prepared by forming a layer of radiation-sensitive material 402 on a substrate 401.

The substrate 401 may comprise a semiconductor, e.g., mono-crystalline silicon, germanium, and any other semiconductor. In alternate embodiments, substrate 401 may comprise any material used to fabricate integrated circuits, passive microelectronic devices (e.g., capacitors, inductors) and active microelectronic devices (e.g., transistors, photo-detectors, lasers, diodes). Substrate 401 may include insulating materials that separate such active and passive microelectronic devices from a conductive layer or layers that are formed on top of them. In one embodiment, substrate 401 comprises a p-type mono-crystalline silicon substrate that includes one or more insulating layers e.g., silicon dioxide, silicon nitride, sapphire, and other insulating materials.

As described above, the substrate 401 may comprise a film stack having one or more thin films disposed between the substrate 401 and the layer of radiation-sensitive material 402. Each thin film may comprise a conductive layer, a non-conductive layer, or a semi-conductive layer. For instance, the thin film may include a material layer comprising a metal, metal oxide, metal nitride, metal oxynitride, metal silicate, metal silicide, silicon, poly-crystalline silicon (poly-silicon), doped silicon, silicon dioxide, silicon nitride, silicon carbide, silicon oxynitride, etc. Additionally, for instance, the thin film may comprise a low dielectric constant (i.e., low-k) or ultra-low dielectric constant (i.e., ultra-low-k) dielectric layer having a nominal dielectric constant value less than the dielectric constant of $SiO_2$, which is approximately 4 (e.g., the dielectric constant for thermal silicon dioxide can range from 3.8 to 3.9). More specifically, the thin film may have a dielectric constant of less than 3.7, or a dielectric constant ranging from 1.6 to 3.7.

In some embodiments, the radiation-sensitive material 402 can include photo-resist, and the radiation-sensitive material 402 can include a 248 nm photo-resist, a 193 nm photo-resist, a 157 nm photo-resist, or an extreme ultraviolet photo-resist, or a combination of two or more thereof. According to other embodiments, the radiation-sensitive material 402 can include a positive-tone photo-resist, or a negative-tone photo-resist, or a dual-tone photo-resist, or any combination thereof. According to another embodiment, the radiation-sensitive material 402 comprises poly(hydroxystyrene)-based resist or a (meth)acrylate-based resist, or ester-based resist, or any combination thereof. According to another embodiment, the radiation-sensitive material 402 comprises a photo-resist that switches solubility due to a change in polarity upon exposure to the pattern of radiation and an optionally elevation of the temperature of the substrate following the exposure. According to another embodiment, the radiation-sensitive material 402 can include a photo-resist that provides acid-catalyzed deprotection upon exposure to the pattern of radiation and an optional elevation of the temperature of the substrate following the exposure. According to other embodiments, the radiation-sensitive material 402 can include a photo-resist that provides base-catalyzed deprotection upon exposure to the pattern of radiation and an optional elevation of the temperature of the substrate following the exposure.

The layer of radiation-sensitive material 402 may be formed using a lithography system. For example, the lithography system can comprise a Clean Track ACT 8, ACT 12, or Lithius resist coating and developing system commercially available from Tokyo Electron Limited (TEL). Other systems and methods for forming a photo-resist film on a substrate are well known to those skilled in the art of spin-on resist technology.

Following the application of the layer of radiation-sensitive material 402 to substrate 401, the layer of radiation-sensitive material may be thermally treated in a post-application bake (PAB) to modify the polymer backbone and/or one of the side (activation) groups attached to the polymer backbone. For example, a temperature of the substrate may be elevated to about 50 degrees C. to about 200 degrees C. for a time duration of about 30 seconds to about 180 seconds. A lithography system having post-application substrate heating and cooling equipment may be used to perform the PAB. For example, the lithography system can comprise a Clean Track ACT 8, ACT 12, or Lithius resist coating and developing system commercially available from Tokyo Electron Limited (TEL). Other systems and methods for thermally treating an exposed photo-resist film on a substrate are well known to those skilled in the art of spin-on resist technology.

Figure 4B:
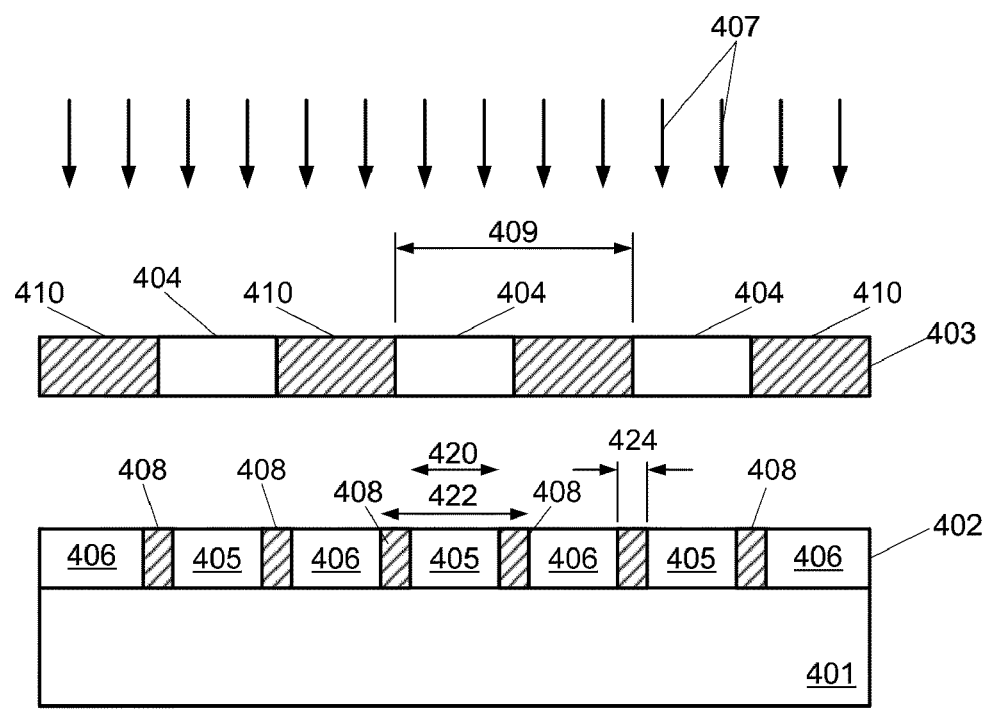

As shown in FIG. 4B, the layer of radiation-sensitive material 402 is exposed to radiation 407 through a reticle/mask 403. The reticle/mask 403 comprises opaque features 410 that prevent radiation 407 from being transmitted to the layer of radiation-sensitive material 402 and transparent portions 404 that transmit the radiation 407 to the layer of radiation-sensitive material 402. Reticle/mask 403 may include any reticle/mask suitable for use in wet or dry lithography, including wavelengths ranging from about 365 nm to about 13 nm. Reticle/mask 403 may include a binary mask or chrome on glass mask. Alternatively, reticle/mask 403 may include an alternating phase shift mask, or an embedded phase shift mask.

The exposure of the layer of radiation-sensitive material 402 to the pattern of EM radiation may be performed in a dry or wet photo-lithography system. The lithography system may be capable of providing a pattern of EM radiation at wavelengths of 365 nm, 248 nm, 193 nm, 157 nm, and 13 nm. The image pattern can be formed using any suitable conventional stepping exposure system, or scanning exposure system. For example, the exposure system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134). Reticle/mask 403 can be illuminated, for example, with normal incident light and off-axis illumination light, such as annular illumination, quadrupole illumination, and dipole illumination. These methods of illumination and exposing the layer of radiation-sensitive material 402 to radiation using the reticle/mask 403 are known to one of ordinary skill in the art of microelectronic device manufacturing.

As shown in FIG. 4B, radiation 407 is projected through mask 403 to the layer of radiation-sensitive material 402. The radiation exposure forms one or more first radiation-sensitive material portions 405, one or more second radiation-sensitive material portions 406, and one or more third radiation-sensitive material portions 408 in the layer of radiation-sensitive material 402. As shown in FIG. 4B, the one or more second radiation-sensitive material portions 406 that correspond to opaque features 410 of mask 403 have low exposure to radiation 407, the one or more first radiation-sensitive material portions 405 that correspond to transparent portions 404 of mask 403 have high exposure to radiation 407, and the one or more third radiation-sensitive material portions 408 that correspond approximately to the edges of opaque features 410 of mask 403 have an intermediate exposure to radiation 407. The one or more third radiation-sensitive material portions 408 of intermediate radiation exposure are created because of diffraction of radiation 407 from the edges of opaque features 410.

In one embodiment, the one or more first radiation-sensitive material portions 405 corresponding to high radiation exposure receive about 50% or more of radiation 407 incident on substrate 401, the one or more second radiation-sensitive material portions 406 corresponding to low radiation exposure receive less than 15% of the radiation 407 incident on substrate 401, and the one or more third radiation-sensitive material portions 408 corresponding to intermediate radiation exposure receive between about 15% and about 50% of the radiation 407 incident on substrate 401.

In one embodiment, high exposure to radiation 407 increases the concentration of an acid in the one or more first radiation-sensitive material portions 405 to a level higher than an upper acid concentration threshold. The upper acid concentration threshold is a first solubility threshold of the layer of radiation-sensitive material 402. In one embodiment, when the concentration of the acid in the one or more first radiation-sensitive material portions 405 increases to a level higher than the first threshold of solubility of the layer of radiation-sensitive material 402 (e.g., acid concentration threshold), the one or more first radiation-sensitive material portions 405 become soluble when a first activation energy is supplied and a first chemistry is applied. In addition, one or more activation energy sources in the lithography system can be used to increase the concentration of an acid in the one or more first radiation-sensitive material portions 405 to a level higher than an upper acid concentration threshold.

In another embodiment, when the chemical concentration of deprotected polymers in the one or more first radiation-sensitive material portions 405 increases to a level higher than the first threshold of solubility of the layer of radiation-sensitive material 402 (e.g., acid concentration threshold), the one or more first radiation-sensitive material portions 405 become soluble when a first activation energy is supplied and a first chemistry is applied. In addition, one or more activation energy sources in the lithography system can be used to increase the chemical concentration of deprotected polymers in the one or more first radiation-sensitive material portions 405 to a level higher than the first threshold of solubility.

In yet another embodiment, when the average polymer molecular weight in the one or more first radiation-sensitive material portions 405 increases to a level higher than the first threshold of solubility of the layer of radiation-sensitive material 402, the one or more first radiation-sensitive material portions 405 become soluble when the first activation energy is supplied and the first chemistry is applied. In addition, one or more activation energy sources in the lithography system can be used to increase the average polymer molecular weight in the one or more first radiation-sensitive material portions 405 to a level higher than the first threshold of solubility.

In the one or more second radiation-sensitive material portions 406 corresponding to low radiation exposure, a concentration of an acid and/or chemical concentration of deprotected polymers is less than a lower threshold of solubility of the layer of radiation-sensitive material 402 (e.g., acid concentration threshold). The one or more second radiation-sensitive material portions 406 become soluble when a second activation energy is supplied and a second chemistry is applied. In addition, one or more activation energy sources in the lithography system can be used to decrease the concentration of an acid and/or chemical concentration of deprotected polymers in the one or more second radiation-sensitive material portions 406 to a level lower than the lower threshold of solubility.

In another embodiment, when the concentration of average polymer molecular weight in one or more second radiation-sensitive material portions 406 is lower than the second threshold of solubility of the layer of radiation-sensitive material 402, the one or more second radiation-sensitive material portions 406 become soluble when the second activation energy is supplied and the second chemistry is applied. In addition, one or more activation energy sources in the lithography system can be used to decrease the average polymer molecular weight in the one or more second radiation-sensitive material portions 406 to a level lower than the second threshold of solubility.

Typically, the first solubility threshold and the second solubility threshold are determined by a material property of the layer of radiation-sensitive material 402. For example, the material property can be dependent on an activation energy. The one or more third radiation-sensitive material portions 408 corresponding to an intermediate radiation exposure have an acid concentration between about the first solubility threshold and the second solubility threshold. That is, the one or more third radiation-sensitive material portions 408 are not soluble when each of the first chemistry and the second chemistry is applied to layer of radiation-sensitive material 402.

Following the exposure of the layer of radiation-sensitive material 402 to EM radiation, the exposed layer of radiation-sensitive material may be thermally treated in a post-exposure bake (PEB) to modify the polymer backbone and/or one of the side (activation) groups attached to the polymer backbone. For example, a temperature of the substrate may be elevated to about 50 degrees C. to about 200 degrees C. for a time duration of about 30 seconds to about 180 seconds. A lithography system having post-exposure substrate heating and cooling equipment may be used to perform the PEB. For example, the lithography system can comprise a Clean Track ACT 8, ACT 12, or Lithius resist coating and developing system commercially available from Tokyo Electron Limited (TEL). Other systems and methods for thermally treating an exposed photo-resist film on a substrate are well known to those skilled in the art of spin-on resist technology.

Referring still to FIG. 4B, the one or more first radiation-sensitive material portions 405 may be characterized by a first critical dimension 420. For example, the first critical dimension may be related to a positive-tone critical dimension following positive-tone developing and the activation energy used during the positive-tone developing. Additionally, the one or more second radiation-sensitive material portions 406 may be characterized by a second critical dimension 422. As shown in FIG. 4B, the second critical dimension 422 represents an inner dimension of the one or more second radiation-sensitive material portions 406 (beyond which these portions exist). For example, the second critical dimension 422 may be related to a negative-tone critical dimension following negative-tone developing and the activation energy used during the negative-tone developing. Furthermore, the one or more third radiation-sensitive material portions 408 may be characterized by a third critical dimension 424. For example, the third critical dimension 424 may be related to a feature critical dimension for the features 430 (see FIG. 4D) remaining on substrate 401 and the activation energies used during the positive-tone developing and the negative-tone developing.

Figure 4C:
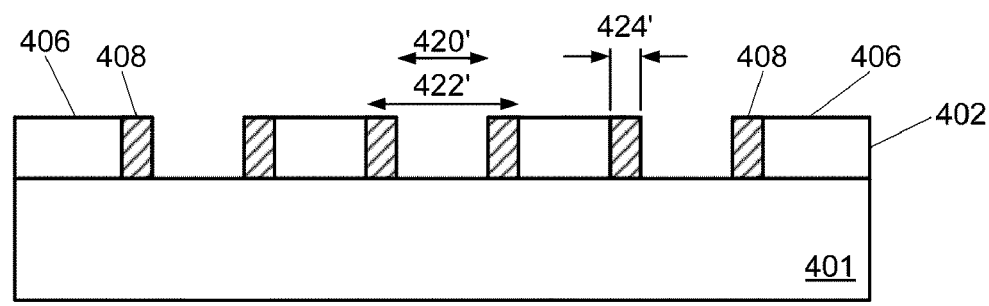

Referring now to FIG. 4C, the one or more first radiation-sensitive material portions 405 corresponding to high radiation exposure are selectively removed using a first developing process in which the first activation energy is supplied and the first chemistry is applied. In one embodiment, the first chemistry to selectively remove the one or more first radiation-sensitive material portions 405 includes a base, e.g., alkali, amines, etc. In one embodiment, the first chemistry to selectively remove the one or more first radiation-sensitive material portions 405 includes tetramethylammonium hydroxide (TMAH). In another embodiment, the first chemistry to selectively remove the one or more first radiation-sensitive material portions 405 includes a base, water, and an optional surfactant.

In one embodiment, substrate 401 can have the exposed layer of radiation-sensitive material 402 activated by an activation source in the lithography system. Then, substrate 401 is coated with a development solution containing the first chemistry to remove soluble one or more first radiation-sensitive material portions 405. Thereafter, the substrate 401 is dried. The activation process and/or the developing process may be performed for a pre-specified time duration (e.g., about 30 seconds to about 180 seconds), a pre-specified developing temperature (e.g., room temperature), a pre-specified activation temperature (e.g., greater than developing temperature), and a pre-specified pressure (atmospheric pressure). The developing process can include exposing the substrate to a developing solution in a developing system, such as a lithography system. For example, the lithography system can comprise a Clean Track ACT 8, ACT 12, or Lithius resist coating and developing system commercially available from Tokyo Electron Limited (TEL).

As shown in FIG. 4C, a first critical dimension 420' (corresponding to the one or more first radiation-sensitive material portions 405), a second critical dimension 422' (corresponding to the one or more second radiation-sensitive material portions 406), or a third critical dimension 424' (corresponding to the one or more third radiation-sensitive material portions 408) may be adjusted, controlled, and/or optimized, as will be discussed below.

As illustrated in FIG. 4C, the one or more second radiation-sensitive material portions 406 and the one or more third radiation sensitive material portions 408 remain on substrate 401.

Figure 4D:
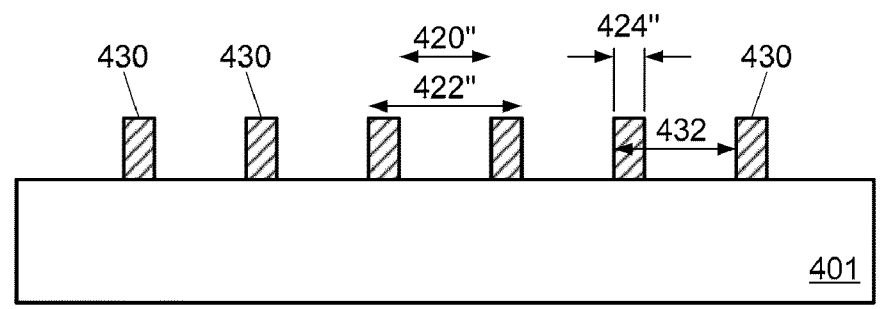

Referring now to FIG. 4D, the one or more second radiation-sensitive material portions 406 corresponding to low radiation exposure are selectively removed using a second developing process in which the second activation energy is supplied and the second chemistry is applied. In one embodiment, the second chemistry to selectively remove the one or more second radiation-sensitive material portions 406 includes an organic solvent. In one embodiment, the second chemistry to selectively remove the one or more second radiation-sensitive material portions 406 includes an organic solvent, optionally water, and an optional surfactant. In one embodiment, the second chemistry to selectively remove the one or more second radiation-sensitive material portions 406 includes an alcohol or acetone.

In one embodiment, substrate 401 can have the exposed layer of radiation-sensitive material 402 activated by an activation source in the lithography system. Then, substrate 401 is coated with a development solution containing the second chemistry to remove soluble one or more second radiation-sensitive material portions 406. Thereafter, the substrate 401 is dried. The developing process may be performed for a pre-specified time duration (e.g., about 30 seconds to about 180 seconds), a pre-specified developing temperature (e.g., room temperature), a pre-specified activation temperature (e.g., greater than developing temperature), and a pre-specified pressure (atmospheric pressure). The developing process can include exposing the substrate to a developing solution in a developing system, such as a lithography system. For example, the lithography system can comprise a Clean Track ACT 8, ACT 12, or Lithius resist coating and developing system commercially available from Tokyo Electron Limited (TEL).

As shown in FIG. 4D, a first critical dimension 420" (corresponding to the one or more first radiation-sensitive material portions 405 and first activation energies), a second critical dimension 422" (corresponding to the one or more second radiation-sensitive material portions 406 and second activation energies), or a third critical dimension 424" (corresponding to the one or more third radiation-sensitive material portions 408) may be adjusted, controlled, and/or optimized, as will be discussed below.

As illustrated in FIG. 4D, the one or more second radiation-sensitive material portions 406 are removed, so that the one or more third radiation sensitive material portions 408 remain on substrate 401. Since an image corresponding to each mask feature (e.g., transparent portions 404) has two regions of intermediate radiation exposure (or transitions regions ranging from low radiation intensity to high radiation intensity), the resulting resist pattern comprises twice the number of features 430 than the mask pattern on mask 403. As illustrated in FIG. 4D, for every one transparent portion 404 of mask 403, two features 430 are produced and a reduced feature pitch 432 between features 430 is achieved.

Pitch 432 between features 430 is less than or equal to about half of mask pitch 409 between opaque features 410 of mask 403, as shown in FIG. 4D. In one embodiment, feature pitch 432 between features 430 may range from about 5 nm to about 30 nm.

The order of the positive-tone development (i.e., development using first chemistry and first activation energies) and the negative-tone development (i.e., development using second chemistry and second activation energies) of the layer of radiation-sensitive material 402, as described above with respect to FIGS. 4C and 4D, may be performed in any order without changing the resulting pattern. In one embodiment, the one or more first radiation-sensitive material portions 405 corresponding to high radiation exposure are selectively removed from substrate 401 before removing the one or more second radiation-sensitive material portions 406 corresponding to low radiation exposure from substrate 401. In another embodiment, the one or more first radiation-sensitive material portions 405 corresponding to high radiation exposure are selectively removed from substrate 401 after removing the one or more second radiation-sensitive material portions 406 corresponding to low radiation exposure from substrate 401.

Figure 5:
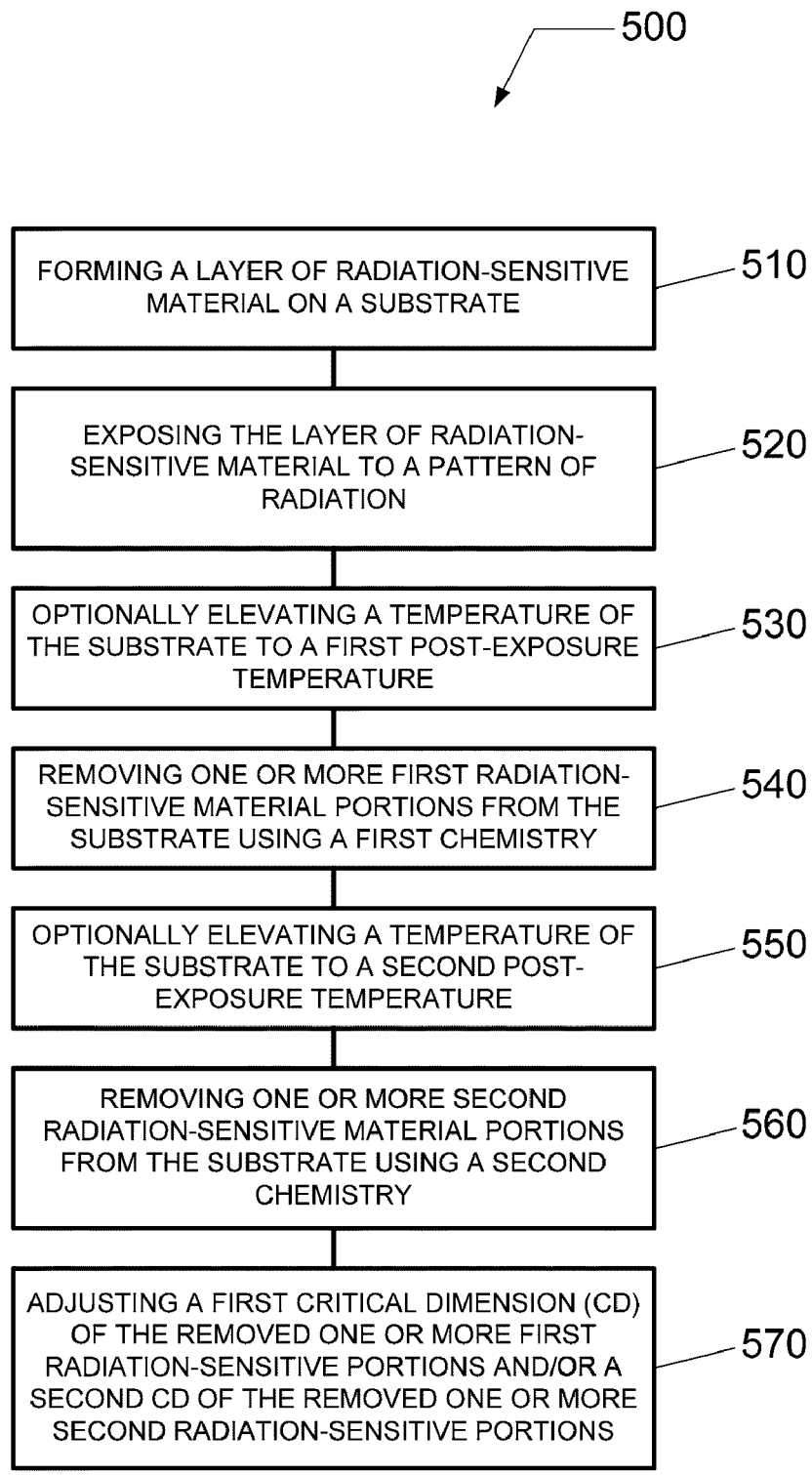
FIG. 5 illustrates a method of patterning a substrate.

Referring now to FIG. 5, a flow chart 500 of a method for patterning a substrate is presented according to an embodiment. Flow chart 500 begins in 510 when a layer of radiation-sensitive material is formed on a substrate and, in 520, the layer of radiation-sensitive material is exposed to a pattern of radiation using a reticle/mask having a mask critical dimension to form one or more first radiation-sensitive material portions, one or more second radiation-sensitive material portions, and one or more third radiation-sensitive material portions. The one or more first radiation-sensitive material portions may comprise first radiation-sensitive material portions subjected to high radiation exposure. The one or more second radiation-sensitive material portions may comprise second radiation-sensitive material portions subjected to low radiation exposure. The one or more third radiation-sensitive material portions may comprise third radiation-sensitive material portions subjected to intermediate radiation exposure characterized by a third critical dimension.

In 530, a temperature of the substrate is optionally elevated to a first post-exposure (activation) temperature. The thermal treatment (activation) process may comprise a first post-exposure bake (PEB), as described above. The first PEB may comprise setting the first post-exposure temperature to a first activation level, a time the substrate is elevated to the first post-exposure temperature, a heating rate for achieving the first post-exposure temperature, a cooling rate for reducing the first post-exposure temperature, a pressure of a gaseous environment surrounding the substrate during the elevation of the substrate to the first post-exposure temperature, or a composition of a gaseous environment surrounding the substrate during the elevation of the substrate to the first post-exposure temperature, or a combination of two or more thereof. The first post-exposure temperature may be ramped, or stepped.

In 540, the one or more first radiation-sensitive material portions are removed from the substrate using a first chemistry. The removal of the one or more first radiation-sensitive material portions may be characterized by a first critical dimension. The removal of the one or more first radiation-sensitive material portions may be performed using a first development process, such as a positive-tone development process or a negative-tone development process. The first development process may comprise a first activation process, setting a composition of the first chemistry, a time duration for the first development and/or activation process, or a temperature for the first development and/or activation process, or any combination of two or more thereof. The first chemistry may comprise a base solution. The first chemistry may further comprise a base solution, water, and an optional surfactant.

In 550, a temperature of the substrate is optionally elevated to a second post-exposure (activation) temperature. The thermal treatment (activation) process may comprise a second post-exposure bake (PEB). The second PEB may comprise setting the second post-exposure temperature to a second activation level, a time the substrate is elevated to the second post-exposure temperature, a heating rate for achieving the second post-exposure temperature, a cooling rate for reducing the second post-exposure temperature, a pressure of a gaseous environment surrounding the substrate during the elevation of the substrate to the second post-exposure temperature, or a composition of a gaseous environment surrounding the substrate during the elevation of the substrate to the second post-exposure temperature, or a combination of two or more thereof. The first post-exposure temperature may be ramped, or stepped.

In 560, the one or more second radiation-sensitive material portions are removed from the substrate using a second chemistry. The removal of the one or more second radiation-sensitive material portions may be characterized by a second critical dimension. The removal of the one or more second radiation-sensitive material portions may be performed using a second development process, such as a positive-tone development process or a negative-tone development process. The second development process may comprise a second activation process, setting a composition of the second chemistry, a time duration for the second development and/or activation process, or a temperature for the second development and/or activation process, or any combination of two or more thereof. The second chemistry may comprise an organic solvent. The second chemistry may further comprise an organic solvent, optionally water, and an optional surfactant.

In 570, the first critical dimension, the second critical dimension, and/or third critical dimension (corresponding to the critical dimension of the third radiation-sensitive material portions) are adjusted, controlled and/or optimized to meet pre-specified pattern requirements that may include a pre-specified first critical dimension, second critical dimension, and/or third critical dimension (corresponding to the critical dimension of the third radiation-sensitive material portions). This adjusting, controlling and/or optimizing include altering the patterning process and the activation energies. The adjusting, controlling, and/or optimizing are discussed in greater detail below.

The adjusting of the patterning process to achieve a target first critical dimension and/or second critical dimension, and/or a target critical dimension for the critical dimension of third radiation-sensitive material portions comprises performing one or more of the following: (1) establishing and controlling the activation (deprotection) levels for the polymer backbone and associated side groups, (2) adjusting an exposure dose for the exposing of the layer of radiation-sensitive material; (3) adjusting the mask critical dimension for the exposing of the layer of radiation-sensitive material; (4) adjusting the first post-exposure (activation) temperature, the time the substrate is elevated to the first post-exposure temperature, the heating rate for achieving the first post-exposure temperature, the cooling rate for reducing the first post-exposure temperature, the pressure of a gaseous environment surrounding the substrate during the elevation of the substrate to the first post-exposure temperature, or a composition of the gaseous environment surrounding the substrate during the elevation of the substrate to the first post-exposure temperature, or a combination of two or more thereof; (5) adjusting the second post-exposure (activation) temperature, the time the substrate is elevated to the second post-exposure temperature, the heating rate for achieving the second post-exposure temperature, the cooling rate for reducing the second post-exposure temperature, the pressure of a gaseous environment surrounding the substrate during the elevation of the substrate to the second post-exposure temperature, or a composition of the gaseous environment surrounding the substrate during the elevation of the substrate to the second post-exposure temperature, or a combination of two or more thereof; (6) adjusting the composition of the first chemistry, the time duration for applying the first chemistry, or a temperature of the first chemistry, or a combination of two or more thereof; or (7) adjusting the composition of the second chemistry, the time duration for applying the second chemistry, or a temperature for the second chemistry, or a combination of two or more thereof; or (8) performing a combination of two or more thereof.

Figure 6:
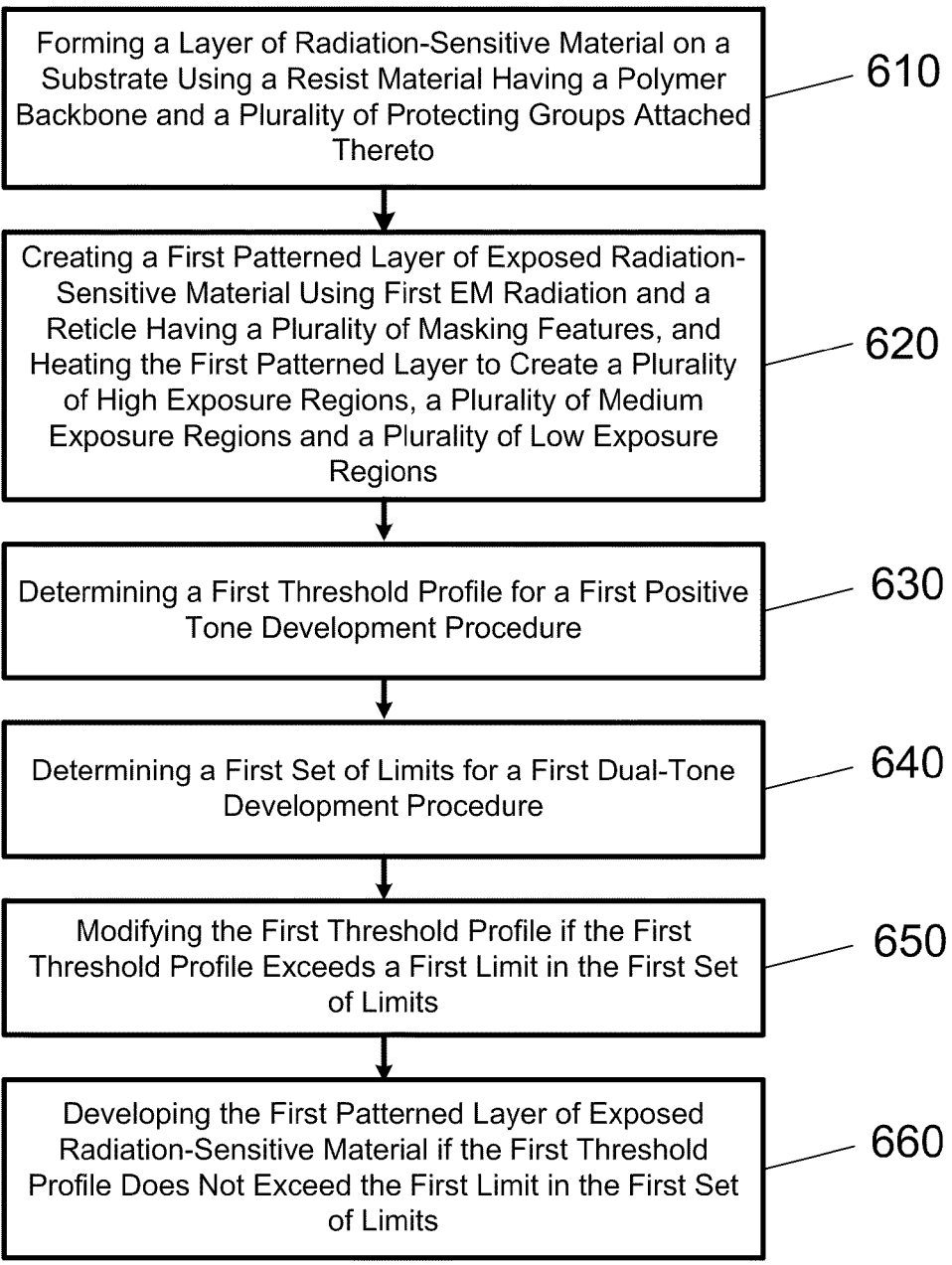
FIG. 6 illustrates another simplified flow diagram for a method of dual patterning a substrate in accordance with embodiments of the invention.

FIG. 6 illustrates another simplified flow diagram for a method of dual patterning a substrate in accordance with embodiments of the invention. During procedure 600, one or more substrates can be positioned on one or more substrate holders in one or more processing chambers for one or more lengths of time.

In 610, a layer of radiation-sensitive material can be formed on at least one substrate, and the layer of radiation-sensitive material can include a resist material having polymer backbone and a plurality of protecting groups. In alternate embodiments, blocking groups, leaving groups, or other known side groups may be used.

In 620, a first patterned layer of exposed radiation-sensitive material can be created by exposing the layer of radiation-sensitive material using first EM radiation and a reticle having a plurality of periodic features. In some examples, the first patterned layer of exposed radiation-sensitive material can be heated to create a plurality of high exposure regions having a first number of de-protected groups, a plurality of medium exposure regions having a second number of de-protected groups, and a plurality of low exposure regions having a third number of de-protected groups. In other examples, the first patterned layer of exposed radiation-sensitive material can be heated to create a plurality of high intensity regions having a first number of de-protected groups, a plurality of medium intensity regions having a second number of de-protected groups, and a plurality of low intensity regions having a third number of de-protected groups.

In 630, a first threshold profile can be determined for a first dual-tone (positive tone) development procedure for the first patterned layer of exposed and heated radiation-sensitive material. For example, the first dual-tone development procedure can include at least one positive tone development procedure and at least one negative tone development procedure, and these procedures can be used in any order. In addition, during the first dual-tone development procedure at least one positive tone threshold and/or at least one negative tone threshold can be determined. In some procedures, the threshold profiles can be determined for acid concentrations, base concentrations, the number of de-protected groups, a number of protecting groups, number of other side groups, EM radiation types, and EM radiation levels.

In 640, a first set of limits can be determined for the first dual-tone development procedure. For example, the first dual-tone development procedure can include at least one set of dual-tone development limits, at least one set of positive tone development limits, and/or at least one set of negative tone development limits. In addition, during the first dual-tone development procedure at least one dual-tone limit, at least one positive tone limit, and/or at least one negative tone limit can be determined. In some procedures, the limits associated with the profiles can be determined using acid concentrations, base concentrations, the number of de-protected groups, a number of protecting groups, number of other side groups, EM radiation types, and EM radiation levels.

In 650, the first threshold profile can be modified, if the first threshold profile exceeds at least one of the first set of limits. For example, additional protecting groups and/or side groups in the resist material in the first patterned layer of exposed radiation-sensitive material can be activated during the modifying.

In 660, the first patterned layer of exposed radiation-sensitive material can be developed, if the first threshold profile does not exceed at least one of the first set of limits.

In various embodiments, the reticle/mask can include at least one of a phase-shift mask, a tri-tone mask, and a half-tone mask. In addition, the half-tone mask can include at least one of a sub-resolution pitch, a sub-resolution size, and mask edge spacing. Furthermore, the first activation group can be activated using at least one of thermal energy, optical energy, RF energy, DC energy, AC energy, UV energy, EUV energy, IR energy, chemical species, liquid, and a gas, and the resist material can include at least one of a dual-tone resist, a photo-sensitive acid, a photo-sensitive base, a photo-sensitive protecting group, a photo-sensitive blocking group, a photo-sensitive leaving group, a negative tone polymer, and a positive tone polymer.

In some embodiments, when the first patterned layer is being developed, the procedure can include: performing a positive development procedure to remove one or more of the high exposure (concentration) regions from the substrate using a first chemistry; and performing a negative development procedure to remove one or more of the low exposure (concentration) regions from the substrate using a second protecting group, a second de-protection energy, and a second chemistry. During some procedures, a post-exposure bake (PEB) of the substrate can be performed after exposing the layer of radiation-sensitive material using the first EM radiation. In addition, one or more post application bake (PAB) procedures may also be performed.

In alternate embodiments, when the first patterned layer is being developed, the procedure can include: performing a negative development procedure to remove one or more of the high exposure (concentration) regions from the substrate using a first activation group, a first activation energy, and a first chemistry; and performing a positive development procedure to remove one or more of the low exposure (concentration) regions from the substrate using a second protecting group, a second de-protection energy, and a second chemistry.

In some embodiments, when the first threshold profile is being modified, the procedure can include: determining a first difference between the first threshold profile and a first limit; and applying first thermal activation energy (heat) to exposed resist material in the first patterned layer of exposed radiation-sensitive material to de-protect (activate) at least additional protecting (activation) group thereby creating a first modified patterned layer. In some examples, the first modified patterned layer of exposed radiation-sensitive material can include a plurality of modified high exposure regions, a plurality of modified medium exposure regions, and a plurality of modified low exposure regions. In addition, the first thermal activation energy (heat) is determined using at least one of an intensity, a concentration, an exposure, the first difference, the polymer backbone, the high exposure regions, the medium exposure regions, and the low exposure regions.

In other embodiments, when the first threshold profile is being modified, the procedure can include: determining a first difference between the first threshold profile and a first limit; and applying first optical signal power to exposed resist material in the first patterned layer of exposed radiation-sensitive material to de-protect (activate) at least additional protecting (activation) group thereby creating a first modified patterned layer. In some examples, the first modified patterned layer of exposed radiation-sensitive material can include a plurality of modified high exposure regions, a plurality of modified medium exposure regions, and a plurality of modified low exposure regions. In addition, the first optical signal power can be determined using at least one of an intensity, a concentration, an exposure, the first difference, the polymer backbone, the high exposure regions, the medium exposure regions, and the low exposure regions.

For example, the first optical signal power can be provided by at least one of a single frequency source, multiple frequency source, a coherent source, a non-coherent source, a broadband source, a UV source, a EUV source, an IR source, a flood exposure source, and a visible light source.

In some other embodiments, when the first threshold profile is being modified, the procedure can include: determining a first difference between the first threshold profile and a first limit; and applying a first chemical solution to exposed resist material in the first patterned layer of exposed radiation-sensitive material to de-protect (activate) at least additional protecting (activation) group thereby creating a first modified patterned layer. In some examples, the first modified patterned layer of exposed radiation-sensitive material can include a plurality of modified high exposure regions, a plurality of modified medium exposure regions, and a plurality of modified low exposure regions. In addition, the first chemical solution can be determined using at least one of an intensity, a concentration, an exposure, the first difference, the polymer backbone, the high exposure regions, the medium exposure regions, and the low exposure regions.

For example, the first chemical solution includes at least one of a developing solution (TMAH), a modified developing solution (TMAH and water), a de-blocking group, a de-protection group, a de-coupling group, and a cleaving group.

In still other embodiments, when the first patterned layer is being developed, the procedure can include: performing a positive development procedure to remove one or more of the high exposure (concentration) regions from the substrate using a first chemistry, and a first developed patterned layer can be created; performing at least one additional exposure procedure, thereby creating a second exposed patterned layer. In some examples, the second exposed patterned layer can include a plurality of removed high exposure regions, a plurality of new medium exposure regions, and a plurality of new high exposure regions; determining a second threshold profile for a first negative tone development procedure for the second exposed patterned layer using at least one of the new number of de-protected groups in the new medium exposure regions, and the new number of de-protected groups in the new high exposure regions; determining a second set of limits for the first negative tone development procedure; modifying the second threshold profile if the second threshold profile exceeds at least one of the second set of limits; and performing the first negative tone development procedure, if the first threshold profile does not exceed at least one of the first set of limits.

When a semiconductor processing system is configured to pattern a substrate, the semiconductor processing system can include: a lithography system configured to form a layer of radiation-sensitive material on the substrate, wherein the layer of radiation-sensitive material comprises a resist material having polymer backbone and a plurality of protecting groups; an exposure system configured to create a first patterned layer of exposed radiation-sensitive material by exposing the layer of radiation-sensitive material using first EM radiation and a reticle having a plurality of periodic features, the first patterned layer of exposed radiation-sensitive material comprising a plurality of high exposure regions, a plurality of medium exposure regions, and a plurality of low exposure regions, wherein the first EM radiation creates a first number of de-protected groups in the high exposure regions, creates a second number of de-protected groups in the medium exposure regions, and creates a third number of de-protected groups in the low exposure regions, wherein the exposure system is coupled to the lithography system; a computer system configured to determine a first threshold profile for a first positive tone development procedure for the first patterned layer of exposed radiation-sensitive material using at least one of the first number of de-protected groups in the high exposure regions, the second number of de-protected groups in the medium exposure regions, and the third number of de-protected groups in the low exposure regions, and configured to determine a first set of limits for the first dual-tone development procedure, the computer system being coupled to the exposure system and the lithography system, wherein the lithography system is configured to modify the first threshold profile if the first threshold profile exceeds a first limit of the first set of limits, and is further configured to develop the first patterned layer of exposed radiation-sensitive material if the first threshold profile does not exceed the first limit of the first set of limits.

When a computer readable medium is configured for the semiconductor processing system, the computer readable medium can contain program instructions for execution on a computer system coupled to a semiconductor processing system, which when executed by the computer system, cause the semiconductor processing system to perform a process that can include: forming a layer of radiation-sensitive material on a substrate, wherein the layer of radiation-sensitive material comprises a resist material having polymer backbone and a plurality of protecting groups; creating a first patterned layer of exposed radiation-sensitive material by exposing the layer of radiation-sensitive material using first EM radiation and a reticle having a plurality of periodic features, the first patterned layer of exposed radiation-sensitive material comprising a plurality of high exposure (concentration) regions, a plurality of medium exposure (concentration) regions, and a plurality of low exposure (concentration) regions, wherein the first EM radiation creates a first number of de-protected groups in the high exposure regions, creates a second number of de-protected groups in the medium exposure regions, and creates a third number of de-protected groups in the low exposure regions; determining a first threshold profile for a first positive tone development procedure for the first patterned layer of exposed radiation-sensitive material using at least one of the first number of de-protected groups in the high exposure regions, the second number of de-protected groups in the medium exposure regions, and the third number of de-protected groups in the low exposure regions; determining a first set of limits for the first dual-tone development procedure; modifying the first threshold profile if the first threshold profile exceeds a first limit of the first set of limits; and developing the first patterned layer of exposed radiation-sensitive material if the first threshold profile does not exceed the first limit of the first set of limits.

Figure 7:
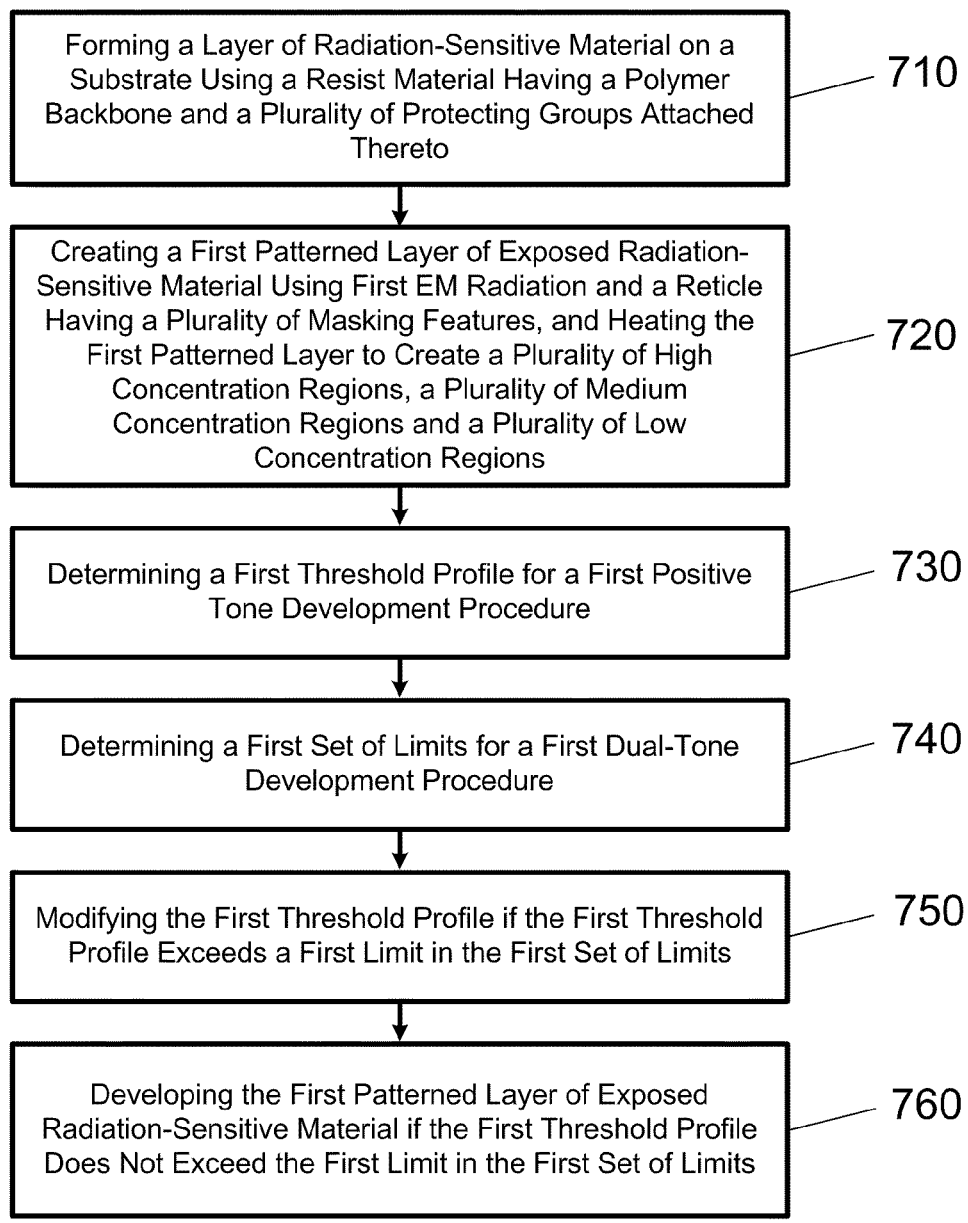
FIG. 7 illustrates an additional simplified flow diagram for a method of dual patterning a substrate in accordance with embodiments of the invention.

FIG. 7 illustrates another simplified flow diagram for a method of dual patterning a substrate in accordance with embodiments of the invention. During procedure 700, one or more substrates can be positioned on one or more substrate holders in one or more processing chambers for one or more lengths of time.

In 710, a layer of radiation-sensitive material can be formed on at least one substrate, and the layer of radiation-sensitive material can include a resist material having polymer backbone and a plurality of protecting groups. In alternate embodiments, blocking groups, leaving groups, or other known side groups may be used.

In 720, a first patterned layer of exposed radiation-sensitive material can be created by exposing the layer of radiation-sensitive material using first EM radiation and a reticle having a plurality of periodic features. In some examples, the first patterned layer of exposed radiation-sensitive material can be heated to create a plurality of high concentration regions having a first number of de-protected groups, a plurality of medium concentration regions having a second number of de-protected groups, and a plurality of low concentration regions having a third number of de-protected groups. In other examples, the first patterned layer of exposed radiation-sensitive material can be heated to create a plurality of high acid regions having a first number of de-protected groups, a plurality of medium acid regions having a second number of de-protected groups, and a plurality of low acid regions having a third number of de-protected groups.

In 730, a first threshold profile can be determined for a first dual-tone (positive tone) development procedure for the first patterned layer of exposed and heated radiation-sensitive material. For example, the first dual-tone development procedure can include at least one positive tone development procedure and at least one negative tone development procedure, and these procedures can be used in any order. In addition, during the first dual-tone development procedure at least one positive tone threshold and/or at least one negative tone threshold can be determined. In some procedures, the threshold profiles can be determined for acid concentrations, base concentrations, the number of de-protected groups, a number of protecting groups, number of other side groups, EM radiation types, and EM radiation levels.

In 740, a first set of limits can be determined for the first dual-tone development procedure. For example, the first dual-tone development procedure can include at least one set of dual-tone development limits, at least one set of positive tone development limits, and/or at least one set of negative tone development limits. In addition, during the first dual-tone development procedure at least one dual-tone limit, at least one positive tone limit, and/or at least one negative tone limit can be determined. In some procedures, the limits associated with the profiles can be determined using acid concentrations, base concentrations, the number of de-protected groups, a number of protecting groups, number of other side groups, EM radiation types, and EM radiation levels.

In 750, the first threshold profile can be modified, if the first threshold profile exceeds at least one of the first set of limits. For example, additional protecting groups and/or side groups in the resist material in the first patterned layer of exposed radiation-sensitive material can be de-protected or activated during the modifying.

In 760, the first patterned layer of exposed radiation-sensitive material can be developed, if the first threshold profile does not exceed at least one of the first set of limits.

In various embodiments, the reticle/mask can include at least one of a phase-shift mask, a tri-tone mask, and a half-tone mask. In addition, the half-tone mask can include at least one of a sub-resolution pitch, a sub-resolution size, and mask edge spacing. Furthermore, the first activation group can be activated using at least one of thermal energy, optical energy, RF energy, DC energy, AC energy, UV energy, EUV energy, IR energy, chemical species, liquid, and a gas, and the resist material can include at least one of a dual-tone resist, a photo-sensitive acid, a photo-sensitive base, a photo-sensitive protecting group, a photo-sensitive blocking group, a photo-sensitive leaving group, a negative tone polymer, and a positive tone polymer.

In some embodiments, when the first patterned layer is being developed, the procedure can include: performing a positive development procedure to remove one or more of the high intensity (high de-protection) regions from the substrate using a first chemistry; and performing a negative development procedure to remove one or more of the low intensity (low de-protection) regions from the substrate using a second protecting group, a second de-protection energy, and a second chemistry. During some procedures, a post-intensity bake (PEB) of the substrate can be performed after exposing the layer of radiation-sensitive material using the first EM radiation. In addition, one or more post application bake (PAB) procedures may also be performed.

In alternate embodiments, when the first patterned layer is being developed, the procedure can include: performing a negative development procedure to remove one or more of the high intensity (high de-protection) regions from the substrate using a first activation group, a first activation energy, and a first chemistry; and performing a positive development procedure to remove one or more of the low intensity (low de-protection) regions from the substrate using a second protecting group, a second de-protection energy, and a second chemistry.

In some embodiments, when the first threshold profile is being modified, the procedure can include: determining a first difference between the first threshold profile and a first limit; and applying first thermal activation energy (heat) to exposed resist material in the first patterned layer of exposed radiation-sensitive material to de-protect (activate) at least additional protecting (activation) group thereby creating a first modified patterned layer. In some examples, the first modified patterned layer of exposed radiation-sensitive material can include a plurality of modified high intensity regions, a plurality of modified medium intensity regions, and a plurality of modified low intensity regions. In addition, the first thermal activation energy (heat) is determined using at least one of an intensity, a concentration, an intensity, the first difference, the polymer backbone, the high intensity regions, the medium intensity regions, and the low intensity regions.

In other embodiments, when the first threshold profile is being modified, the procedure can include: determining a first difference between the first threshold profile and a first limit; and applying first optical signal power to exposed resist material in the first patterned layer of exposed radiation-sensitive material to de-protect (activate) at least additional protecting (activation) group thereby creating a first modified patterned layer. In some examples, the first modified patterned layer of exposed radiation-sensitive material can include a plurality of modified high intensity regions, a plurality of modified medium intensity regions, and a plurality of modified low intensity regions. In addition, the first optical signal power can be determined using at least one of an intensity, a concentration, an exposure, the first difference, the polymer backbone, the high intensity regions, the medium intensity regions, and the low intensity regions.

For example, the first optical signal power can be provided by at least one of a single frequency source, multiple frequency source, a coherent source, a non-coherent source, a broadband source, a UV source, a EUV source, an IR source, a flood exposure source, and a visible light source.

In some other embodiments, when the first threshold profile is being modified, the procedure can include: determining a first difference between the first threshold profile and a first limit; and applying a first chemical solution to exposed resist material in the first patterned layer of exposed radiation-sensitive material to de-protect (activate) at least additional protecting (activation) group thereby creating a first modified patterned layer. In some examples, the first modified patterned layer of exposed radiation-sensitive material can include a plurality of modified high intensity regions, a plurality of modified medium intensity regions, and a plurality of modified low intensity regions. In addition, the first chemical solution can be determined using at least one of an intensity, a concentration, an exposure, the first difference, the polymer backbone, the high intensity regions, the medium intensity regions, and the low intensity regions.

For example, the first chemical solution includes at least one of a developing solution (TMAH), a modified developing solution (TMAH and water), a de-blocking group, a de-protection group, a de-coupling group, and a cleaving group.

In still other embodiments, when the first patterned layer is being developed, the procedure can include: performing a positive development procedure to remove one or more of the high intensity (high de-protection) regions from the substrate using a first chemistry, and a first developed patterned layer can be created; performing at least one additional exposure procedure, thereby creating a second exposed patterned layer. In some examples, the second exposed patterned layer can include a plurality of removed high intensity regions, a plurality of new medium intensity regions, and a plurality of new high exposure regions; determining a second threshold profile for a first negative tone development procedure for the second exposed patterned layer using at least one of the new number of de-protected groups in the new medium intensity regions, and the new number of de-protected groups in the new high exposure regions; determining a second set of limits for the first negative tone development procedure; modifying the second threshold profile if the second threshold profile exceeds at least one of the second set of limits; and performing the first negative tone development procedure, if the first threshold profile does not exceed at least one of the first set of limits.

When a semiconductor processing system is configured to pattern a substrate, the semiconductor processing system can include: a lithography system configured to form a layer of radiation-sensitive material on the substrate, wherein the layer of radiation-sensitive material comprises a resist material having polymer backbone and a plurality of protecting groups; an exposure system configured to create a first patterned layer of exposed radiation-sensitive material by exposing the layer of radiation-sensitive material using first EM radiation and a reticle having a plurality of periodic features, the first patterned layer of exposed radiation-sensitive material comprising a plurality of high intensity regions, a plurality of medium intensity regions, and a plurality of low intensity regions, wherein the first EM radiation creates a first number of de-protected groups in the high intensity regions, creates a second number of de-protected groups in the medium intensity regions, and creates a third number of de-protected groups in the low intensity regions, wherein the intensity system is coupled to the lithography system; a computer system configured to determine a first threshold profile for a first positive tone development procedure for the first patterned layer of exposed radiation-sensitive material using at least one of the first number of de-protected groups in the high intensity regions, the second number of de-protected groups in the medium intensity regions, and the third number of de-protected groups in the low intensity regions, and configured to determine a first set of limits for the first dual-tone development procedure, the computer system being coupled to the intensity system and the lithography system, wherein the lithography system is configured to modify the first threshold profile if the first threshold profile exceeds a first limit of the first set of limits, and is further configured to develop the first patterned layer of exposed radiation-sensitive material if the first threshold profile does not exceed the first limit of the first set of limits.

When a computer readable medium is configured for the semiconductor processing system, the computer readable medium can contain program instructions for execution on a computer system coupled to a semiconductor processing system, which when executed by the computer system, cause the semiconductor processing system to perform a process that can include: forming a layer of radiation-sensitive material on a substrate, wherein the layer of radiation-sensitive material comprises a resist material having polymer backbone and a plurality of protecting groups; creating a first patterned layer of exposed radiation-sensitive material by exposing the layer of radiation-sensitive material using first EM radiation and a reticle having a plurality of periodic features, the first patterned layer of exposed radiation-sensitive material comprising a plurality of high intensity (high de-protection) regions, a plurality of medium intensity (medium de-protection) regions, and a plurality of low intensity (low de-protection) regions, wherein the first EM radiation creates a first number of de-protected groups in the high intensity regions, creates a second number of de-protected groups in the medium intensity regions, and creates a third number of de-protected groups in the low intensity regions; determining a first threshold profile for a first positive tone development procedure for the first patterned layer of exposed radiation-sensitive material using at least one of the first number of de-protected groups in the high intensity regions, the second number of de-protected groups in the medium intensity regions, and the third number of de-protected groups in the low intensity regions; determining a first set of limits for the first dual-tone development procedure; modifying the first threshold profile if the first threshold profile exceeds a first limit of the first set of limits; and developing the first patterned layer of exposed radiation-sensitive material if the first threshold profile does not exceed the first limit of the first set of limits.

In some embodiments, simulated (predicted) profiles and limits can be established for a dual-tone (positive tone or negative tone) development procedure for the first patterned layer of exposed radiation-sensitive material. For example, the first dual-tone development procedure can be simulated and/or modeled; one or more positive tone development procedures can be simulated and/or modeled; and one or more negative tone development procedure can be simulated and/or modeled. In addition, during the first dual-tone development procedure at least one positive tone resist, at least one negative tone resist, and/or at least one dual-tone resist can be simulated and/or modeled.

In addition, a first set of limits can be simulated (predicted) for the first dual-tone (positive tone or negative tone) development procedure using the first simulated (predicted) profile. For example, the first dual-tone development procedure can include at least one set of simulated (predicted) dual-tone development limits, at least one set of simulated (predicted) positive tone development limits, and/or at least one set of simulated (predicted) negative tone development limits.

In various embodiments, the reticle/mask can include at least one of a phase-shift mask, a tri-tone mask, and a half-tone mask. In addition, the half-tone mask can include at least one of a sub-resolution pitch, a sub-resolution size, and mask edge spacing. Furthermore, the first side group can be modified using at least one of thermal energy source, optical energy source, RF energy source, DC energy source, AC energy source, UV energy source, EUV energy source, IR energy source, chemical species source, liquid source, and a gas source, and the resist material can include at least one of a dual-tone resist, a photo-sensitive acid, a photo-sensitive base, a photo-sensitive protecting group, a photo-sensitive blocking group, a photo-sensitive leaving group, a negative tone polymer, and a positive tone polymer.

During some procedures, a one or more post-exposure bake (PEB) procedures of the substrate can be performed after exposing the layer of radiation-sensitive material using the first EM radiation. In addition, one or more post application bake (PAB) procedures may also be performed.

In other embodiments, when the first patterned layer is being developed, the procedure can include: performing a positive development procedure to remove one or more of the high exposure (intensity) regions from the substrate using a first side group, a first modification source (energy), and a first chemistry; and performing a negative development procedure to remove one or more of the low exposure (intensity) regions from the substrate using a second side group, a second modification source (energy), and a second chemistry.

In still other embodiments, when the first patterned layer is being developed, the procedure can include: performing a positive development procedure to remove one or more of the high exposure (intensity) regions from the substrate using a first side group, a first modification source (energy), and a first chemistry, wherein a first patterned layer of first modified resist material is created; determining a second threshold profile for a second dual-tone (negative) development procedure; modifying a second side group in the first modified resist material to create a second modified resist material and to modify the second threshold profile, if the second threshold profile exceeds a second limit, wherein the second modified resist material has the polymer backbone, a second number of side groups, and a second number of modified side groups; and performing a negative development procedure to remove one or more of the low exposure (intensity) regions from the substrate using a second chemistry, wherein a third patterned layer comprising developed second modified resist material is created, if the second threshold profile does not exceed the second limit.

In some processing sequences, a protection layer can be deposited on top of the layer of radiation-sensitive material and the substrate, and the protection layer is substantially transparent to the first EM radiation. In other processing sequences, an interface layer can be deposited between the layer of radiation-sensitive material and the substrate, wherein the interface layer is substantially opaque to the first EM radiation.

In addition, the protection layer and/or the interface layer can include an antireflective coating (ARC) material, a bottom antireflective coating (BARC) material, a top antireflective coating (TARC) material, a photo-active acid, a photo-active base, a blocking group, a de-blocking group, a protecting group, a de-protecting group, a leaving group, or an activation group, or any combination thereof.

Referring now to FIG. 6 and FIG. 7, during these and other dual patterning procedures discussed herein a mask having a mask critical dimension can be used to form the radiation-sensitive material portions. In addition, the chemistry may further comprise a base solution, water, and an optional surfactant. The chemistry may comprise an organic, or non-organic solvent, water, and an optional surfactant.

Figure 8:
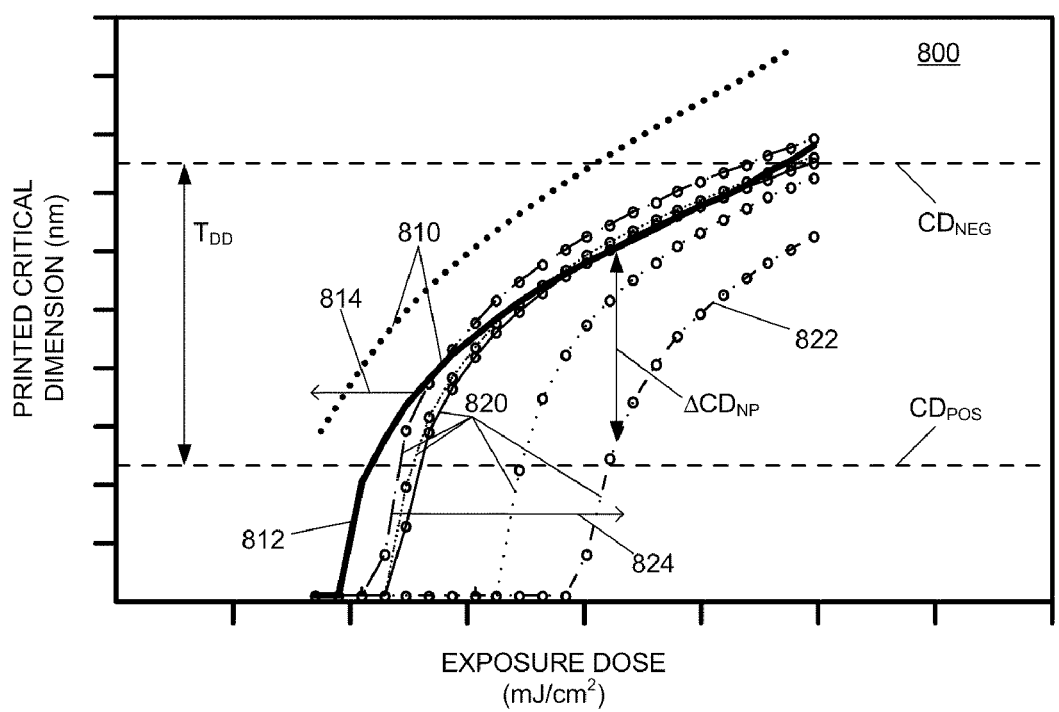
FIG. 8 presents exemplary data for patterning a substrate.

Referring now to FIG. 8, exemplary data 800 is provided for a dual-tone double patterning process. As illustrated in FIG. 8, the printed critical dimension (nm, nanometers) is provided as a function of exposure dose (mJ/cm$^2$, milli-Joules per square centimeters) for a set of negative-tone development characteristics 810 and a set of positive-tone development characteristics 820. The set of negative-tone development characteristics 810 and the set of positive-tone development characteristics 820 may be acquired using numerical simulation, experiment, or a combination thereof.

A characteristic defines a relationship between a critical dimension and a control parameter, such as an exposure dose, activation energy, de-protection energy; however, other control parameters may be used. The characteristic is determined by setting a set of process parameters for performing the dual-tone patterning process, such as the processes described in FIGS. 3, 4A-4D, 5, 6, and 7, wherein the set of process parameters includes any one or more of the process parameters described above with respect to these processes. While holding these process parameters constant, a critical dimension is measured and/or computed as the control parameter is varied. This procedure for preparing a characteristic, such as activation energy, may be used to determine one or more negative-tone characteristics and/or one or more positive-tone characteristics. The characteristics, such as the activation energies, may be established using a negative-tone pattern development process, a positive-tone pattern development process, or a dual-tone pattern development process.

The set of negative-tone development characteristics 810 exhibit a variation in one or more parameters useful in adjusting or controlling the negative-tone critical dimension. For example, the one or more parameters may include any parameter, such as the activation energies or other parameter described above, for performing a second post-exposure bake following the positive-tone development. Additionally, for example, the one or more parameters may include any parameter for performing the negative-tone development and may include activation groups and activation energies.

Figure 9:
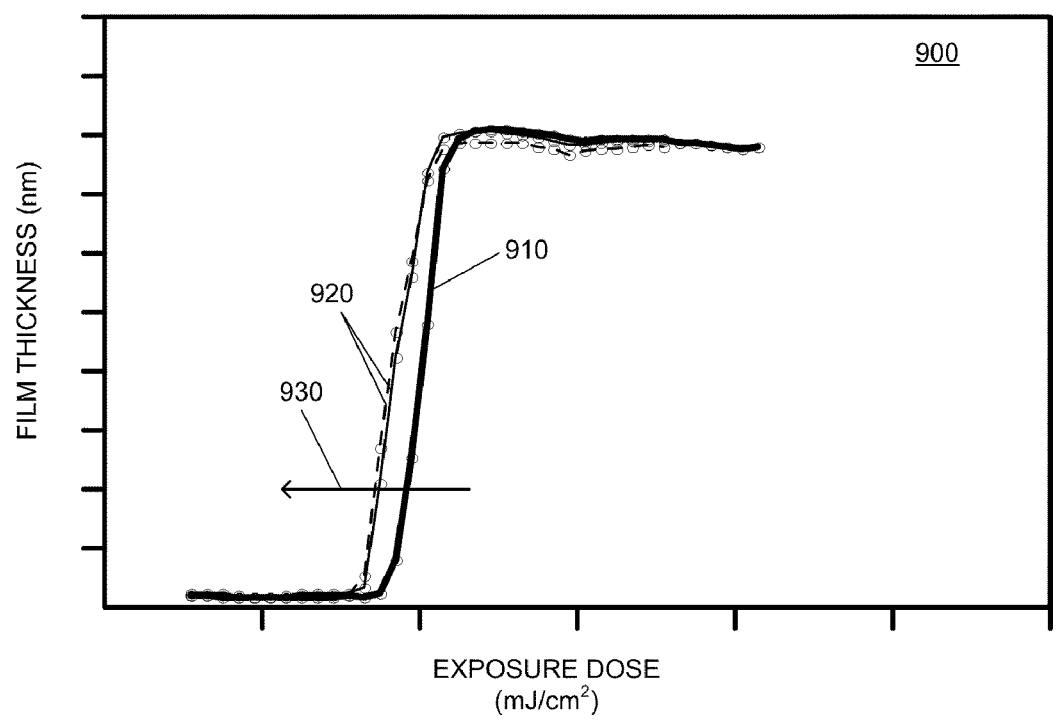
FIG. 9 presents exemplary data for patterning a substrate.

As shown in FIG. 9, a film thickness (nm) (or normalized film thickness) for a layer of radiation-sensitive material following negative-tone development is shown as a function of exposure dose (mJ/cm$^2$). A first contrast curve 910 in the exemplary data 900 is presented wherein the second post-exposure bake following positive-tone development is not performed. A second set of curves 920 are also presented wherein the second post-exposure bake following positive-tone development is performed. As depicted in FIG. 9, the contrast curves shift to lower exposure dose (indicated by arrow 930) indicating a decrease in the lower solubility threshold or a resulting increase in the negative-tone critical dimension. The shift to lower exposure dose of the negative contrast curves may be achieved by increasing the second post-exposure temperature and/or the time duration for elevation at the second post-exposure temperature (see trend 814 in FIG. 8).

In FIG. 8, the set of positive-tone development characteristics 820 exhibit a variation in one or more parameters useful in adjusting or controlling the positive-tone critical dimension. For example, the one or more parameters may include any parameter, activation energy or other parameters as described above, for performing a second post-exposure bake following the positive-tone development. Additionally, for example, the one or more parameters may include any parameter for performing the positive-tone development and may include activation groups and activation energies.

Figure 10:
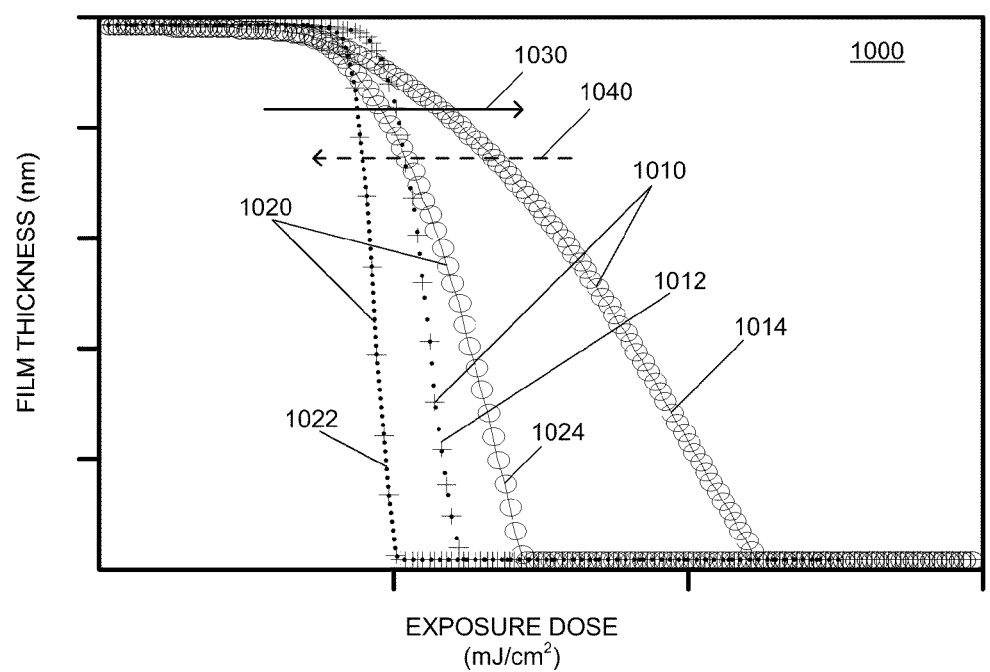
FIG. 10 presents additional exemplary data for patterning a substrate.

As shown in FIG. 10, a film thickness (nm) (or normalized film thickness) for a layer of radiation-sensitive material following positive-tone development is shown as a function of exposure dose (mJ/cm$^2$). A first set of positive contrast curves 1010 in exemplary data 1000 is provided having a first contrast curve 1012 and a second contrast curve 1014. The first contrast curve 1012 is acquired when the second post-exposure bake following positive-tone development is not performed. The second contrast curve 1014 is acquired when the second post-exposure bake following positive-tone development is not performed and the positive-tone development solution (e.g., first chemistry having a base, water, and optional surfactant) is diluted relative to the first contrast curve 1012. As depicted in FIG. 10, the contrast curves shift to higher exposure dose (indicated by arrow 1030) indicating an increase in the upper solubility threshold or a resulting decrease in the positive-tone critical dimension. The shift to higher exposure dose of the positive contrast curves may be achieved by increasing the dilution of the positive-tone development chemistry (see trend 824 in FIG. 8).

A second set of curves 1020 is provided having a third contrast curve 1022 and a fourth contrast curve 1024. The third contrast curve 1022 is acquired when the second post-exposure bake following positive-tone development is performed and the positive-tone development solution is the same for the first contrast curve 1012. As depicted in FIG. 10, the contrast curves shift to lower exposure dose (indicated by arrow 1040) indicating a decrease in the upper solubility threshold or a resulting increase in the positive-tone critical dimension. The shift to lower exposure dose of the positive contrast curves may be achieved by increasing the second post-exposure temperature and/or the time duration for elevation at the second post-exposure temperature.

The fourth contrast curve 1024 is acquired when the second post-exposure bake following positive-tone development is performed and the positive-tone development solution is diluted relative to the first contrast curve 1012. As depicted in FIG. 10, the contrast curves shift to higher exposure dose (indicated by arrow 1030) indicating an increase in the upper solubility threshold or a resulting decrease in the positive-tone critical dimension. In addition, the inventors believe that the contrast curves can be affected by the amount of activation energy that is required during a development process.

Figure 11:
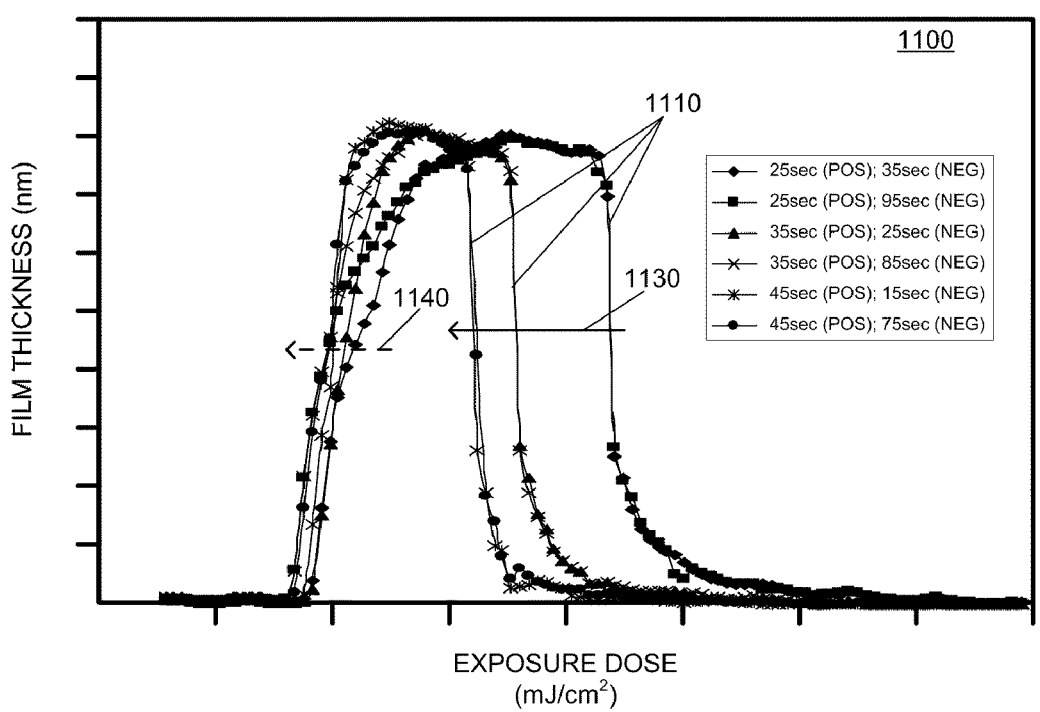
FIG. 11 presents additional exemplary data for patterning a substrate.

As shown in FIG. 11, a film thickness (nm) (or normalized film thickness) for a layer of radiation-sensitive material following negative-tone development is shown as a function of exposure dose (mJ/cm$^2$). Following the exposure of the layer of radiation-sensitive material to a pattern of radiation, the layer of radiation-sensitive material undergoes a first post-exposure bake for a first time duration followed by positive-tone development, and then undergoes a second post-exposure bake for a second time duration followed by negative-tone development. A family of contrast curves 1110 in the exemplary data 1100 is presented, wherein the first time duration for the first post-exposure bake (e.g., the first time duration is indicated in the legend by the time preceding "POS") and the second time duration for the second post-exposure bake (e.g., the second time duration is indicated in the legend by the time preceding "NEG") are varied.

As illustrated in FIG. 11, when the first time duration for the first post-exposure bake (preceding the positive-tone development) is held constant (i.e., at 25 sec (seconds), 35 sec, and 45 sec) while the second time duration for the second post-exposure bake (preceding the negative-tone development) is increased (i.e., 35 sec to 95 sec, 25 sec to 85 sec, and 15 sec to 75 sec), the lower exposure threshold shifts to the left (i.e., the lower exposure threshold decreases) (trend indicated by arrow 1140). The decrease in the lower exposure threshold manifests as an increase in the second critical dimension or negative-tone critical dimension. Furthermore, while the lower exposure threshold is decreased by increasing the second time duration during the second post-exposure bake, the upper exposure threshold remains substantially constant when the first time duration is held constant.

Additionally, as illustrated in FIG. 11, when the second time duration for the second post-exposure bake (preceding the negative-tone development) is held approximately constant with a slight variation (i.e., at 35 sec, 25 sec, and 15 sec; and at 95 sec, 85 sec, and 75 sec) while the first time duration for the first post-exposure bake (preceding the positive-tone development) is increased (i.e., 35 sec to 35 sec to 45 sec), the upper exposure threshold shifts to the left (i.e., the upper exposure threshold decreases) (trend indicated by arrow 1130). The decrease in the upper exposure threshold manifests as an increase in the first critical dimension or positive-tone critical dimension. Furthermore, while the upper exposure threshold is decreased by increasing the first time duration during the first post-exposure bake, the lower exposure threshold remains approximately constant when the second time duration is held approximately constant.

Referring again to FIG. 8, when printing a pattern of features on a substrate, a target positive-tone critical dimension ($CD_{POS}$) and a target negative-tone critical dimension ($CD_{NEG}$) may be selected or specified. Thereafter, a target difference ($T_{DD}$) between the target positive-tone critical dimension and the target negative-tone critical dimension may be computed for the double development metric. Alternatively, two or more of the target difference, the target positive-tone critical dimension and the target negative-tone critical dimension may be specified, while the third is computed.

Through inspection of the set of negative-tone development characteristics 810 and the set of positive-tone development characteristics 820, a target negative-tone characteristic 812 may be selected and a target positive-tone characteristic 822 may be selected that possesses a $\Delta CD_{NP}$ comparable to $T_{DD}$. Desirably, the selected characteristics possess a $\Delta CD_{NP}$ that is greater than $T_{DD}$.

The dual-tone double patterning process may be optimized by selecting the target negative-tone characteristic and the target positive-tone characteristic such that the target positive-tone characteristic intersects the target positive-tone critical dimension at a given exposure dose and the target negative-tone characteristic intersects the target negative-tone critical dimension at the same given exposure dose.

Alternatively, the dual-tone double patterning process may be optimized by selecting the target positive-tone characteristic such that the target positive-tone characteristic intersects the target positive-tone critical dimension at a given exposure dose. Then, the target negative-tone characteristic may be selected when $\Delta CD_{NP}$ is approximately comparable to $T_{DD}$ for the given exposure dose. Alternatively yet, the target negative-tone characteristic may be selected when DDM is approximately unity, where:

$$DDM=1-([|\Delta CD_{NP}|-T_{DD}]/T_{DD}). \quad (3)$$

Figure 12:
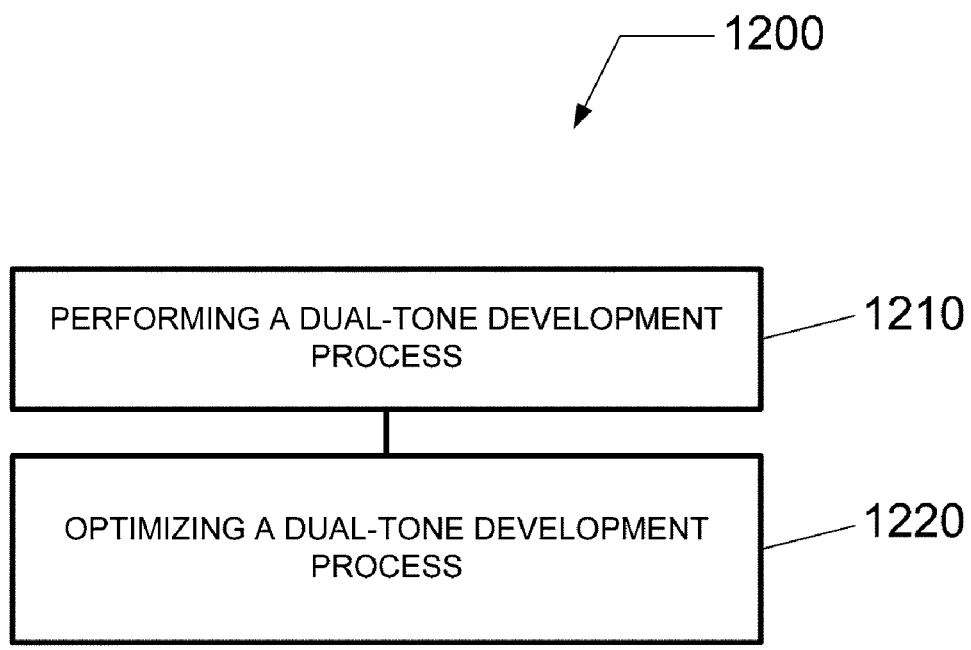
FIG. 12 illustrates a method of patterning a substrate.

Referring now to FIG. 12, a flow chart 1200 of a method for optimizing a double patterning process is presented according to an embodiment. Flow chart 1200 begins in 1210 with performing a dual-tone development process. The dual-tone development process comprises: exposing a layer of radiation-sensitive material to a pattern of radiation, performing a positive-tone development process to remove a first radiation-sensitive material portion characterized by a positive-tone critical dimension, and performing a negative-tone development process to remove a second radiation-sensitive material portion characterized by a negative-tone critical dimension.

In 1220, the dual-tone development process is optimized to achieve a target difference between a target positive-tone critical dimension and a target negative-tone critical dimension. The optimization of the dual-tone development process comprises: acquiring one or more positive-tone characteristics, wherein the one or more positive-tone characteristics relate the positive-tone critical dimension to a control parameter for a first set of process parameters; acquiring one or more negative-tone characteristics, wherein the one or more negative-tone characteristics relate the negative-tone critical dimension to the control parameter for a second set of process parameters; selecting a target positive-tone characteristic from the one or more positive-tone characteristics that approximately intersects the target positive-tone critical dimension at a target control parameter to within a first deviation; selecting a target negative-tone characteristic from the one or more negative-tone characteristics that approximately intersects the target negative-tone critical dimension at the target control parameter to within a second deviation; and establishing a process recipe for the performing the dual-tone development process using the target positive-tone characteristic, the target negative-tone characteristic, and the target control parameter.

The first deviation and the second deviation may be selected to be an absolute value, such as plus or minus 5 nm, plus or minus 2 nm. Alternatively, first deviation and the second deviation may be selected to be a relative value, such as plus or minus 10% of $T_{DD}$, plus or minus 5% of $T_{DD}$.

In various dual-tone processing sequences, different reticle/mask types and different illuminator/exposure techniques can be used. For example, the different illuminators may deviate from known illuminator shapes, such as circular, dipole, annular, etc. In addition, the different reticle/masks can include:

1) Alternating PSMs (Phase Shift Mask). For instance, the use of a PSM mask and a trim mask.

2) Double-Dipole masks (2 masks+dipoles). For instance, a first exposure with a first mask including a dipole in a first arrangement (or pattern), followed by a second exposure with a second mask including a dipole in a second arrangement (or pattern).

3) Binary masks, i.e., masks with two degrees of transparency. For instance, a binary mask may have first regions that are approximately 100% transparent, and second regions that are opaque.

4) Tri-tone masks, i.e., masks with three degrees of transparency. For instance, a tri-tone mask may have first regions that are substantially transparent, second regions that are substantially opaque, and third regions that have a transparency intermediate to the first regions and the second regions.

5) Half-tone masks, i.e., masks having regions with a transparency between 0% and 100%. When a half-tone mask is used, the thickness of the lines and the mask pitch may be adjusted to alter the collective transparency of the mask pattern.

In some embodiments, specific developing, rinsing, and/or activation solutions can be developed for integrating different mask geometries and illuminators with DTD processes (i.e., specific treatments to mask geometries and illuminator). For example, different mask attenuation values (tri-tone), can be developed (i.e., select intermediate transparency and develop selection rules). In other examples, different illuminator pole intensity ratios can be used, and/or different geometry values can be developed as functions of proximity environments (rules). In addition, half-toning rules (sub-resolution pitch/size/edge spacing) can be developed and used.

During various dual-tone procedures, the inventors believe that their invention can be used to determine the best processing parameters and feature profiles that are needed to give the overall best solution when half-tone masking features are being used. For example, when resolution enhancement techniques such as sub-resolution line/space features, are used their invention can be used to determine the optimum pitch and/or size for a sub-resolution grating pattern.

In some procedures, the method of patterning a substrate can comprise: forming a layer of radiation-sensitive material on a substrate, wherein the layer of radiation-sensitive material comprises a dual-tone resist; performing one or more exposures of the layer of radiation-sensitive material to one or more patterns of radiation, wherein at least one of the one or more exposures comprises using a resolution enhancement technique.

In addition, the at least one of the one or more exposures can include forming the pattern of radiation using a mask selected from the group consisting of a phase-shift mask, a tri-tone mask, and a half-tone mask. When the half-tone mask is used, a sub-resolution pitch, a sub-resolution size, or mask edge spacing, or any combination of two or more thereof can be selected.

In some examples, the one or more exposures can comprise forming a first pattern of radiation using a first mask and forming a second pattern of radiation using a second mask, and wherein the first mask comprises a first dipole and the second mask comprises a second dipole different than the first dipole.

In addition, the method can further comprise: defining rules for the resolution enhancement technique.

In other embodiments, the methods used to pattern a substrate can comprise: forming a layer of radiation-sensitive material on a substrate, wherein the layer of radiation-sensitive material comprises a dual-tone resist; exposing the layer of radiation-sensitive material to a pattern of radiation using a mask to form one or more first radiation-sensitive material portions, one or more second radiation-sensitive material portions, and one or more third radiation-sensitive material portions; removing the one or more first radiation-sensitive material portions from the substrate using a first chemistry; and removing the one or more second radiation-sensitive material portions from the substrate using a second chemistry, wherein at least one region of the mask comprises a half-tone mask.

In still other embodiments, the methods used to pattern a substrate can comprise: forming a layer of radiation-sensitive material on a substrate, wherein the layer of radiation-sensitive material comprises a dual-tone resist; exposing the layer of radiation-sensitive material to a first pattern of radiation using a first mask, the first mask comprising at least one half-tone mask portion; performing positive-tone developing of the layer of radiation-sensitive material to remove first radiation-sensitive material portions from the substrate using a first chemistry; performing negative-tone developing of the layer of radiation-sensitive material to remove second radiation-sensitive material portions from the substrate using a second chemistry, wherein third radiation-sensitive material portions remain on the substrate, and wherein at least a part of the third radiation-sensitive material portions correspond to the half-tone mask portion.

These methods can further comprise: exposing the layer of radiation-sensitive material to a second pattern of radiation using a second mask; and performing a second positive-tone developing of the layer of radiation-sensitive material to remove fourth radiation-sensitive material portions.

The method can still further comprise: performing a first post-exposure bake of the substrate following the exposing the substrate to the first pattern of radiation and preceding the positive-tone developing; and performing a second post-exposure bake of the substrate following the positive-tone developing and preceding the negative-tone developing.

The method can also comprise: performing a third post-exposure bake of the substrate following the exposing the substrate to the second pattern of radiation and preceding the second positive-tone developing.

During some dual-tone procedures, process window values and process window overlap values can be determined.

Figure 13:
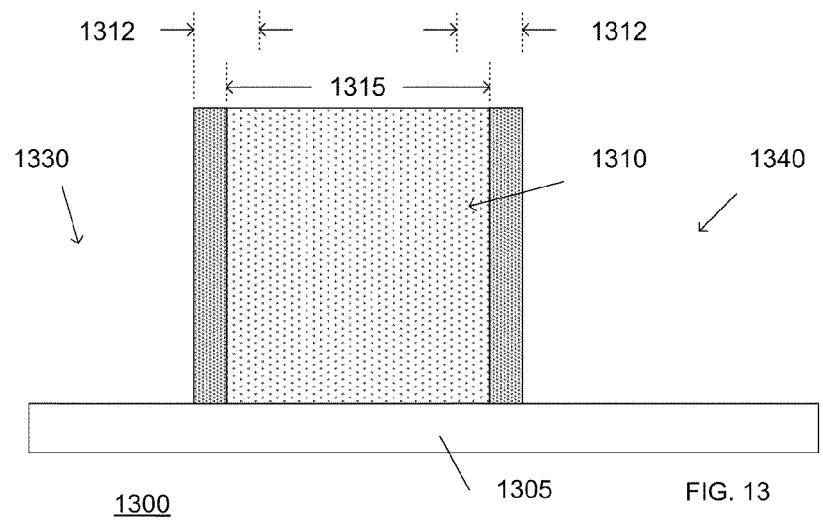
FIG. 13 illustrates an exemplary standard line pattern in accordance with embodiments of the invention.

FIG. 13 illustrates an exemplary standard line pattern in accordance with embodiments of the invention. The exemplary standard line pattern 1300 illustrated in FIG. 13 includes a substrate 1305, an exemplary line 1310, a first space region 1330, and a second space region 1340. In some examples, the first space region 1330 can be identified as a high exposure region in which the material was removed during positive-tone development procedures, and the second space region 1340 can be identified as a low exposure region in which the material was removed during negative-tone development procedures.

In various embodiments, the resist features (1310 and 1320) can comprise dual-tone resist material that can include photo-acid polymers and/or photo-base polymers. Alternatively, the resist features (1310 and 1320) can comprise partially-exposed and/or partially-developed dual-tone material.

A target critical dimension (CD) 1315 and an edge tolerance value 2412 are shown for the exemplary line 2410. For example, when the edge tolerance value is (+/−10%)*(CD spec), the individual line edge can vary by (0.05×CD). Typically, for normal line lithography, the CD change is symmetrical.

Figure 14:
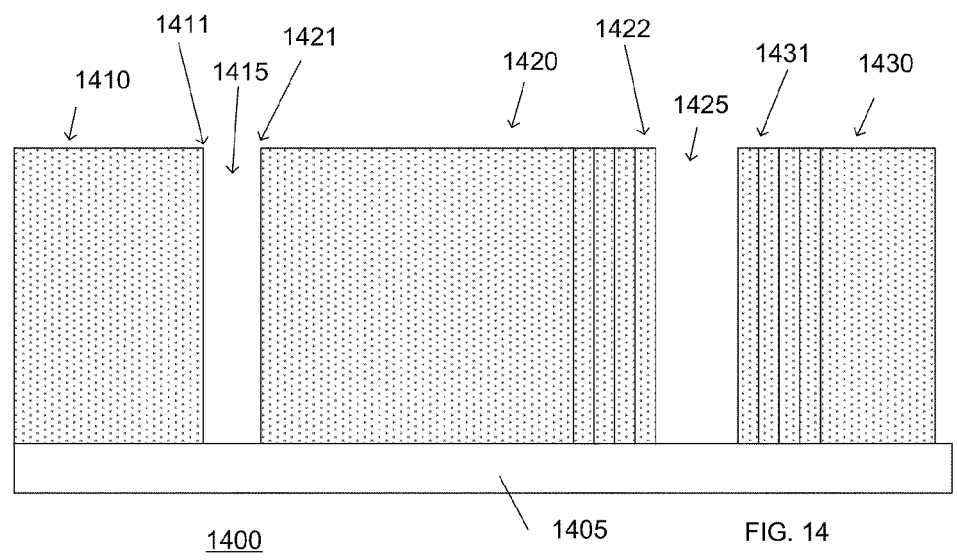
FIG. 14 illustrates exemplary exposure effects on line patterns in accordance with embodiments of the invention.

FIG. 14 illustrates exemplary exposure effects on line patterns in accordance with embodiments of the invention. The exemplary line pattern 1400 illustrated in FIG. 14 includes a substrate 1405, a first line feature 1410, a first space region 1415, a second line feature 1420, a second space region 1425, and a third line feature 1430. In some examples, the first space region 1415 and the second space region 1425 can be identified as high exposure regions in which the material was removed during positive-tone development procedures. Alternatively, the first space region 1415 and the second space region 1425 can be identified as low exposure regions in which the material was removed during negative-tone development procedures.

In FIG. 14, the first line feature 1410 has a first negative edge 1411 associated therewith, and the second line feature 1420 has another negative edge 1421 associated therewith. Alternatively, the first line feature 1410 may a positive edge associated therewith, and the second line feature 1420 may have another positive edge associated therewith.

In addition, the second line feature 1420 has at least one first positive edge 1422 associated therewith, and the third line feature 1430 has at least one other positive edge 1431 associated therewith. Alternatively, the second line feature 1420 may a negative edge associated therewith, and the third line feature 1430 may have another positive edge associated therewith.

During dual-tone procedures, each line is constructed using one positive edge and one negative edge. For example, all of the lines can have the same CD that is dose dependent (like traditional lithography); however, when there are exposure changes the positive edges (1422 and 1431) can change, and the size of the second space region 1425 can change.

In some examples, the first space regions 1415 can be formed using two negative edges (1411 and 1421), and the second space region 1425 can be formed using two positive edges (1422 and 1422). Alternatively, the first space regions 1415 may be formed using two positive edges, and the second space region 1425 may be formed using two negative edges.

Figure 15:
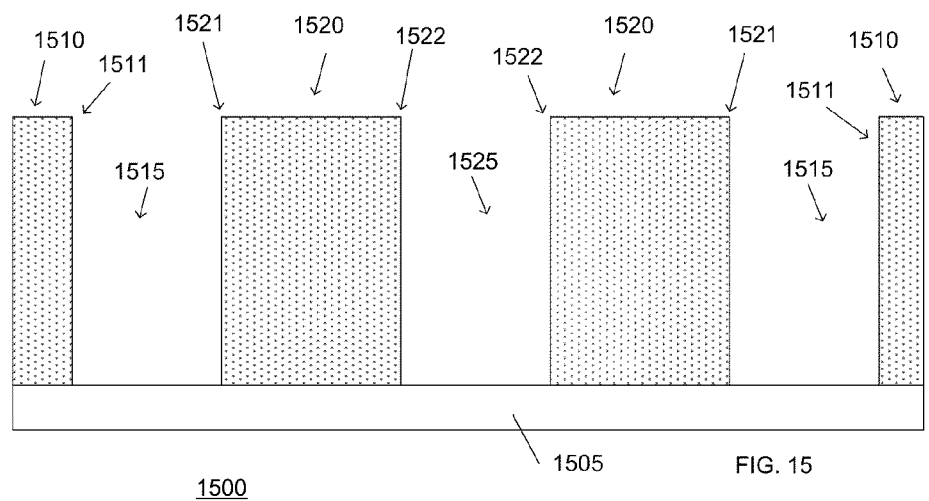
FIG. 15 illustrates exemplary space CD variations for line patterns in accordance with embodiments of the invention.

FIG. 15 illustrates exemplary space CD variations for line patterns in accordance with embodiments of the invention. The exemplary line pattern 1500 illustrated in FIG. 15 includes a substrate 1505, a plurality of first line features 1510, a plurality of first space regions 1515, a plurality of second line features 1520, and at least one second space region 1525. In some examples, the first space regions 1515 and the second space region 1525 can be identified as high exposure regions in which the material was removed during positive-tone development procedures. Alternatively, the first space region 1515 and the second space region 1525 can be identified as low exposure regions in which the material was removed during negative-tone development procedures.

The first line features 1510 can have first negative edges 1511 associated therewith, and the second line features 1520 can have a negative edge 1521 associated therewith. Alternatively, the first line features 1510 may positive edges associated therewith, and the second line features 1520 may also have positive edges associated therewith.

In addition, the second line features 1520 can have at least one first positive edge 1522 associated therewith. Alternatively, the second line feature 1520 may a negative edge associated therewith.

In some examples, the first space regions 1515 can be formed using two negative edges (1511 and 1521), and the second space region 1525 can be formed using two positive edges (1522 and 1522). Alternatively, the first space regions 1515 may be formed using two positive edges, and the second space region 1525 may be formed using two negative edges.

Both edges (1511 and 1521) of the first space regions 1515 can be defined by a first development process, and both edges (1522) of the second space regions 1525 can be defined by a second development process. The space regions (1515 and 1525) can have zero placement error because of this, and the CDs for the space regions (1515 and 1525) can be controlled by changing the dose-related parameters.

The inventors believe that in order to control the CD variation and establish a specified amount of variation, they need to determine overlapping process windows for both the line feature and the space feature. In various examples, they believe that the space feature can be treated as it always has been in traditional lithography, and they think that the line feature CD can shift and the feature position can walk as the exposure changes. In addition, the inventors have observed that the lines will have errors resembling traditional CD+overlay, and the line process window will be reduced relative to the traditional lithographic processes.

Figure 16:
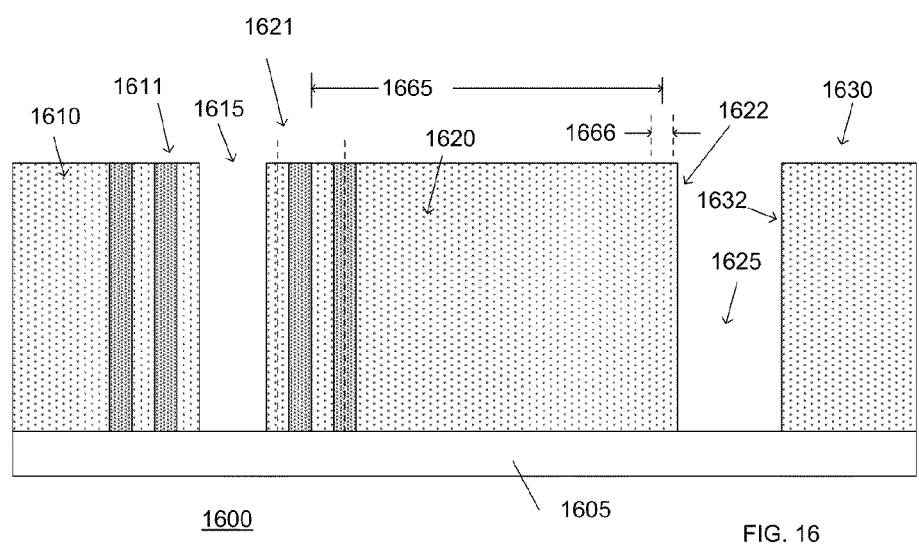
FIG. 16 illustrates an exemplary line pattern for determining target CD variations in accordance with embodiments of the invention.

FIG. 16 illustrates an exemplary line pattern for determining target CD variations in accordance with embodiments of the invention. The exemplary line pattern 1600 illustrated in FIG. 16 includes a substrate 1605, a first line feature 1610, a first space region 1615, a second line feature 1620, a second space region 1625, and a third line feature 1630. In some examples, the first space regions 1615 and the second space region 1625 can be identified as high exposure regions in which the material was removed during positive-tone development procedures. Alternatively, the first space region 1615 and the second space region 1625 can be identified as low exposure regions in which the material was removed during negative-tone development procedures.

The first line features 1610 can have first negative edges 1611 associated therewith, and the second line features 1620 can have other negative edges 1621 associated therewith. Alternatively, the first line features 1610 may have positive edges associated therewith, and the second line features 1620 may also have positive edges associated therewith.

For example, the second line features 1620 can have at least one first positive edge 1622 associated therewith. Alternatively, the second line feature 1620 may have a negative edge associated therewith. In addition, the third line feature 1630 can have a first positive edge 1632 associated therewith. Alternatively, the third line feature 1630 may have a negative edge associated therewith.

In some examples, the first space regions 1615 can be formed using two negative edges (1611 and 1621), and the second space region 1625 can be formed using two positive edges (1622 and 1622). Alternatively, the first space region 1615 may be formed using two positive edges, and the second space region 1625 may be formed using two negative edges.

Both edges (1611 and 1621) of the first space regions 1615 can be defined by a first development process, and both edges (1622 and 1632) of the second space regions 1625 can be defined by a second development process. The space regions (1615 and 1625) can have zero placement error because of this, and the target CD 1665 associated with the second line feature 1620 can be controlled by changing the dose-related parameters. In addition, the target CD 1665 can have an edge tolerance value 1666 that can be dependent on the type of dual-tone resist being used.

Figure 17:
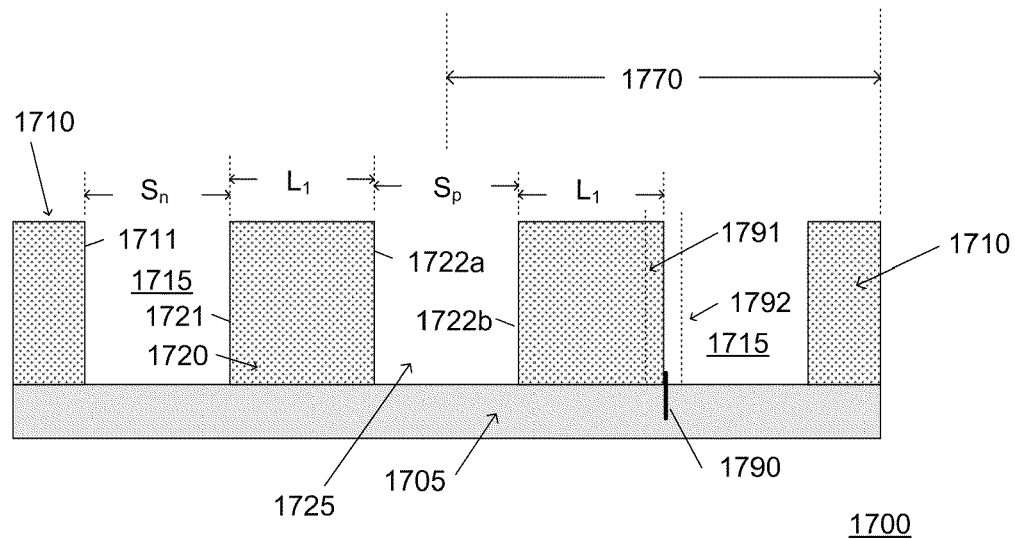
FIG. 17 illustrates an exemplary line pattern for determining specification window variations in accordance with embodiments of the invention.

FIG. 17 illustrates an exemplary line pattern for determining specification window variations in accordance with embodiments of the invention. The exemplary line pattern 1700 illustrated in FIG. 17 includes a substrate 1705, a plurality of first line features 1710, a plurality of first space regions 1715, a plurality of second line features 1720, and a second space region 1725. In some examples, the first space regions 1715 and the second space region 1725 can be identified as high exposure regions in which the material was removed during positive-tone development procedures. Alternatively, the first space region 1715 and the second space region 1725 can be identified as low exposure regions in which the material was removed during negative-tone development procedures.

At least one of the first line features 1710 can have a first negative edge 1711 associated therewith, and at least one of the second line features 1720 can have another negative edge 1721 associated therewith. Alternatively, the first line feature 1710 may have positive edges associated therewith, and the second line features 1720 may also have positive edges associated therewith.

For example, the second line features 1720 can have at least one first positive edge 1722 associated therewith. Alternatively, the second line feature 1720 may a negative edge associated therewith.

In some examples, the first space regions 1715 can be formed using two negative edges (1711 and 1721), and when the first space region 1715 is formed using the two negative edges (1711 and 1721), a "negative" space can be established that has a negative space width ($S_n$). For example, the negative space width ($S_n$) can vary from about 4 nm to about 40 nm. In addition, the second space region 1725 can be formed using two positive edges (1722a and 1722b), and when the second space region 1725 is formed using the two positive edges (1722a and 1722b); a "positive" space can be established that has a positive space width ($S_p$). For example, the positive space width ($S_p$) can vary from about 4 nm to about 40 nm. Furthermore, the second line feature 1720 can have a length (L$_1$) that can vary from about 4 nm to about 40 nm.

Both edges (1711 and 1721) of the first space regions 1715 can be defined by a first development process, and both edges (1722 and 1732) of the second space regions 1725 can be defined by a second development process. In addition, a (¾) (pitch) value 1770 can also be used during the dual-tone procedure.

The exemplary line pattern 1700 can include an outside line edge placement target 1790 that can have a first tolerance limit 1791 and a second tolerance limit 1792 associated therewith. For example, the space regions (1715 and 1725) can have zero placement error, and the outside line edge placement target 1790 associated with the second line feature 1720 can be controlled by changing the dose-related parameters. In addition, the first tolerance limit 1791 and the second tolerance limit 1792 can be dependent on the type of dual-tone resist being used.

In some embodiments, the following equations can be used.

$$\text{pitch} = S_p + S_n + 2L_1 \tag{1}$$

$$\text{Outside Line Edge Placement} = (0.5)(S_p) + L_1 = (0.5)(S_n) + L_1 \tag{2}$$

$$\text{Outside Line Edge Placement Target} = (3*\text{pitch}/8) + / - (\text{pitch}/4)(0.05) \tag{3}$$

$$\{-(\text{pitch}/4)(0.05)\} <= \{(0.5)(S_p) + L_1 - (3*\text{pitch}/8)\} <= \{(\text{pitch}/4)(0.05)\} \tag{4}$$

$$\text{Error in Line Edge Placement} = \{(0.5)(S_p) + L_1 - (3*\text{pitch}/8)\} \tag{5}$$

Figure 18:
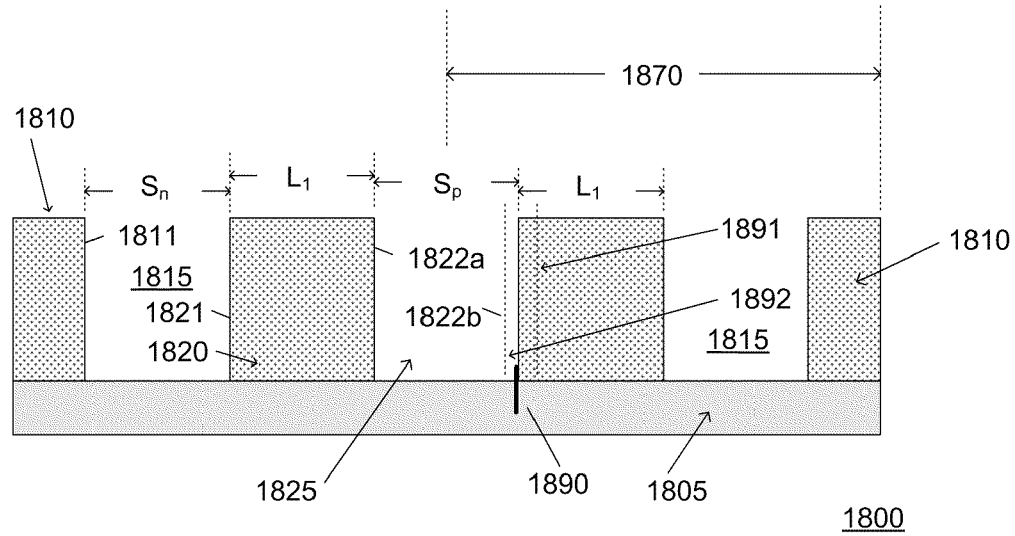
FIG. 18 illustrates an exemplary line pattern for determining additional specification window variations in accordance with embodiments of the invention.

FIG. 18 illustrates an exemplary line pattern for determining additional specification window variations in accordance with embodiments of the invention. The exemplary line pattern 1800 illustrated in FIG. 18 includes a substrate 1805, a plurality of first line features 1810, a plurality of first space regions 1815, a plurality of second line features 1820, and a second space region 1825. In some examples, the first space regions 1815 and the second space region 1825 can be identified as high exposure regions in which the material was removed during positive-tone development procedures. Alternatively, the first space region 1815 and the second space region 1825 can be identified as low exposure regions in which the material was removed during negative-tone development procedures.

At least one of the first line features 1810 can have a first negative edge 1811 associated therewith, and at least one of the second line features 1820 can have another negative edge 1821 associated therewith. Alternatively, the first line feature 1810 may have positive edges associated therewith, and the second line features 1820 may also have positive edges associated therewith.

For example, the second line features 1820 can have at least one first positive edge 1822 associated therewith. Alternatively, the second line feature 1820 may a negative edge associated therewith.

In some examples, the first space regions 1815 can be formed using two negative edges (1811 and 1821), and when the first space region 1815 is formed using the two negative edges (1811 and 1821), a "negative" space can be established that has a negative space width (S$_n$). For example, the negative space width (S$_n$) can vary from about 4 nm to about 40 nm. In addition, the second space region 1825 can be formed using two positive edges (1822a and 1822b), and when the second space region 1825 is formed using the two positive edges (1822a and 1822b), a "positive" space can be established that has a positive space width (S$_p$). For example, the positive space width (S$_p$) can vary from about 4 nm to about 40 nm. Furthermore, the second line feature 1820 can have a length (L$_1$) that can vary from about 4 nm to about 40 nm.

Both edges (1811 and 1821) of the first space regions 2715 can be defined by a first development process, and both edges (1822 and 1832) of the second space regions 1825 can be defined by a second development process. In addition, a (¾) (pitch) value 1870 can also be used during the dual-tone procedure.

The exemplary line pattern 1800 can include an inside line edge placement target 1890 that can have a first tolerance limit 1891 and a second tolerance limit 1892 associated therewith. For example, the space regions (1815 and 1825) can have zero placement error, and the inside line edge placement target 1890 associated with the second line feature 1820 can be controlled by changing the dose-related parameters. In addition, the first tolerance limit 1891 and the second tolerance limit 1892 can be dependent on the type of dual-tone resist being used.

For example, the CD specification and tolerances can be the same when the inside line edge placement target 1890 is used. In addition, when the space CDs is within the limits, the inside line edge will be within the specified limits as well. If the positive space 1825 meets the CD specification and both line edges (1822a and 1822b) meet their edge line specification limits, then the negative space 1815 must also meet its CD specifications as well since pitch is fixed. The inventors are establishing novel techniques that can be used to determine and/or optimize overlapping process windows by determining the overlap of the process window for one of the spaces, and the process window for the line edge defined by the opposite tone development.

In addition, the inventors further believe that they have invented one or more novel optimization routines for Dual-tone Development (DTD) procedures. Because the DTD procedures are complex, optimization is very challenging. The inventors have developed several novel algorithms for optimizing the process based on various desired outputs: 1) Profile; 2) Profile+Exposure Latitude; 3) Profile+Exposure Latitude+Depth of Focus; 4) Profile+Exposure Latitude+Depth of Focus+MEF (Mask Error Factor); and 5) Profile+Exposure Latitude+Depth of Focus+MEF+additional output parameter (in this manner the methodology can be extended to include many variables.)

Figure 19:
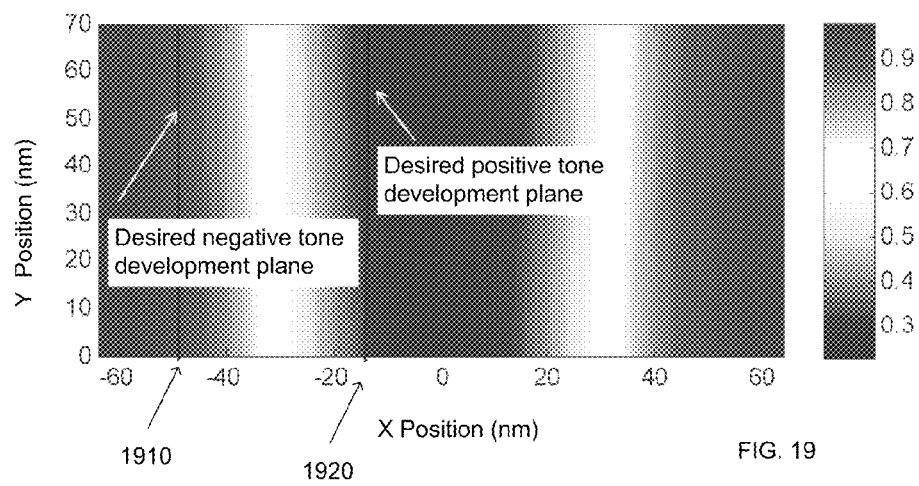
FIG. 19 and FIG. 20 show the general methodology for optimizing the profile in accordance with embodiments of the invention.
Figure 20:
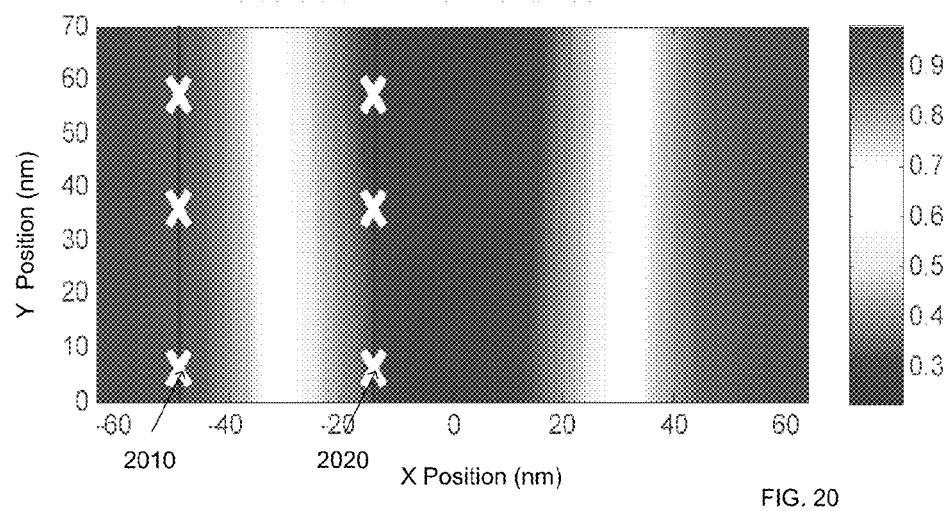

FIG. 19 and FIG. 20 show the general methodology for optimizing the profile. For DTD, there are two planes of concern, the first plane 1910 is where the negative tone development occurs, and the second plane 1920 is where the positive tone occurs. The inventors can model and optimize the behavior at these planes (1910 and 1920) to optimize the process. In the simplest case, the inventors place the planes (1910 and 1920) where they want the final resist edges to be (zero bias condition); however, they are not limited to this placement; the inventors have developed novel techniques in which a user can specify a desired bias, a desired placement, a desired negative tone threshold, and a desired positive tone threshold.

Once the planes of interest have been established, the input parameters (scanner settings, process conditions, resist parameters) can be varied, and in some embodiments, the de-protection gradient and other associated parameters can be calculated and/or optimized at the planes of interest. In order to have a substantially vertical profile, the de-protection gradients can be calculated at (n) points in the vertical planes of interest (as shown in FIG. 20 as 2010 and 2020). The deprotection gradients can then optimized by determining the highest average deprotection gradient while minimizing the standard deviation of all of the deprotection gradients (means that deprotection is similar at both positive and negative planes of interest and is similar at the points of interest within those planes.). To enhance the optimization, optimization routines can be used that intelligently move the input parameters to more quickly converge on optimal solutions.

After this particular methodology for optimizing a dual-tone development process is completed, additional metrics can be added to the optimization. For example, a user can monitor how the deprotection gradient metrics that were calculated for an ideal situation vary through dose and focus. The user can also see how the process responds to changes on the reticle (MEF) or to changes in lithography processing parameters like PEB time.

The inventors have developed techniques to co-optimize the gradients at two critical planes, and to balance the final image on both sides of line. The inventors also have developed techniques to monitor the contrast at multiple planes of resist depth in order to have good sidewalls. In addition, the inventors have used (10%, 50%, and 80%) values to minimize errors at the surface.

Figure 21A:
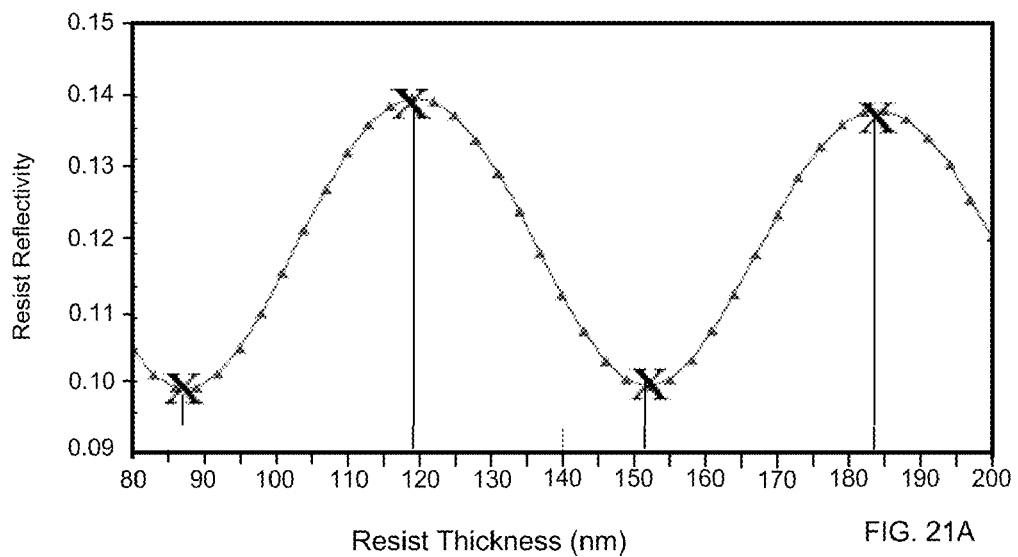
FIGS. 21A-21C illustrate exemplary resist resistivity data in accordance with embodiments of the invention.
Figure 21B:
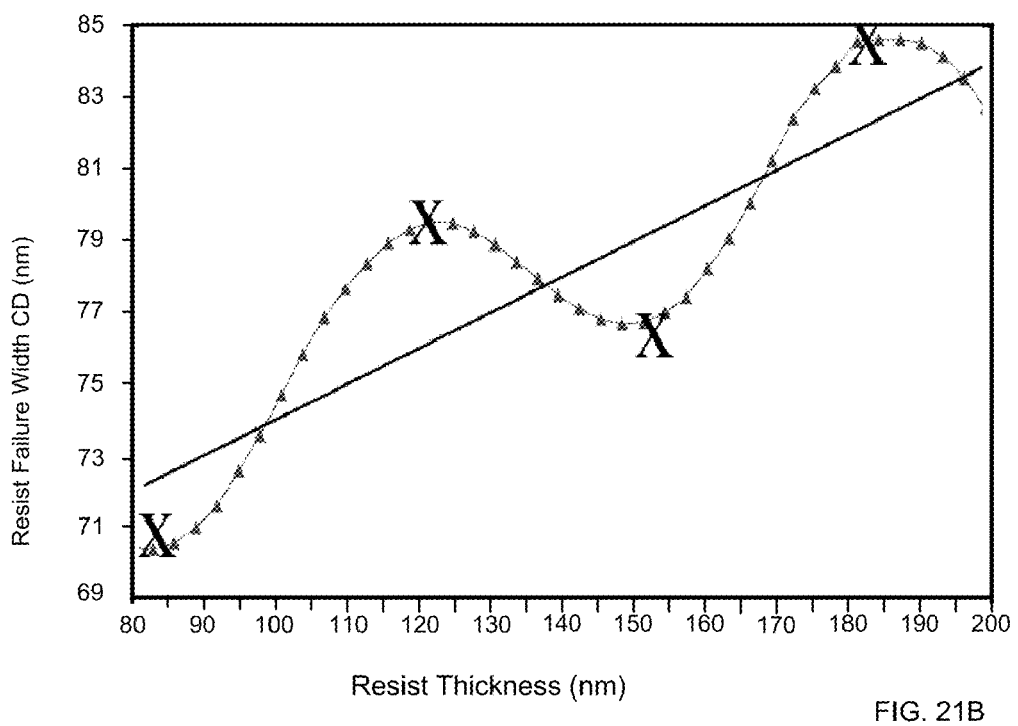
Figure 21C:
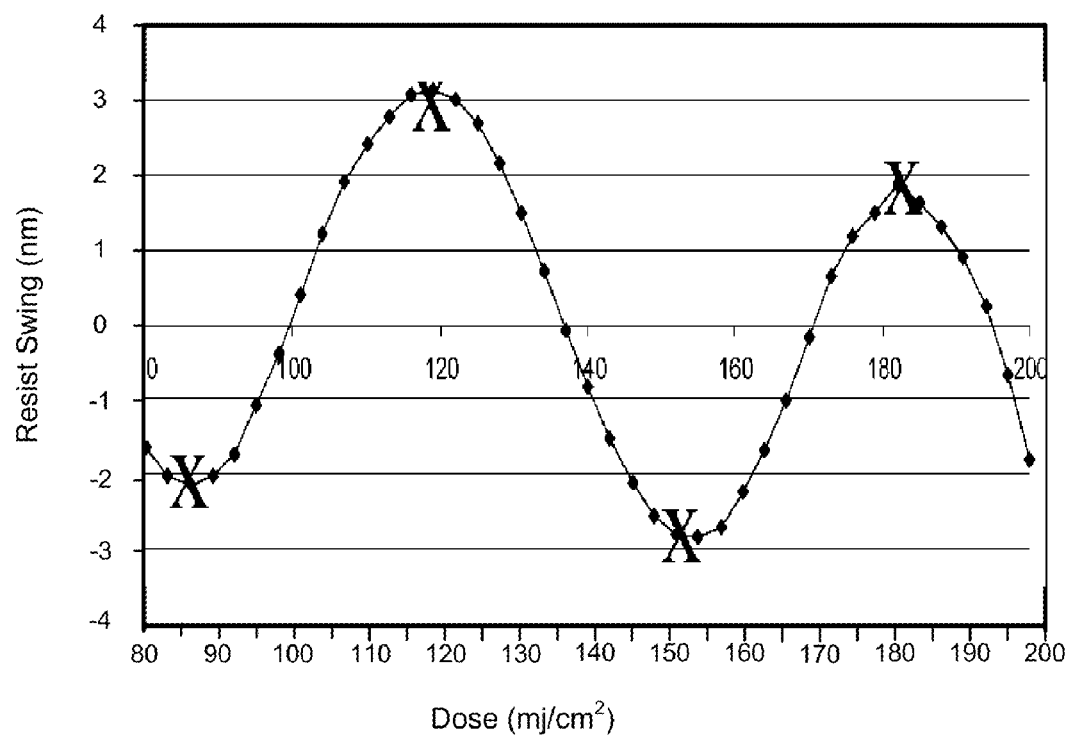

FIG. 21A illustrates an exemplary resist resistivity graph in accordance with embodiments of the invention. FIG. 21B illustrates an exemplary resist failure width (CD) graph in accordance with embodiments of the invention. FIG. 21C illustrates an exemplary resist swing graph in accordance with embodiments of the invention.

The swing curve concept is well understood. Because of thin film interference effects, energy input into a resist film is dependent on the resist film itself. FIG. 21A shows the reflectivity off the top surface of the resist as a function of the resist thickness. This behavior translates into a shift in CD as a function of resist thickness (as shown in FIG. 21B) because the difference in reflectivity translates into a change in the dose that the resist sees. The CD shift has a "bulk effect" that is due to resist absorbance (the thicker the resist, the more energy is dissipated in the resist and the less is reflected) and a swing effect due the resist thickness. In FIG. 21C, the bulk effect has been subtracted out to show the CD variance due to resist thickness.

Figure 22A:
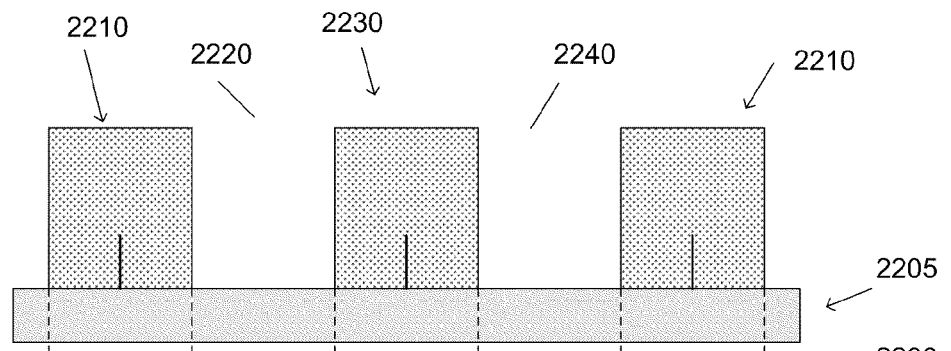
FIGS. 22A-22C illustrate exemplary exposure dose data in accordance with embodiments of the invention.
Figure 22B:
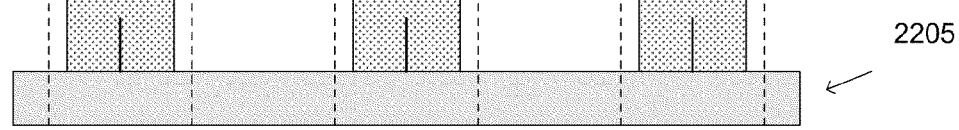
Figure 22C:
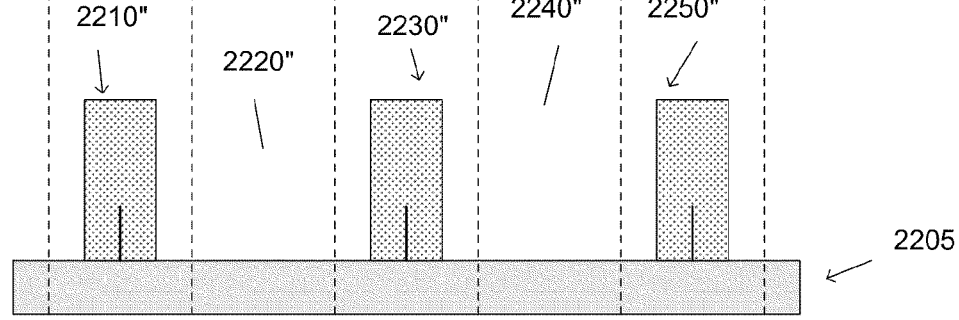

FIGS. 22A-22C illustrate a simplified view of how a positive resist responds to different exposure doses when the positive resist is used in a traditional lithographic procedure.

FIG. 22A illustrates a first patterned substrate 2200 after a first dose value (x) has been applied to the first patterned substrate 2200. For example, the first patterned substrate 2200 can include a substrate 2205, a first resist feature 2210, a first space 2220, a second resist feature 2230, a second space 2240, and a third resist feature 2250.

FIG. 22B illustrates a patterned substrate 2200' after a second dose value (x+Δx) has been applied to the patterned substrate 2200'. For example, the patterned substrate 2200' can include a substrate 2205, a smaller first resist feature 2210', a larger first space 2220', a smaller second resist feature 2230', a larger second space 2240', and a smaller third resist feature 2250'.

FIG. 22C illustrates a patterned substrate 2200" after a third dose value (x+2Δx) has been applied to the patterned substrate 2200". For example, this patterned substrate 2200" can include a substrate 2205, a slightly smaller first resist feature 2210", a slightly larger first space 2220", a slightly smaller second resist feature 2230", a slightly larger second space 2240", and a slightly smaller third resist feature 2250".

As shown in FIGS. 22A-22C, the CD changes size, and the change is taken symmetrically from both edges of the feature so that the center of the line structure stays in the same place as exposure dose is changed. Lithographers use these results to determine the best resist thickness for the lithographic processes. In order to avoid large CD changes because of resist thickness changes, lithographers operate on the maximum or minimum of the swing curve where the curve is the most flat (least sensitive). In order to determine where this is, a lithographer will coat a series of wafers with different resist of different thickness, shoot all the wafers with the same exposure dose, and then measure the line CD from each wafer. Plotting the line CD versus the resist thickness results in a curve as shown in FIG. 22C, and finding the appropriate operating points is well known.

Figures 23A, 23B, 23C:
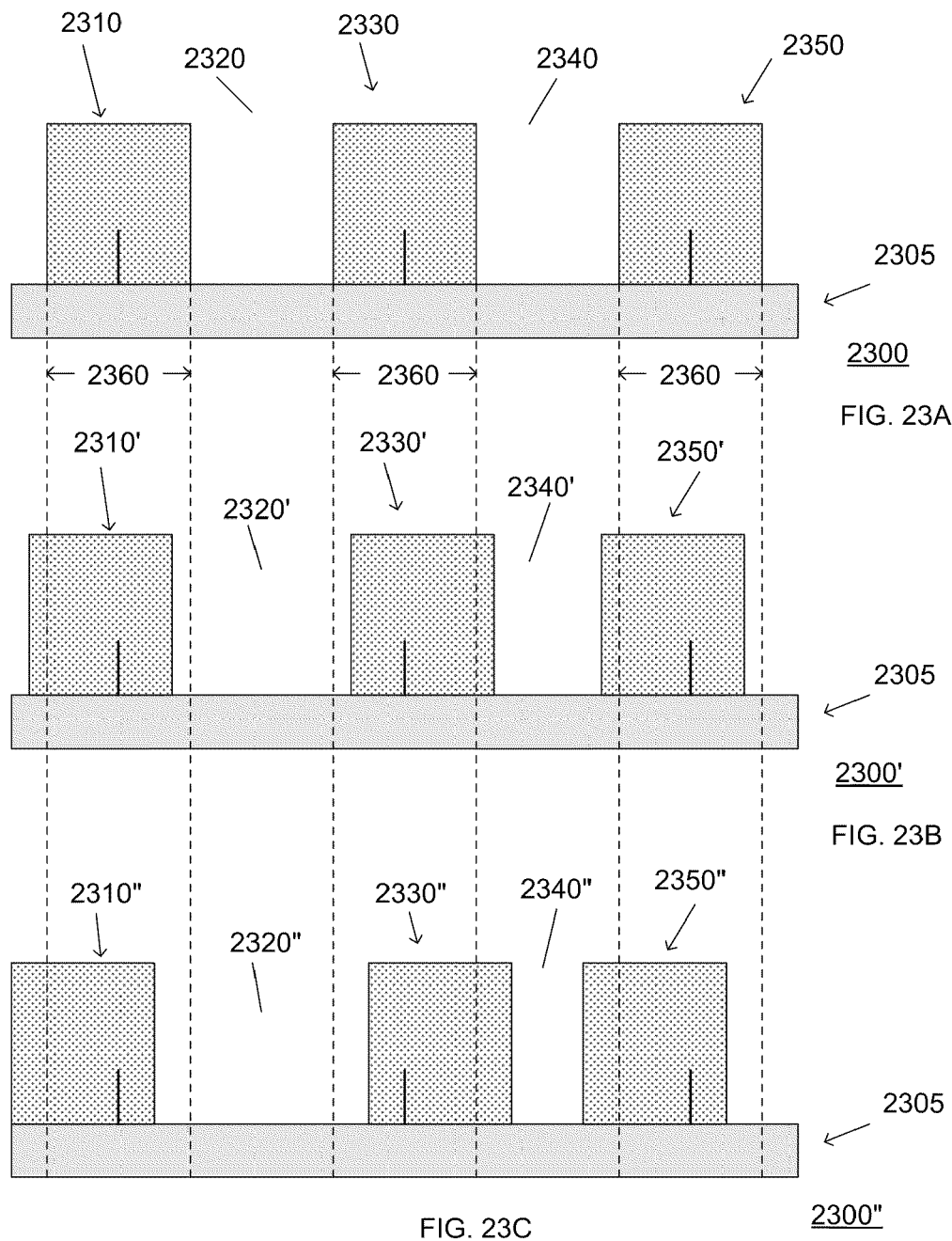
FIGS. 23A-23C illustrate exemplary exposure dose data for a dual-tone resist in accordance with embodiments of the invention.

FIGS. 23A-23C illustrate a simplified view of how a dual-tone resist responds to different exposure doses when the dual-tone resist is used in a dual-tone development procedure.

FIG. 23A illustrates a first patterned substrate 2300 after a first dose value (x) has been applied to the first patterned substrate 2300. For example, the first patterned substrate 2300 can include a substrate 2305, a first resist feature 2310, a positive space 2320, a second resist feature 2330, a negative space 2340, and a third resist feature 2350.

FIG. 23B illustrates a patterned substrate 2300' after a second dose value (x+Δx) has been applied to the patterned substrate 2300'. For example, the patterned substrate 2300' can include a substrate 2305, an offset first resist feature 2310', a larger positive space 2320', an offset second resist feature 2330', a smaller negative space 2340', and an offset third resist feature 2350'.

FIG. 23B illustrates a patterned substrate 2300" after a third dose value (x+2Δx) has been applied to the patterned substrate 2300". For example, the patterned substrate 2300" can include a substrate 2305, a more offset first resist feature 2310", a slightly larger positive space 2320", a more offset second resist feature 2330", a slightly smaller negative space 2340", and a more offset third resist feature 2350".

As shown in FIGS. 23A-23C, there are several distinct differences between this scheme and the traditional lithographic process, and these differences can include:

1) The CD of the line may or may not change size. Each line feature is composed of one edge defined by the positive development process and one line edge from the negative development process. If the responses of the positive and negative development processes to dose are equal in magnitude and opposite in sign, the CD of the line does not shift. (If the magnitudes are not equal, the CD of the line will change, but not symmetrically).

2) The center of the line can move, and this is because the positive tone space gets bigger while the negative tone space shrinks. Because of this behavior, it is not possible to use traditional swing curve methods (measurement of a line CD) to determine the best operating point for a resist process. Instead a different figure of merit can be used based on the CD of adjacent spaces. Specifically, instead of plotting the CD of a line as a function of resist thickness, one could plot the (Space-positive tone and/or the Space-negative tone) as functions of resist thickness. This merit function will swing in a way similar to line CD for a traditional lithographic process.

Figure 24A:
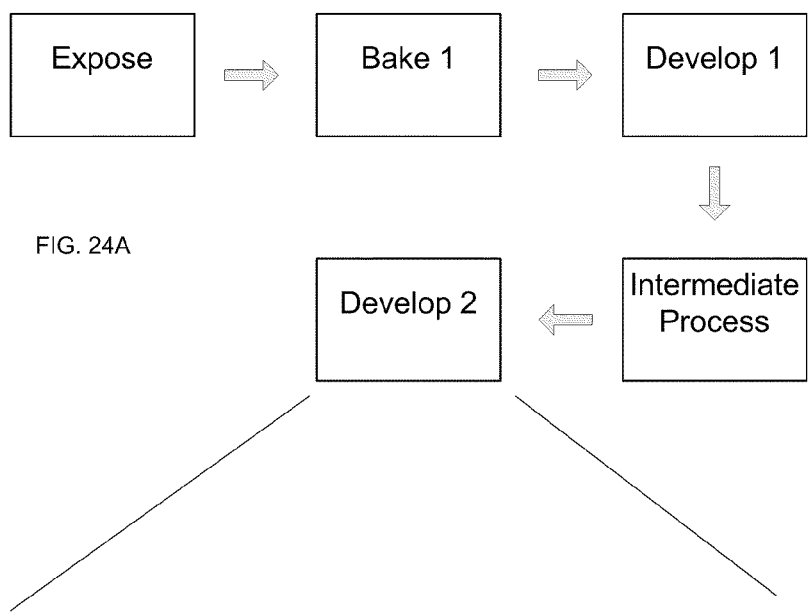
FIGS. 24A-24C illustrate simplified flow diagram of an exemplary dual-tone processing sequence in accordance with embodiments of the invention.
Figure 24B:
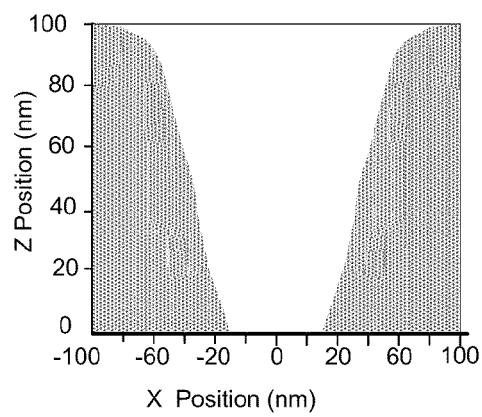
Figure 24C:
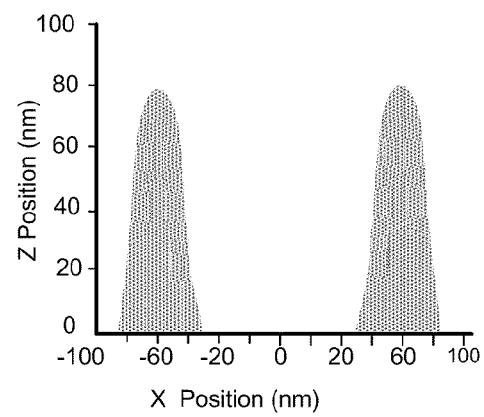

FIG. 24A illustrates a simplified flow diagram of an exemplary dual-tone processing sequence in accordance with embodiments of the invention. FIG. 24B illustrates a first exemplary resist profile after a first develop procedure in accordance with embodiments of the invention. FIG. 24A illustrates a second exemplary resist profile after a second develop procedure in accordance with embodiments of the invention.

In still other embodiments of the invention, the inventors have developed novel dual-tone development code algorithms. The inventors believe that the commercially available software package does not do what they want to do with dual-tone development, and that is to use a single exposure to generate acid and then provide two different develop routines with the second operating on the output of the first.

The inventors have constructed novel code that uses a single exposure, and have used this novel code to understand and model the double development procedures. For example, FIG. 24A shows the flow. There is existing software that does all of the first four steps of the overall flow; the ATG code does the fifth step. Some of the novel aspects of the code include:

1) The boundary condition for the second development is no longer a flat surface but one with trenches that are already patterned, therefore, the programming involved is much more complex.

2) As a result of (1), interaction between the two development steps is captured. An imperfection in the features after the first development can lead to a dramatic imperfection after the second development.

Figure 25:
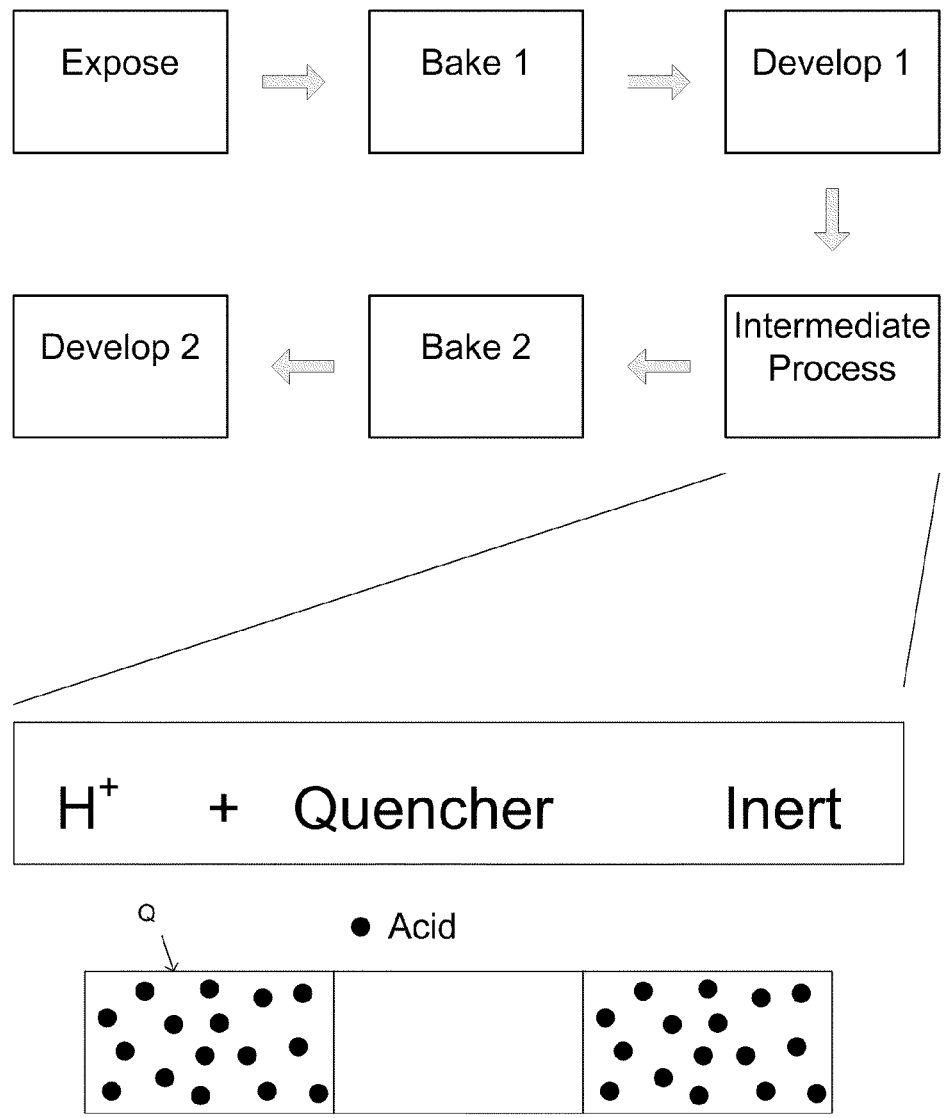
FIG. 25 presents additional exemplary data for patterning a substrate.

The inventors have developed novel models to predict the inter-development effects described herein. In the dual-tone development process flows, what happens during the first development step may impact the processing afterward. Consider the case where positive development is completed first, and in which it is desired to have a second PEB step to enhance the second development. If the first development is completed with an aqueous base developer as is commonly the case, the base may penetrate into the resist film and quench some of the acid that can be used during the second PEB to enhance the negative development (see reaction in FIG. 25). This is one example of the kind of behavior that can occur during the first and second development steps, and can be modeled in the routines that can be established.

In some embodiments, the inventors can establish additional modeling steps to account for such behavior. For example, the ideal acid profile can be calculated and perturbed using another mathematical function. The output of this function can then be input into the second PEB step, and the resultant de-protection profile can be used to calculate the second development step.

The example cited above is an "undesired effect." This same technique could be applied to an intermediate process that we intentionally inject into the system as well, and including these extra modeling steps should improve the accuracy.

The inventors have examined many different resist formulations during their dual-tone development (DTD) experiments. In some basic examples, one or more protecting (chemical) group species can be used (attached to polymer) during the resist formulation process. When two or more groups are attached to the polymer, they can have distinct activation energies so that discrimination of the negative and positive tone process can be achieved during multiple PEB steps.

The exemplary resists can include:
Different tertiary esters of carboxylic acids (e.g. methyladamantyl protecting group verses a t-butyl ester protecting group.)
t-butoxy carbonyl oxy protecting groups of hexafluoro isopropanols.)
Ratios of protecting group concentrations
Overall Embodiment:
Idea is to take advantage of split PEB steps for dual-tone development.

Figure 26A:
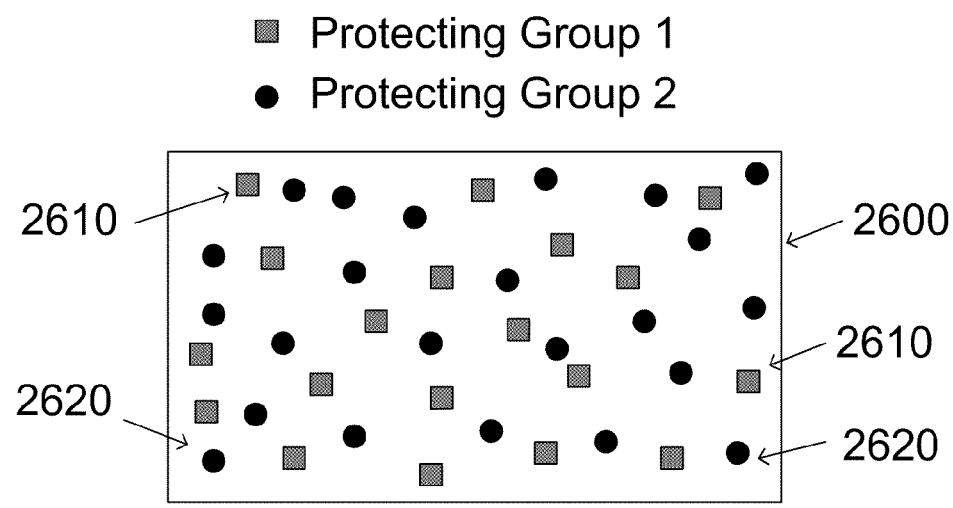
FIGS. 26A-26B illustrate additional resist data in accordance with embodiments of the invention.

In some examples, the resist formulation can require multiple PEB steps. If multiple PEB steps are essential to make DTD work, then multiple PEB steps can provide a better process.
Potential Benefits:
Provide higher throughput (bake higher temperature/less PEB time on 2nd bake)
More control for CD sizing (temperature becomes another process knob)
Can be combined with PEB time control schemes (ie, use both temperature and time control to center process)
May provide more flexibility in resist design/formulation FIG. 26A illustrates a simplified diagram of a resist in accordance with embodiments of the invention. FIG. 26A shows a simplified resist 2600 that includes a first protecting group 2610 and a second protecting group 2620.

Figure 26B:
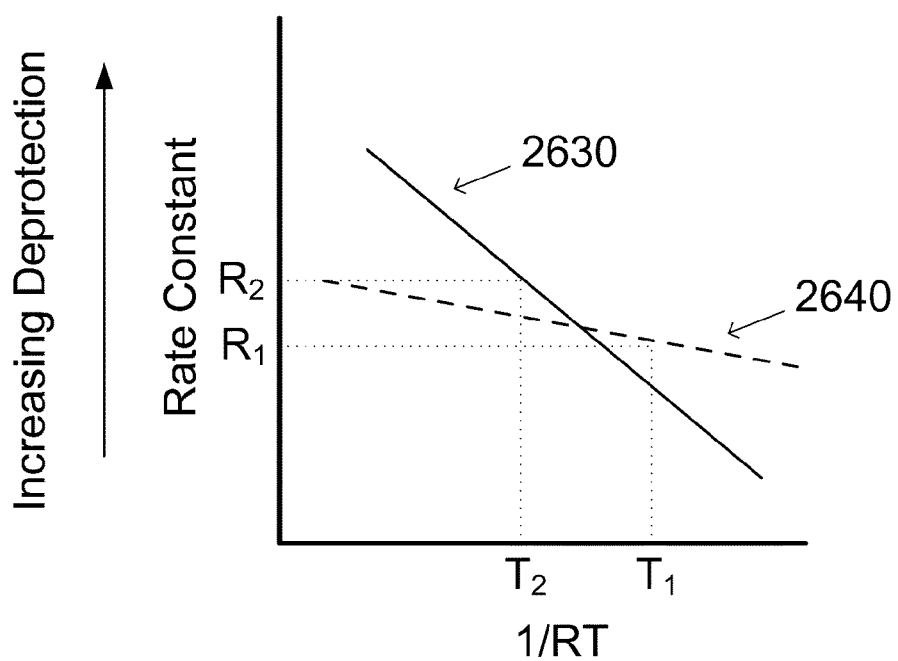

FIG. 26B illustrates a simplified rate constant graph in accordance with embodiments of the invention. The slopes of the lines (2630 and 2640) show the different activation energies for the different protecting groups. For temperature $T_1$, $R_1$ dominates the rate of de-protection reaction. For temperature $T_2$, $R_2$ dominates the rate of de-protection reaction. Since $R_1$ dominates the rate reaction at temperature $T_1$, protecting group 1 can be thought of as the dominating specie for a given develop process (say, the positive tone). Then by shifting to higher temperature ($T_2$) on a second bake, the rate reaction is dominated by $R_2$, which is a result of protecting group 2. Rate $R_2$ can be used to increase or enhance the de-protection reaction for the negative tone process. This can be used as a "knob" for discriminating between two reactions (ie, positive and negative tone de-protection reactions).

In some embodiments, a dual-tone resist can comprise: a backbone polymer comprising two or more side groups, each of the two or more side groups having distinct activation energies for de-protection.

In some embodiments, a method of patterning a substrate can comprise: forming a layer of radiation-sensitive material on a substrate, wherein the layer of radiation-sensitive material comprises a backbone polymer comprising two or more side groups, each of the two or more side groups having a distinct activation energy for de-protection; exposing the layer of radiation-sensitive material to a pattern of radiation; performing a first post-exposure bake of the substrate to de-protect a first side group at a greater rate than a second side group; performing a first developing of the layer of radiation-sensitive material to remove first radiation-sensitive material portions from the substrate using a first chemistry; performing a second post-exposure bake of the substrate to de-protect the second side group at a greater rate than the first side group; performing a second developing of the layer of radiation-sensitive material to remove second radiation-sensitive material portions from the substrate using a second chemistry.

The method can further comprise: adjusting a ratio of an amount of a first side group to an amount of a second side group.

Some methods of patterning a substrate can comprise: forming a layer of radiation-sensitive material on a substrate, wherein the layer of radiation-sensitive material comprises a backbone polymer comprising two or more side groups, each of the two or more side groups having a distinct activation energy for de-protection; and discriminating between a first de-protection reaction and a second deprotection reaction by selecting a temperature for heating the layer of radiation-sensitive material following an exposure of the layer of radiation-sensitive material electromagnetic (EM) radiation.

Figure 27:
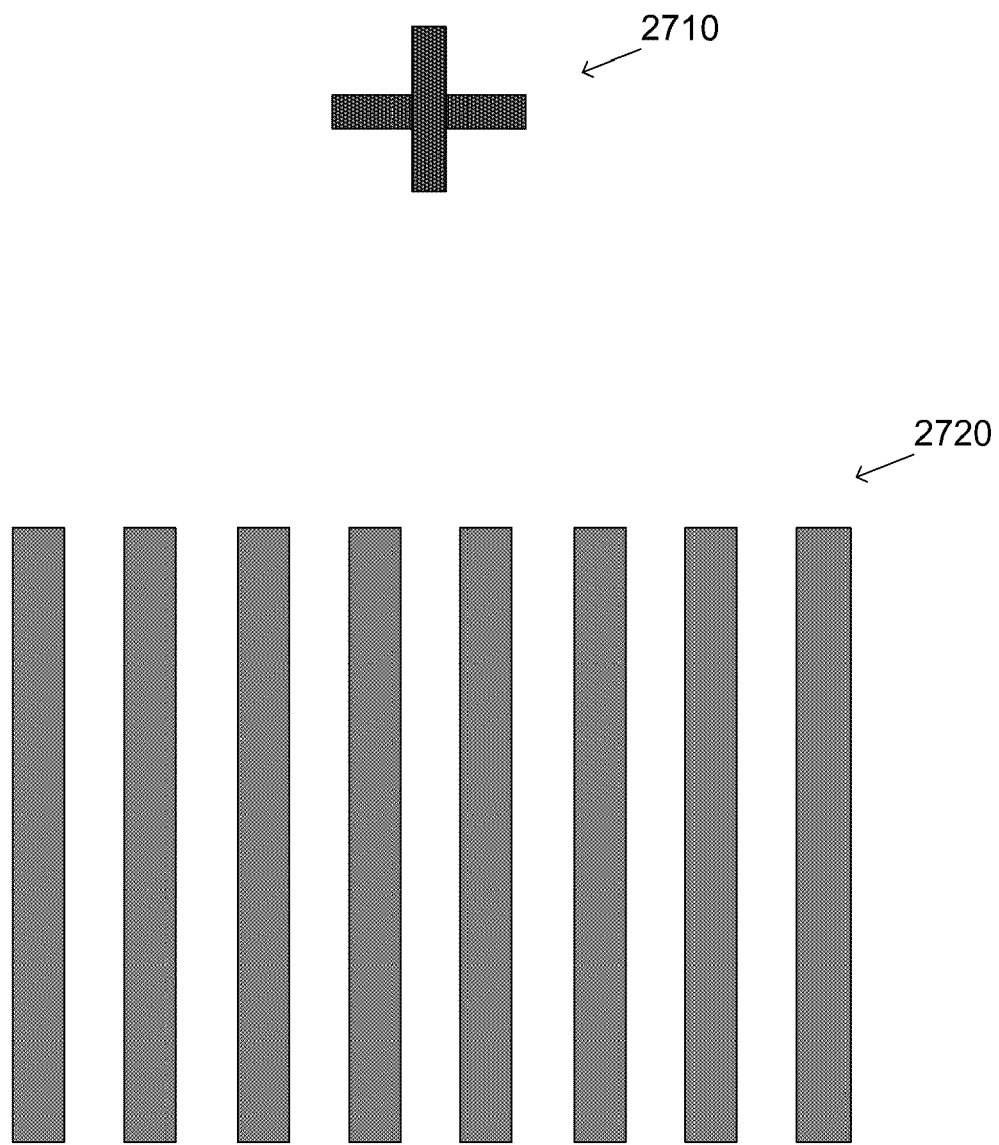
FIG. 27 presents additional exemplary data for patterning a substrate.

The inventors have also developed a Dual-tone Development (DTD) Metrology Strategy. In the dual-tone development DTD system, there are two types of spaces in the line/space patterns. Spaces delineated by a positive tone development process alternate with spaces delineated by a negative tone development process. When examining the grating itself, it is difficult to tell the difference between the positive tone and negative tone spaces. In order to detect and correct for pitch walking, it is important to know which space is which. Therefore, the inventors have developed a novel DTD metrology strategy that determines which space is which. In some embodiments, a metrology marker 2710 can be established in close proximity to the grating—2720 as depicted in FIG. 27. This marker 2710 will be used for pattern recognition of the metrology marker. The proximity of this feature must be close enough to the grating structure 2720 so that it is virtually impossible for a SEM to lose its alignment after completing the pattern recognition step and moving to measure the actual feature. In this way, a space can be measured and it can be known which tone of development defined it, thus making process control possible.

In some simulation based embodiments, the inventors have used zero-order approximation techniques to estimate and/or predict the resist profiles in the dual-tone simulation process. The dissolution behavior is assumed to be independent from each develop step.

Figure 28A:
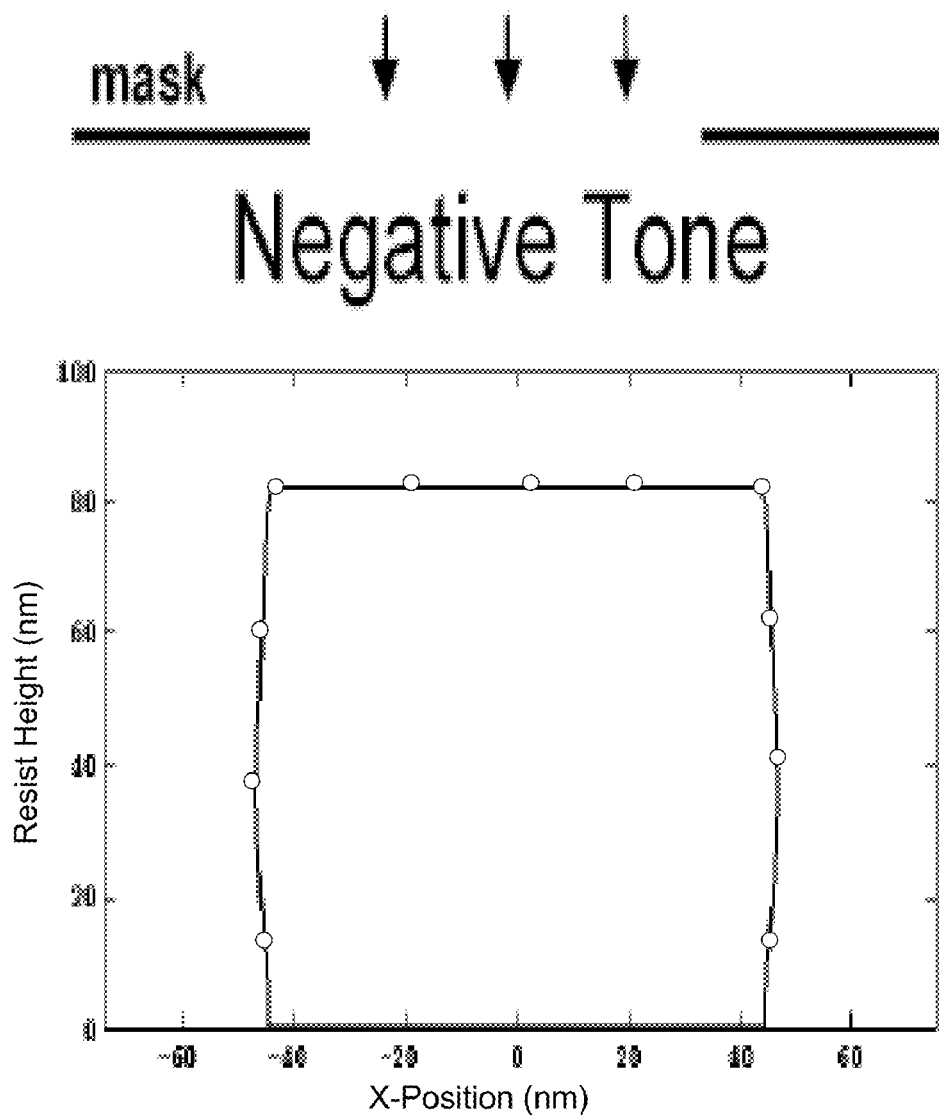
FIGS. 28A-28C illustrate exemplary steps for a simulated negative tone response in accordance with embodiments of the invention.
Figure 28B:
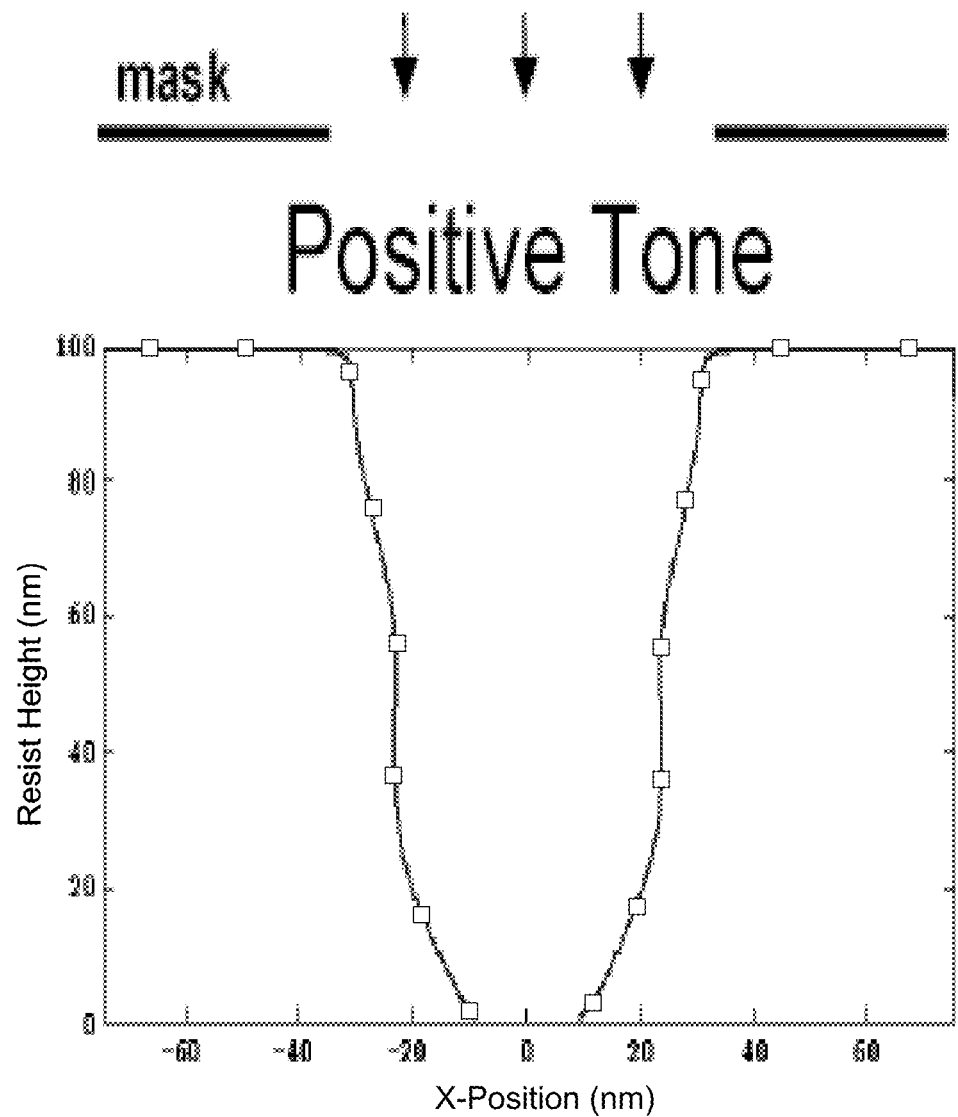
Figure 28C:
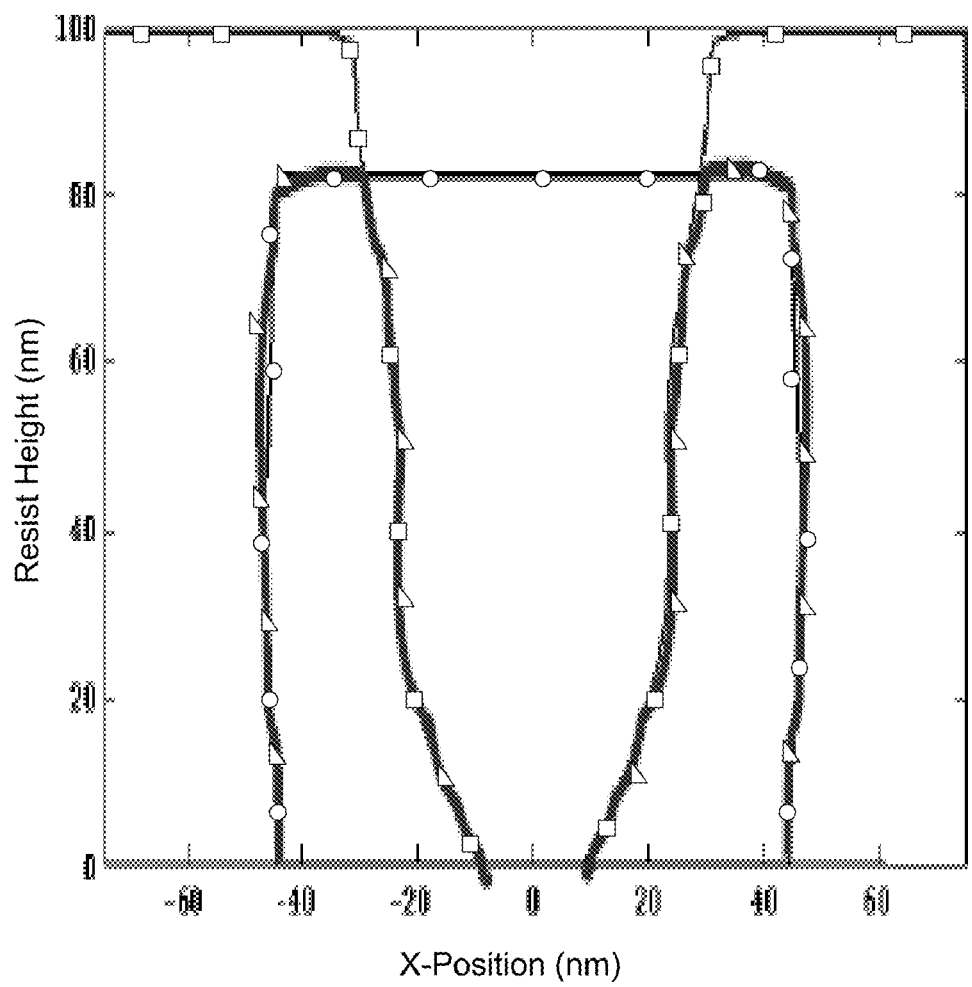

FIGS. 28A-28C illustrate a simplified view of a zero-order simulation technique in accordance with embodiments of the invention. FIG. 28A illustrates a first step in which a negative tone response is simulated. FIG. 28B illustrates a second step in which a positive tone response is simulated. FIG. 28C illustrates a third step in which the simulated negative tone response and the simulated positive tone response are combined.

In additional embodiments, the inventors have developed novel DT control strategies in which novel procedures, algorithms, and/or models are used to center a particular dual-tone development process by using experimental or simulated data. For example, the control strategy can include:

1) Measuring one or more CD responses versus PEB time/temperature, exposure dose, mask CD.

2) Creating one or more sensitivity maps (understand how wafer CD changes with PEB, mask CD, and exposure dose).

3) Expanding the process window parameters to include an expanded set of parameters that provide added information and can go beyond the typical PEB, mask CD, and dose variables.

The control strategies provide algorithmic-based procedures that can be used by a process engineer to center a given dual-tone process with whatever adjustable/control parameters are available to the process engineer.

Figure 29A:
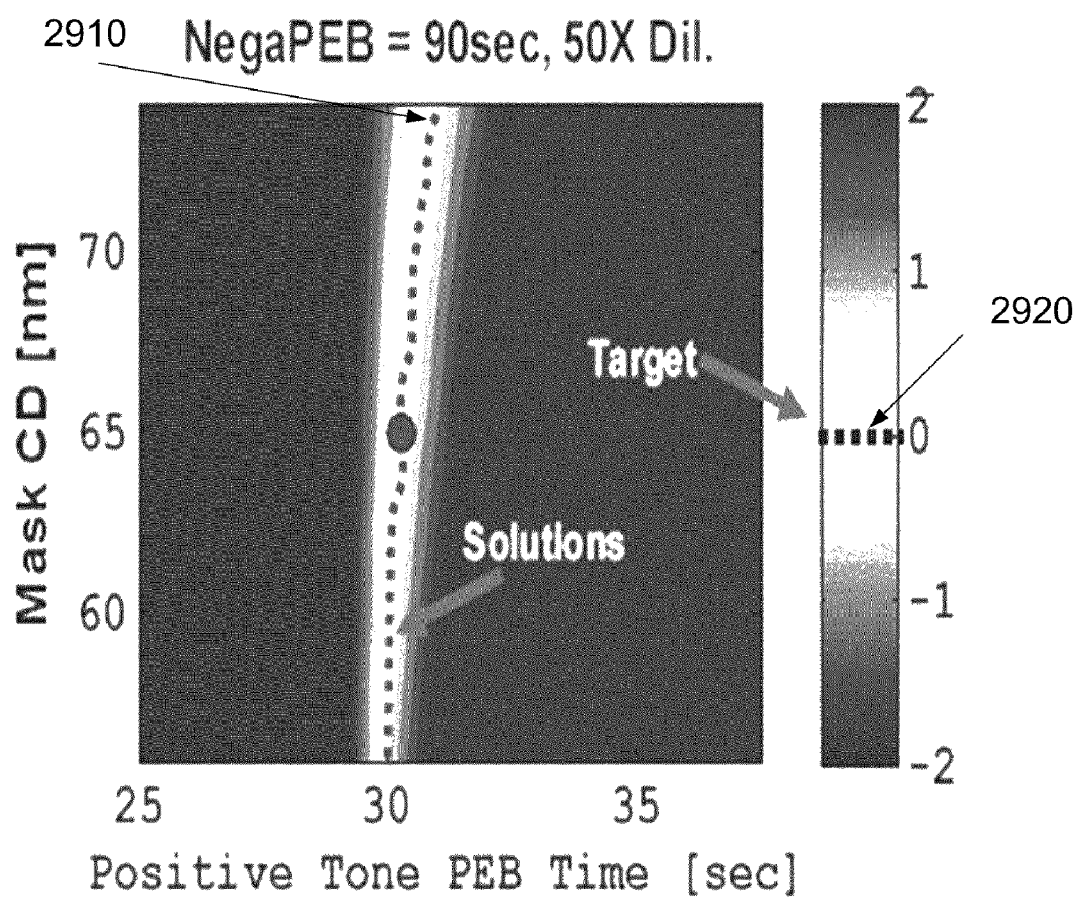
FIG. 29A and FIG. 29B illustrate a simplified view of a process centering technique in accordance with embodiments of the invention.
Figure 29B:
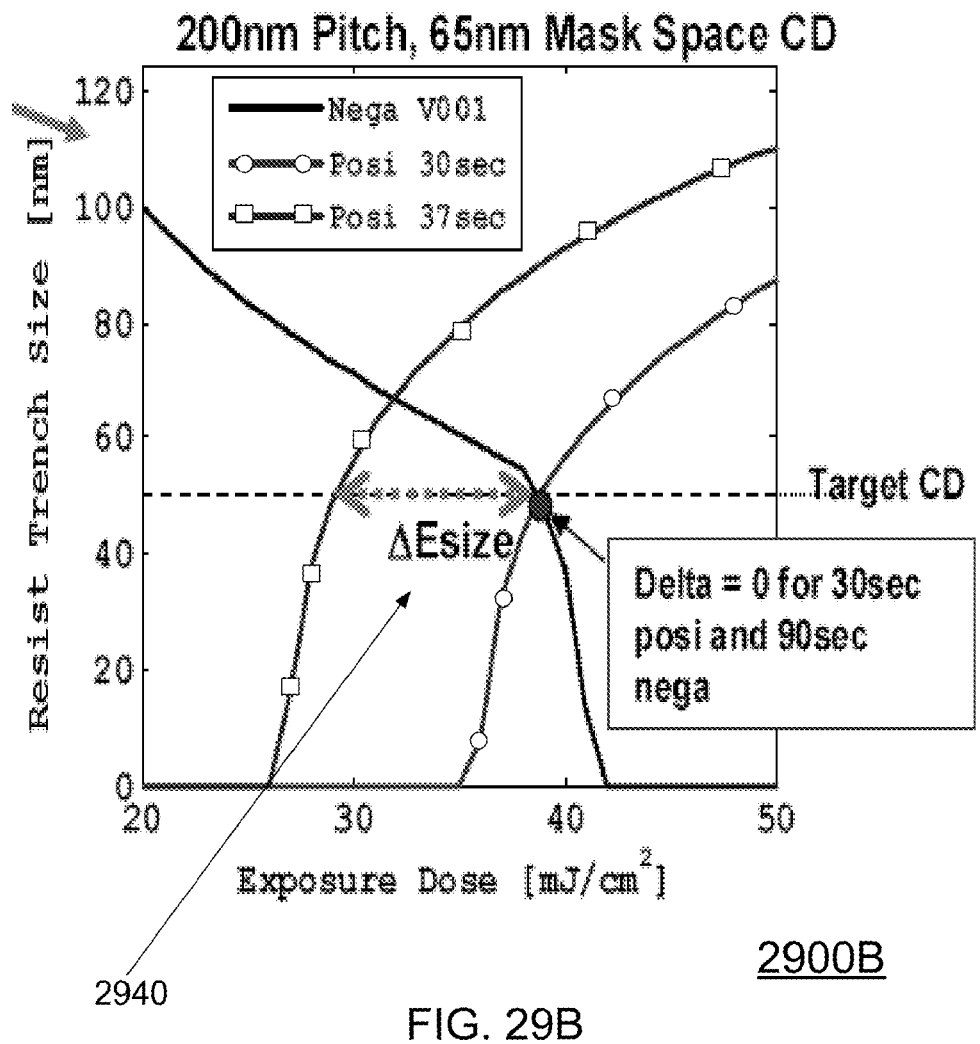

FIG. 29A and FIG. 29B illustrate a simplified view of a process centering technique in accordance with embodiments of the invention. FIG. 29A illustrates a graph 2900A that shows how the mask CD (nm) varies with respect to the positive tone PEB time (sec). FIG. 29B illustrates a graph 2900B that shows how the resist trench size (nm) varies with respect to the exposure dose (mJ/cm$^2$). The metric (2940) used in this centering technique is ($\Delta E_{size}$) is shown in 2900B. The graphs (2900A and 2900B) can be generated using experimental and/or simulated data. The solutions 2910 and the target 2920 are shown in 2900A.

In some other embodiments, the inventors have developed negative tone developer dilution techniques to use for dual-tone development (DTD). The inventors believe that specialized hardware and/or software can be developed to perform the proper developer dilution for the negative tone development process. The inventors believe that the chemicals used (developer and rinse chemicals) can be used in conjunction with other chemicals to create a range of diluted negative tone developers.

The exemplary developer dilution techniques can include:

1) Using two or more chemicals to make a diluted negative tone developer

2) Using esters based chemicals (such as those currently available from Fuji Film)

3) For a given class of negative tone developer, the inventors can create maps and/or tables for the different ranges of dilution possibilities, and then use the maps and/or tables to create the correct dilution.

The inventors believe there will be several solutions for the different dilution problems related to the different resist compositions and their solutions will include the dilution ranges that are necessary to make a better dual-tone process regardless of the resist composition. The reason for dilution of negative tone developer is to provide a better overlapped process with the positive tone process. Negative tone dilution is the most likely knob to use to tweak the negative tone process. There are other knobs that can be controlled for the positive tone development process.

In still other embodiments, the inventors have developed novel dose determination methods for use in dual-tone double patterning. The nature of the dual-tone double patterning process means that a positive tone trench and a negative tone trench have to be printed with the same exposure dose. This means that mask/reticle, resist, and developer considerations must be balanced to get a positive tone and negative tone trench of the same CD (critical dimension) at the same dose. The inventors have determined an algorithm for determining the optimal dose given a set of circumstances. FIGS. 41-43 illustrate exemplary dose determination steps in accordance with embodiments of the invention.

1) Define critical planes for characterization of development threshold. One plane corresponds to the plane of positive tone development and the other to the plane of negative tone development. This plane can be equivalent to the resist feature edge (a zero bias process or can be positive or negative)

2) Cycle through exposure dose from low to high. Low dose is around zero and high dose is defined as a reasonable exposure dose for the tool set in question that would be determined by the user's circumstances.

3) At each plane of interest the gradient of polymer protection as a function of horizontal position is calculated. We have to calculate this at some horizontal plane in the film, which again can be chosen by the user. Multiple planes may be used and averaged. This process is completed again at the negative tone plane of interest.

4) It is commonly understood that the best imaging is possible where the deprotection gradient is steepest. We need the gradient at the positive and negative planes of interest to be steep at the same dose. "Steep" may be defined by the user. For example, if one development process is better than the other, then the user may determine that the deprotection gradient for that half of the process might be less steep than the opposite tone. The simplest manifestation is where equal weight is put on the positive and negative tone process. In this case, the dose to size will be the point where the difference between the positive and negative gradients is closest to zero. Alternatively, the ratio of the gradients may be used. In the case where the positive and negative tone processes are required to have equivalent gradients, the ratio will be one.

5) A similar algorithm may be used where the deprotection gradient is replaced by the gradient of development rate in the film as function of position in the film (the convolution of the deprotection gradient above with the development rate curve as a function of deprotection). The exact same analysis can be completed using development rate gradients instead of the deprotection rate 6) A similar algorithm may be used where the deprotection gradient is replaced by the gradient of the aerial image as a function of position.

Figure 30:
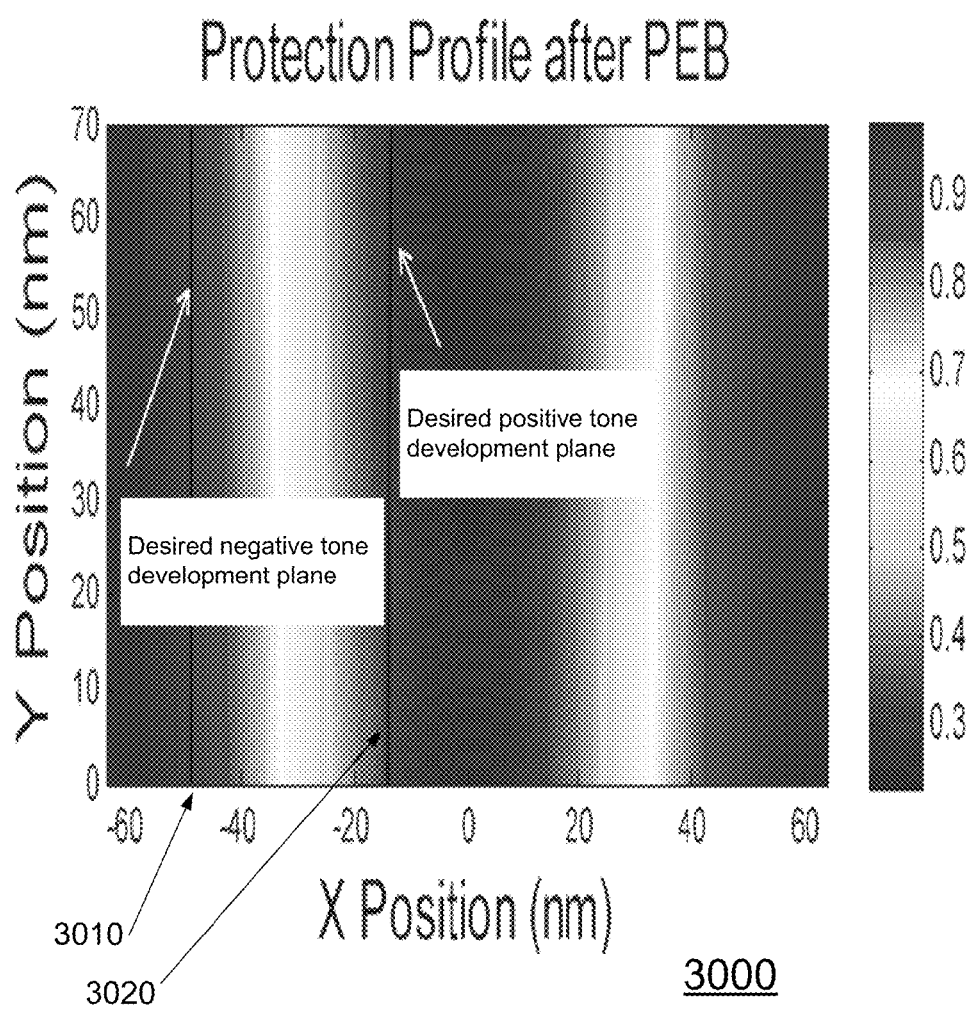
FIGS. 30-33 illustrate additional exemplary data for patterning a substrate.

FIG. 30 shows a protection profile 3000 that was established after PEB process. In step 1, the desired negative tone development plane 3010 and the desired positive tone development plane 3020 can be defined as critical planes. Next, the gradients can be co-optimized at these two critical planes (3010 and 3020). Then, threshold development procedures can be performed to determine if the DT image can be printed. Finally, the analysis can be move from threshold developers to real developers.

Figure 31:
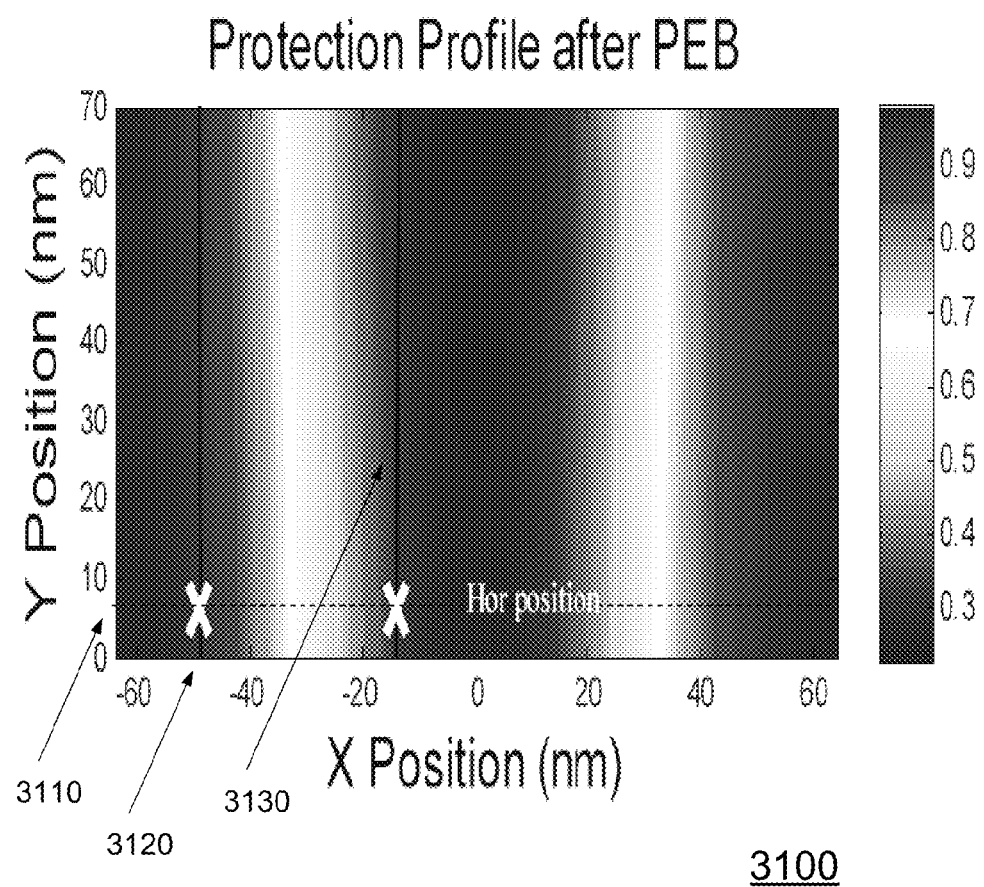

FIG. 31 shows another protection profile 3100 that was established in later process steps. For example, in these later steps, the gradient of deprotection can be calculated as a function of horizontal position in at least one horizontal plane 3110 and at the positive tone plane 3120 and negative tone plane 3130. Then, the calculations can be completed as function of dose.

Figure 32:
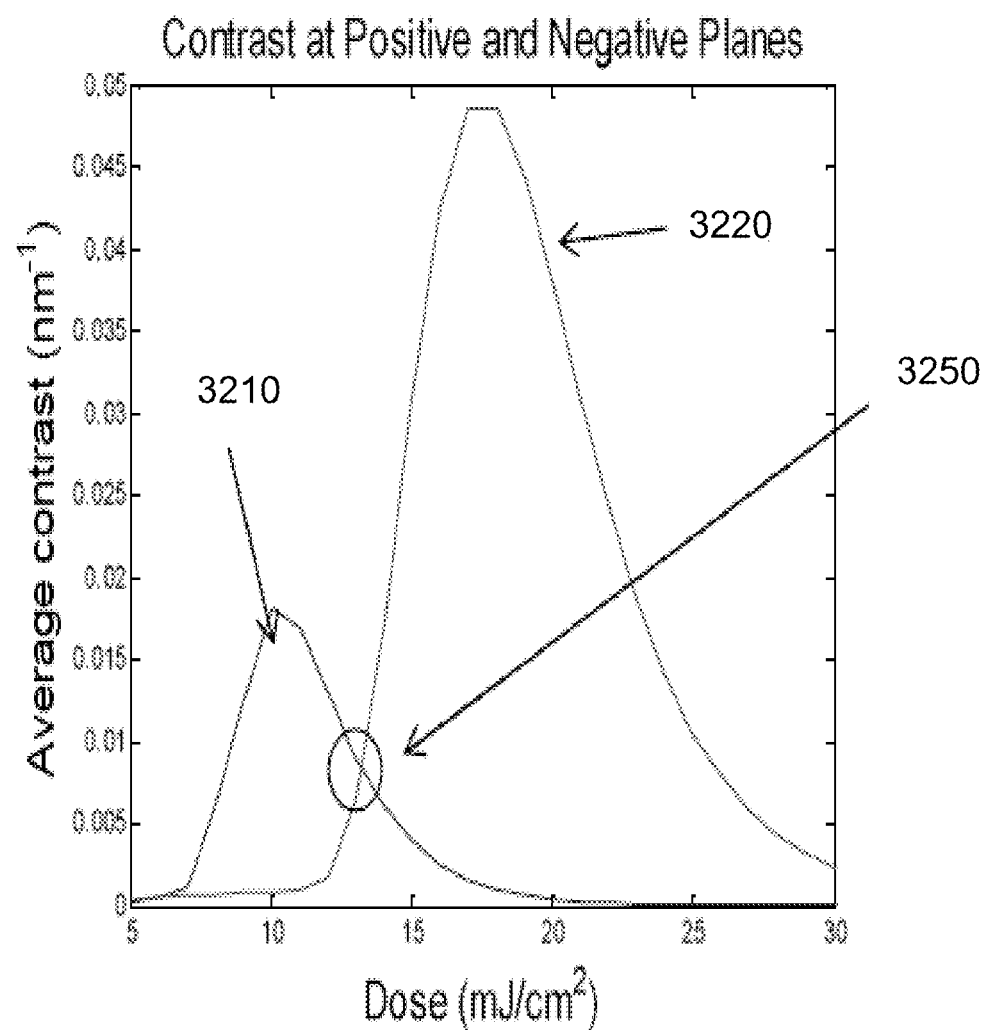

FIG. 32 illustrates a graph 3200 that shows how the average contrast ($nm^{-1}$) varies with respect to the dose ($mJ/cm^2$). For example, the development processes can be prioritized to define the deprotection gradient that is desired for each (the ratio is a useful metric). FIG. 32 is used to illustrate a best dose condition in which equal weight is placed on positive and negative development (ratio of two gradients is 1 or the difference is zero). The graph 3200 includes a positive contrast curve 3210, a negative contrast curve 3220, and a crossover point 3250. For example, the crossover point 3250 represents an equal balance between the positive contrast curve 3210 and the negative contrast curve 3220, and the crossover point 3250 can be used to define a dose value.

Figure 33:
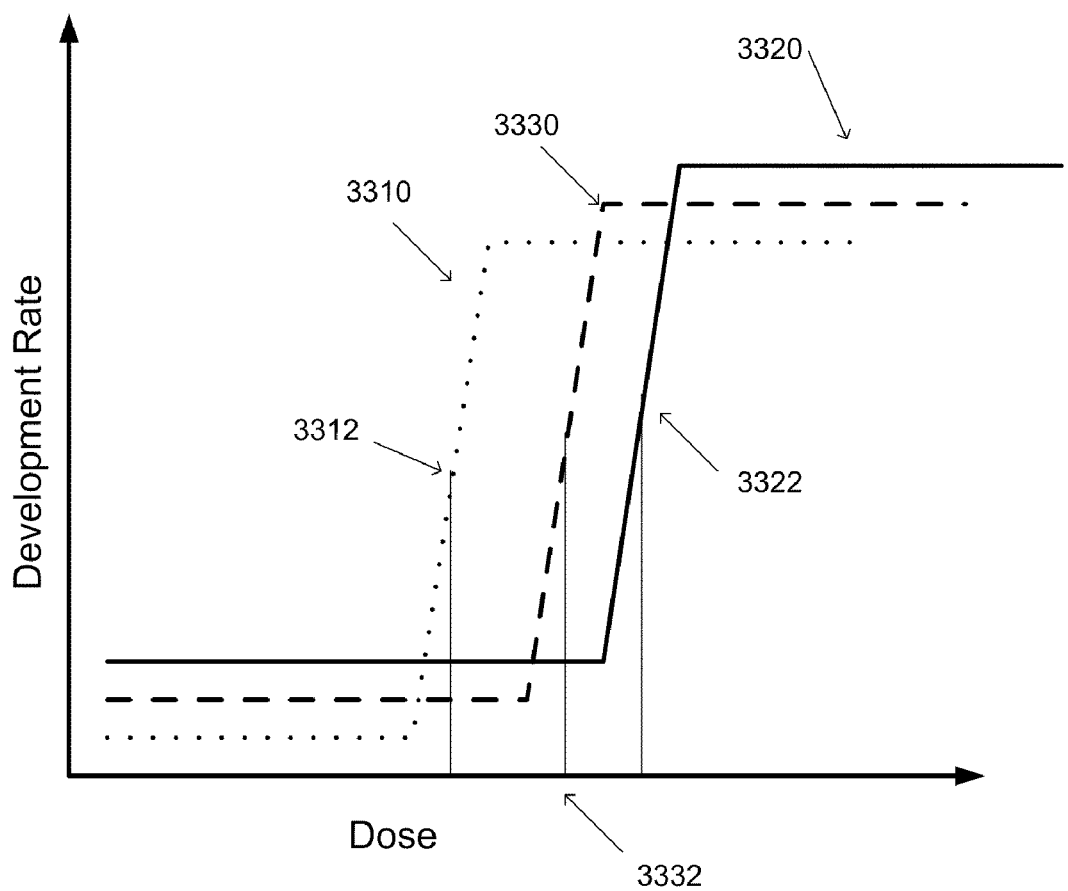

In additional embodiments, the inventors have developed novel procedures for using different acid functionalities for threshold control. FIG. 33 illustrates a simplified view of a threshold control technique in accordance with embodiments of the invention.

As described herein, a DT resist may include a backbone polymer with multiple protecting groups that have different reaction rates that can be used to control deprotection for the positive and negative tone. The inventors believe that this scheme provides for a novel method to manipulate the positive tone and negative tone development thresholds.

When there is at least one acidic species in the film, the development rates for polymers in an aqueous base can be dependent on one or more of the acidic functionalities. In 248 nm resists, it can be a phenolic group. In 193 nm resists, it can be a carboxylic acid or hexafluoroisopropanol group. If more than one acidic functionality is used, the threshold for development can be manipulated.

FIG. 33 illustrates a graph 3300 that shows how the development rate varies with respect to the dose ($mJ/cm^2$). The first curve 3310 shows a first dissolution rate as a function of dose for a first protected polymer, and the second curve 3320 shows a second dissolution rate as a function of dose for a second protected polymer. The curves (3310 and 3320) represent the increase in dissolution rate as a function of dose for two different protected polymers having two different functionalities (when deprotected). Because they have different acidic functionalities, they turn on at different thresholds (3312 and 3322). A third curve 3330 is shown which represents making a copolymer that has both of the acidic functionalities. This copolymer's behavior can have an "average" behavior and so turns on at a third threshold 3332.

In the DTD process, the positive and negative development thresholds can be matched with vertical planes in the resist that correspond to the desired critical dimension. For example, a copolymer can have (x) percentage of one protected acidic functionality A, and (y) percentage of a different acidic functionality B. If the threshold is not lined up with the plane that gives the right CD, the feature will be off target. One way to resolve this issue would be to reformulate the resist to have the copolymer ratio of A and B so that the threshold is shifted to the correct location that will give the correct CD. This same concept can be applied to blended homopolymers of A and B (instead of a copolymer containing the two functionalities on the same chain.)

Figure 34A:
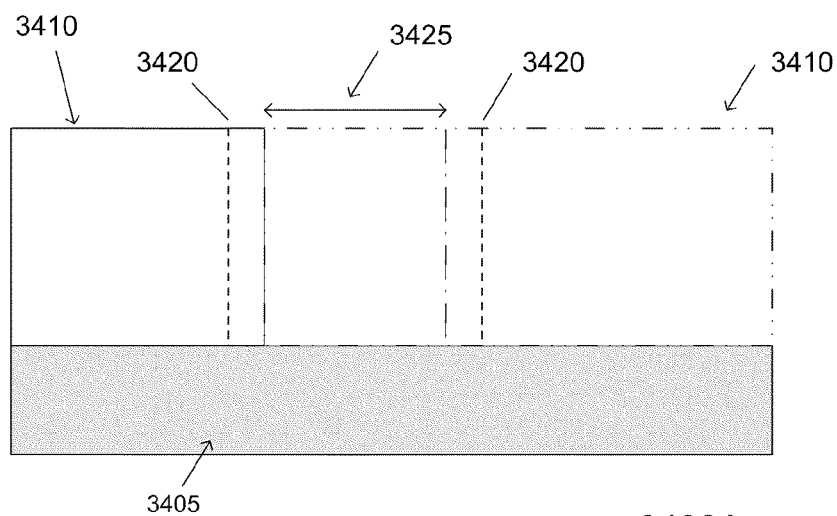
FIG. 34A and FIG. 34B illustrate a simplified view of a re-tuning process in accordance with embodiments of the invention.
Figure 34B:
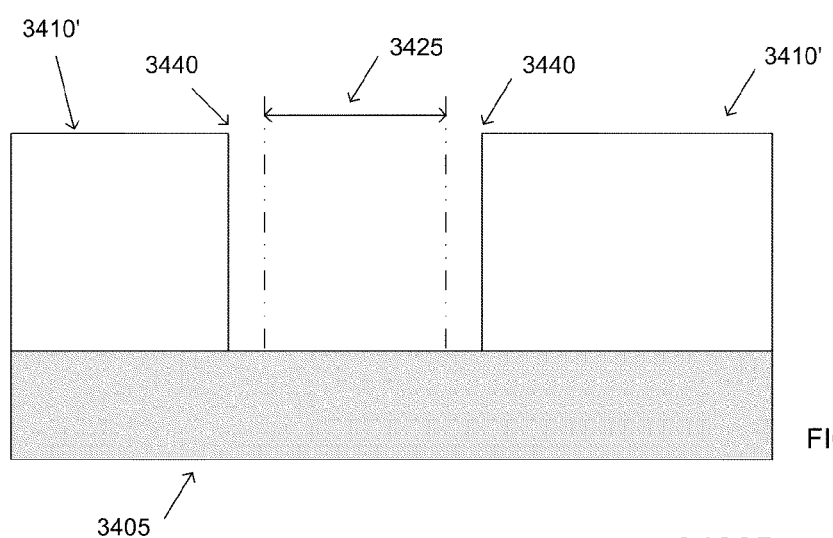

FIG. 34A and FIG. 34B illustrate a simplified view of a re-tuning process in accordance with embodiments of the invention. FIG. 34A shows a patterned substrate 3400A that can include a substrate 3405, at least one resist feature 3410, a dissolution threshold 3420, and a desired CD 3425. FIG. 34B shows a developed substrate 3400B that can include a substrate 3405, at least one modified resist feature 3410', the desired CD 3425, and a space feature 3440 that is larger than the desired CD 3425. In this example, the resist formulation must be re-tuned so that dissolution threshold lines up with vertical planes at the correct CD.

Although only certain embodiments of this invention have been described in detail above, those skilled in the art will readily appreciate that many modifications are possible in the embodiments without materially departing from the novel teachings and advantages of this invention. For example, several embodiments are described herein that use a single exposure of a layer of radiation-sensitive material to a pattern of radiation. However, a plurality of exposures may be utilized. Accordingly, all such modifications are intended to be included within the scope of this invention.

What is claimed is:

1. A method of patterning a substrate using a dual-tone development procedure, comprising:

forming a layer of radiation-sensitive material on the substrate, wherein the layer of radiation-sensitive material comprises a resist material having a polymer backbone and a plurality of protecting groups;

creating a first patterned layer of exposed radiation-sensitive material by exposing the layer of radiation-sensitive material using a first EM radiation and a reticle having a plurality of masking features, and heating the first patterned layer of exposed radiation-sensitive material thereby creating a plurality of high exposure regions having a first number of de-protected groups, a plurality of medium exposure regions having a second number of de-protected groups, and a plurality of low exposure regions having a third number of de-protected groups in the low exposure regions;

determining a first threshold profile for a first positive tone development procedure for the first patterned layer of exposed radiation-sensitive material using at least one of the first number of de-protected groups in the high exposure regions, the second number of de-protected groups in the medium exposure regions, and the third number of de-protected groups in the low exposure regions;

determining a first set of limits for a first dual-tone development procedure;

modifying the first threshold profile if the first threshold profile exceeds one or more of the first set of limits; and developing the first patterned layer of exposed radiation-sensitive material if the first threshold profile does not exceed at least one of the first set of limits.

2. The method of claim 1, wherein the reticle comprises at least one of a phase-shift mask, a tri-tone mask, and a half-tone mask.

3. The method of claim 2, wherein the half-tone mask comprises at least one of a sub-resolution pitch, a sub-resolution size, and a mask edge spacing.

4. The method of claim 1, wherein the resist material comprises at least one of a dual-tone resist, a photo-sensitive acid, a photo-sensitive base, a photo-sensitive protecting group, a photo-sensitive blocking group, a photo-sensitive leaving group, a negative tone polymer, and a positive tone polymer.

5. The method of claim 1, wherein the modifying the first threshold profile further comprises:
determining a first difference between the first threshold profile and a first limit; and
applying first thermal energy to the first patterned layer to de-protect at least one additional protecting group, thereby creating a first modified patterned layer having a first modified number of de-protected groups in the high exposure regions, a second modified number of de-protected groups in the medium exposure regions, and a third modified number of de-protected groups in the low exposure regions, wherein the first thermal energy is determined using at least one of the first difference, the polymer backbone, the first modified number of de-protected groups in the high exposure regions, the second modified number of de-protected groups in the medium exposure regions, and the third modified number of de-protected groups in the low exposure regions.

6. The method of claim 1, wherein the modifying the first threshold profile further comprises:
determining a first difference between the first threshold profile and a first limit; and
applying first optical signal power to the first patterned layer to de-protect at least one additional protecting group, thereby creating a first modified patterned layer having a first modified number of de-protected groups in the high exposure regions, a second modified number of de-protected groups in the medium exposure regions, and a third modified number of de-protected groups in the low exposure regions, wherein the first optical signal power is determined using at least one of the first difference, the polymer backbone, the first modified number of de-protected groups in the high exposure regions, the second modified number of de-protected groups in the medium exposure regions, and the third modified number of de-protected groups in the low exposure regions.

7. The method of claim 6, wherein the first optical signal power is provided by at least one of a single frequency source, multiple frequency source, a coherent source, a non-coherent source, a broadband source, a UV source, a EUV source, an IR source, a flood exposure source, and a visible light source.

8. The method of claim 1, wherein the modifying the first threshold profile further comprises:
determining a first difference between the first threshold profile and a first limit; and
applying a first chemical species to the first patterned layer to de-protect at least one additional protecting group, thereby creating a first modified patterned layer having a first modified number of de-protected groups in the high exposure regions, a second modified number of de-protected groups in the medium exposure regions, and a third modified number of de-protected groups in the low exposure regions, wherein the first chemical species is determined using at least one of the first difference, the polymer backbone, the first modified number of de-protected groups in the high exposure regions, the second modified number of de-protected groups in the medium exposure regions, and the third modified number of de-protected groups in the low exposure regions.

9. The method of claim 8, wherein the first chemical species includes at least one of a developing solution (TMAH), a modified developing solution (TMAH and water), a de-blocking group, a de-protection group, a de-coupling group, and a cleaving group.

10. The method of claim 1, wherein the modifying the first threshold profile further comprises:
determining a first difference between the first threshold profile and a first limit; and
applying second EM radiation to the first patterned layer to de-protect at least one additional protecting group, thereby creating a first modified patterned layer having a first modified number of de-protected groups in the high exposure regions, a second modified number of de-protected groups in the medium exposure regions, and a third modified number of de-protected groups in the low exposure regions, wherein the second EM radiation is determined using at least one of the first difference, the polymer backbone, the first modified number of de-protected groups in the high exposure regions, the second modified number of de-protected groups in the medium exposure regions, and the third modified number of de-protected groups in the low exposure regions.

11. The method of claim 10, wherein the second EM radiation includes at least one of low frequency radiation, HF radiation, VHF radiation, UHF radiation, and microwave radiation.

12. The method of claim 10, wherein a second EM radiation energy is higher than a first EM radiation energy.

13. The method of claim 10, wherein the second EM radiation is applied using at least one of a single frequency source, multiple frequency source, a coherent source, a non-coherent source, a broadband source, a UV source, a EUV source, an IR source, a flood exposure source, and a visible light source.

14. The method of claim 1, wherein the developing the first patterned layer further comprises:
performing a positive development procedure to remove one or more of the high exposure regions from the substrate using a first chemistry; and
performing a negative development procedure to remove one or more of the low exposure regions from the substrate using a second chemistry.

15. The method of claim 1, wherein the developing the first patterned layer further comprises:
performing a positive development procedure to remove one or more of the high exposure regions from the substrate using a first chemistry;
performing at least one additional exposure procedure, thereby creating a new first number of de-protected groups in the high exposure regions, creating a new second number of de-protected groups in the medium exposure regions, and creating a new third number of de-protected groups in the low exposure regions;
determining a second threshold profile for a first negative tone development procedure for the first patterned layer of exposed radiation-sensitive material using at least one of the new first number of de-protected groups in the high exposure regions, the new second number of de-protected groups in the medium exposure regions, and the new third number of de-protected groups in the low exposure regions;

determining a second set of limits for the first negative tone development procedure;

modifying the second threshold profile if the second threshold profile exceeds at least one of the second set of limits; and performing a negative development procedure to remove one or more of the low exposure regions from the substrate using a second chemistry, if the second threshold profile does not exceed at least one of the second set of limits.

16. A computer readable medium containing program instructions for execution on a computer system coupled to a semiconductor processing system, which when executed by the computer system, cause the semiconductor processing system to perform a process, comprising:

forming a layer of radiation-sensitive material on a substrate, wherein the layer of radiation-sensitive material comprises a resist material having a polymer backbone and a plurality of protecting groups;

creating a first patterned layer of exposed radiation-sensitive material by exposing the layer of radiation-sensitive material using a first EM radiation and a reticle having a plurality of masking features, and heating the first patterned layer of exposed radiation-sensitive material thereby creating a plurality of high exposure regions having a first number of de-protected groups, a plurality of medium exposure regions having a second number of de-protected groups, and a plurality of low exposure regions having a third number of de-protected groups in the low exposure regions;

determining a first threshold profile for a first positive tone development procedure for the first patterned layer of exposed radiation-sensitive material using at least one of the first number of de-protected groups in the high exposure regions, the second number of de-protected groups in the medium exposure regions, and the third number of de-protected groups in the low exposure regions;

determining a first set of limits for a first dual-tone development procedure;

modifying the first threshold profile if the first threshold profile exceeds a first limit of the first set of limits; and developing the first patterned layer of exposed radiation-sensitive material if the first threshold profile does not exceed the first limit of the first set of limits.

17. A method of patterning a substrate, comprising:

forming a layer of radiation-sensitive material on the substrate, wherein the layer of radiation-sensitive material comprises a resist material having a polymer backbone and a plurality of protecting groups;

creating a first patterned layer of exposed radiation-sensitive material by exposing the layer of radiation-sensitive material using a first EM radiation and a reticle having a plurality of masking features, and heating the first patterned layer of exposed radiation-sensitive material thereby creating a plurality of high exposure regions having a first number of de-protected groups, a plurality of medium exposure regions having a second number of de-protected groups, and a plurality of low exposure regions having a third number of de-protected groups in the low exposure regions;

creating a second patterned layer by developing the first patterned layer of exposed radiation-sensitive material using a first positive tone developing procedure;

determining a negative threshold profile and a negative threshold limit for a negative tone development procedure for the second patterned layer;

establishing a second energy level using the negative threshold profile and the negative threshold limit;

creating a third patterned layer by exposing the second patterned layer to a second EM radiation at the second energy level; and creating a fourth patterned layer by developing the third patterned layer of using a first negative tone developing procedure.

18. A method of patterning a substrate, comprising:

forming a layer of radiation-sensitive material on the substrate, wherein the layer of radiation-sensitive material comprises a resist material having a polymer backbone and a plurality of protecting groups;

creating a first patterned layer of exposed radiation-sensitive material by exposing the layer of radiation-sensitive material using a first EM radiation and a reticle having a plurality of masking features, and heating the first patterned layer of exposed radiation-sensitive material thereby creating a plurality of high concentration regions having a first number of de-protected groups, a plurality of medium concentration regions having a second number of de-protected groups, and a plurality of low concentration regions having a third number of de-protected groups in the low exposure regions;

determining a first threshold profile for a first positive tone development procedure for the first patterned layer of exposed radiation-sensitive material using at least one of the first number of de-protected groups in the high concentration regions, the second number of de-protected groups in the medium concentration regions, and the third number of de-protected groups in the low concentration regions;

determining a first set of limits for a first dual-tone development procedure;

modifying the first threshold profile if the first threshold profile exceeds a first limit of the first set of limits; and developing the first patterned layer of exposed radiation-sensitive material if the first threshold profile does not exceed the first limit of the first set of limits.

19. The method of claim 18, wherein the developing the first patterned layer further comprises:

performing a positive development procedure to remove one or more of the high concentration regions from the substrate using a first chemistry;

performing at least one additional exposure procedure, thereby creating a new first number of de-protected groups in the high concentration regions, creating a new second number of de-protected groups in the medium concentration regions, and creating a new third number of de-protected groups in the low concentration regions;

determining a second threshold profile for a first negative tone development procedure for the first patterned layer using at least one of the new first number of de-protected groups in the high concentration regions, the new second number of de-protected groups in the medium concentration regions, and the new third number of de-protected groups in the low concentration regions;

determining a second set of limits for the first negative tone development procedure;

modifying the second threshold profile if the second threshold profile exceeds at least one of the second set of limits; and performing a negative development procedure to remove one or more of the low concentration regions from the substrate using a second chemistry, if the second threshold profile does not exceed at least one of the second set of limits.

* * * * *